United States Patent
Wasynczuk et al.

(10) Patent No.: US 7,353,157 B2
(45) Date of Patent: Apr. 1, 2008

(54) CIRCUIT SIMULATION

(75) Inventors: Oleg Wasynczuk, West Lafayette, IN (US); Juri V. Jatskevich, Lafayette, IN (US)

(73) Assignee: P. C. Krause & Associates, Inc., West Lafayette, IN (US)

( * ) Notice: Subject to any disclaimer, the term of this patent is extended or adjusted under 35 U.S.C. 154(b) by 469 days.

(21) Appl. No.: 10/043,981

(22) Filed: Jan. 11, 2002

(65) Prior Publication Data

US 2002/0183990 A1    Dec. 5, 2002

Related U.S. Application Data

(60) Provisional application No. 60/261,033, filed on Jan. 11, 2001.

(51) Int. Cl.
| G06F 17/50 | (2006.01) |
| G06G 7/62 | (2006.01) |
| G00F 17/50 | (2006.01) |

(52) U.S. Cl. .......................... 703/14; 703/13
(58) Field of Classification Search .......... 703/14, 703/13; 716/18
See application file for complete search history.

(56) References Cited

U.S. PATENT DOCUMENTS

| 4,827,427 | A | 5/1989 | Hyduke ................... 364/489 |
| 5,193,068 | A | 3/1993 | Britman .................. 364/578 |
| 5,461,574 | A | 10/1995 | Matsunaga et al. ......... 364/489 |
| 5,467,291 | A | 11/1995 | Fan et al. ................. 364/578 |
| 5,469,366 | A | 11/1995 | Yang et al. |
| 5,550,760 | A | 8/1996 | Razdan et al. ............. 364/578 |
| 5,694,579 | A | 12/1997 | Razdan et al. ............. 395/500 |
| 5,732,192 | A | 3/1998 | Malin et al. .............. 395/10 |
| 5,838,947 | A | 11/1998 | Sarin ...................... 395/500 |
| 5,920,484 | A | 7/1999 | Nguyen et al. ............ 364/489 |
| 5,949,992 | A | 9/1999 | Kundert |
| 6,158,022 | A | 12/2000 | Avidan .................... 714/33 |
| 6,167,363 | A | 12/2000 | Stapleton ................. 703/14 |
| 6,181,754 | B1 | 1/2001 | Chen ...................... 375/350 |
| 6,295,635 | B1 | 9/2001 | Dhaene et al. ............ 716/14 |

OTHER PUBLICATIONS

DesignSoftware, "Electronic Components in TINA", http://web.archive.org/web/19991104034907/www.designsoftware.com/COMPON.HTM, 1997.*

(Continued)

Primary Examiner—Kamini Shah
Assistant Examiner—David Silver
(74) Attorney, Agent, or Firm—Woodard, Emhardt, Moriarty, McNett & Henry LLP

(57) ABSTRACT

A system, method, and apparatus select state variables for, build state equations of, and simulate time-domain operation of an electronic circuit. The circuit is modeled with three branch types (inductor, resistor, voltage source in series; capacitor, resistor, current source in parallel; and switch), including four pre-defined switch types (unidirectional unlatched, bidirectional unlatched, unidirectional latched, and bidirectional latched). Automated analyses determine efficient state variables based on the currently active circuit topology, and state equations are built and applied. Switching logic determines when switch states change, and state equations for the new topology are either drawn from a cache (if the topology has already been processed) or derived anew. The switch control signals may be combined into a single switching variable, defined as a function of the state output.

4 Claims, 8 Drawing Sheets

OTHER PUBLICATIONS

DesignSoftware, "Circuit Simulation", http://web.archive.org/web/19991104062930/www.designsoftware.com/DIAGRAM.HTM, 1999.*

Wasynczuk O et al, "Automated State Model Generation Algorithm for Power Circuits and Systems", Nov. 1996, vol. 11 No. 4 p. 1951-1956.*

White, Ron, "How Computers Work", Oct. 3, Preston Gralla, 7th Edition, pp. 40, 62-63, 189.*

MathWorks, "Simulink2; Simulation Engine", Jussieu, http://web.archive.org/web/20010309234347/http://web.ccr.jussieu.fr/ccr/Documentation/Calcul/matlab5v11/docs/00000/0007e.htm, 1997.*

DesignSoftware, "Symbolic Circuit Analysis", http://web.archive.org/web/19970418061337/www.designsoftware.com/SYMBOLIC.HTM, 1997.*

DesignSoftware, "TINA: Toolkit for Interactive Network Analysis", http://web.archive.org/web/19970418060204/www.designsoftware.com/TINA.HTM.*

Jatskevich, Juri V., "A state selection algorithm for the automated state model generator", Purdue University, 1999, 221 pages, Advisor: Wasynczuk, Oleg, Pub No. AAT 3018454, http://wwwlib.umi.com/dissertations/preview_all/3018454, (pp. 1-25) "24 Page Preview".*

* cited by examiner

CIRCUIT SIMULATION

REFERENCES TO RELATED APPLICATION

Priority is claimed to U.S. Provisional Patent Application 60/261,033, filed Jan. 11, 2001.

This invention was made with Government support under Contract F33615-99-C-2911 awarded by the U.S. Department of Defense. The United States Government has certain rights in the invention.

BACKGROUND

The present invention relates to the design, modeling, simulation, and emulation of electronic circuitry. More specifically, the present invention relates to numerical time-domain simulation of analog or digital electrical circuits using mathematical expressions. Present simulation systems suffer from limitations in the kinds and topologies of circuits to which they may be applied. The complexity of systems to be simulated is also limited in current systems by various inefficiencies in the simulation modeling process, including state selection and state equation building methods. There is thus a need for further contributions and improvements to circuit simulation technology.

Existing techniques for circuit simulation include two approaches. In one, the underlying numerical algorithms are based upon a state-space model of the system being simulated or analyzed. The system to be simulated is specified either in the form of a text file using a well-defined syntax, or graphically using boxes or icons to represent computational elements such as summers, multipliers, integrators, function generators, and/or transfer functions, for example. General purpose mathematical packages operate the models by assembling a state-space model of the system from the user-supplied description. The time-domain response is then calculated numerically using established integration algorithms.

In the other category of solutions, the system is described as an electrical circuit, the fundamental branches of which may include resistors, inductors, capacitors, voltage sources, and/or current sources, for example. Other circuit elements such as diodes, transistors, or electromechanical devices may also be defined as a variation or a combination (sub-circuit) of the fundamental branches. In this type of simulation system, the model developer describes the circuit in the form of a list of parameters of the fundamental or user-defined circuit elements and the layout of the circuit. Nodal or modified-nodal analysis techniques are then employed to simulate operation of the circuit. In that process, the differential equations associated with each inductive and capacitive branch are modeled in discrete form using difference equations to relate the branch current and voltage at a given instant of time to the branch current and/or voltage at one or more preceding instants of time. The difference equations for the overall circuit are then assembled automatically and solved using established methods to simulate the time-domain response.

It is of note that the second category of systems does not force the model developer to derive the state equations or block-diagram representation of the circuit. On the other hand, a state-space model of the overall circuit is never established or calculated by the program. Consequently, the numerous (and generally more efficient) techniques for analysis of state-space models cannot be applied in such systems.

More recently, a system has been developed that produces a state-space realization for the linear part of a system, the non-linear portion and variable parameters being represented as separate or external blocks. The overall system is then simulated using the appropriate solvers in the host mathematical package. In these systems, however, switches are modeled as resistors with very small or very large values. The resulting state model, therefore, may be artificially stiff and have larger dimension than necessary because of the states artificially introduced by the resistor-based switch model. In addition, the system does not incorporate mutual, non-linear, or variable inductances, capacitances, and resistances in its standard library blocks and components.

Some work on an automated state model generator, and circuit simulator (ASMG) is reported in O. Wasynczuk and S. D. Sudoff, "Automated State Model Generation Algorithm for Power Circuits and Systems," *IEEE Transactions on Power Systems*, Vol. 11, No. 9, November 1996, pp. 1951-1956. In this work, circuits are specified and analyzed using fundamental branches as shown in FIG. 1. Each fundamental branch includes a switch, resistor $r_{br}$, inductor $L_{br}$, voltage source $e_{br}$, conductance $g_{br}$, capacitor $P_{br}$, and current source $j_{br}$. Each parameter can be fixed or time-varying, and ideal components can be modeled by setting the remaining parameters to zero. Given the parameters for each branch and the list of nodes that the branches connect, the ASMG generates a state-space model of the overall circuit. The state-space representation is calculated and solved using numerical methods. If a change in switching state occurs, the state model generator then recalculates the state-space model and establishes the appropriate initial conditions for the new topology. A disadvantage of this system is that it cannot be used to simulate circuits that include loops composed of voltage sources, capacitors, and/or resistors. This limitation dramatically hindered the ability of the ASMG to simulate high-frequency switching transients of power-electronic-based systems.

Subsequent improvements to the ASMG is the fundamental branches illustrated in FIG. 2 using the same notation for parameters as was used in FIG. 1. Using this form of modeling, more complicated circuit elements could be represented, including transistors, diodes, and thyristors. These improvements are discussed in J. Jatskevich, "A State Selection Algorithm for the Automated State Model Generator," Ph.D. Thesis, Purdue University, 1999. Additional improvements are described herein.

As used herein, a "spanning tree" over a graph (comprising a set of branches and a set of nodes to which the branches are connected) is defined to be a subset of the set of branches such that at least one branch in the subset is connected to each node from the set of nodes, yet no loop can be formed from the branches in the subset.

Also, as used herein, a "topology change event" occurs when the control signal for one or more switching elements causes the switching state of that element to change. The nodes to which that element is connected will then become (or cease to be) galvanically connected to another portion of the circuit. In most cases, this change affects the state equations for the overall circuit.

SUMMARY

It is an object of the present invention to provide an improved system, method, and apparatus for simulating electrical and electronic circuits. Another object is to provide a system, method, and apparatus to more efficiently simulate the operation of a wider variety of electrical and electronic circuits than has previously been possible.

These objects and others are achieved by various forms of the present invention. One form of the present invention is a method, including creating one or more data structures sufficient to model an electronic circuit as a collection of n (at least two) elements. These comprise zero or more LRV elements, zero or more CRI elements, and zero or more switching elements. The LRV elements each have at least one of (a) a non-zero inductance parameter $L_{br}$, (b) a non-zero resistance parameter $r_{br}$, and (c) a non-zero voltage source parameter $e_{br}$, but neither a non-zero capacitance parameter, nor a non-zero current source parameter, nor a switch parameter. The CRI elements each have at least one of (a) a non-zero capacitance parameter $C_{br}$, (b) a non-zero resistance parameter $r_{br}$, or (c) a non-zero current source parameter $j_{br}$, but neither a non-zero inductance parameter, nor a non-zero voltage source parameter, nor a switch parameter. The switching elements each have a switch state and neither a non-zero inductance parameter, a non-zero capacitance parameter, a non-zero resistance parameter, a non-zero voltage source parameter, nor a non-zero current source parameter. A first set of state equations is automatically generated from the one or more data structures, and operation of the electronic circuit is simulated by application of said first set of state equations. In this method, the collection comprises either (1) an LRV element for which at least two of $L_{br}$, $r_{br}$, or $e_{br}$ are non-zero, or (2) a CRI element for which at least two of $C_{br}$, $r_{br}$, or $j_{br}$ are non-zero.

In variations of this form of the invention, the simulating step includes producing state output data. In some embodiments, some or all of the parameters in the first set of state equations change over (simulation) time as a function of the state output data. In some embodiments, some or all of the parameters change over (simulation) time due to a time-varying parameter of at least one element in the collection.

In other variations of this form of the invention, a second set of state equations is generated from the one or more data structures upon the occurrence of a first topology change event. In some such embodiments, the generating step simply involves modifying only the subset of said first set of state equations that depends on the one or more switching elements that have changed. In other such embodiments, each unique vector of switch states represents a topology of the overall circuit, and the method also includes (1) storing the first set of state equations in a cache; (2) after a second topology change event, determining whether a set of state equations in the cache represents the new topology; and (3a) if the determining step is answered in the affirmative, using the set of state equations that represents the new topology to simulate operation of the circuit after the second topology change event; or (3b) if the determining step is answered in the negative, building a third set of state equations that represents -the new topology, and using the third set of state equations to simulate operation of the circuit after the second topology change event.

In other such embodiments, the method also includes (1) storing said second set of state equations in a cache (2) after a third topology change event, deciding whether a set of state equations in the cache represents the new topology; and (3a) if the deciding step is concluded in the affirmative, using the set of state equations from the cache that represents the new topology to simulate operation of the circuit after the third topology change event; or (3b) if the deciding step is concluded in the negative, building a new set of state equations that represents the new topology, and using the new set of state equations to simulate operation of the circuit after the third topology change event.

Another form of the present invention is a method including creating one or more data structures that together store characteristics of some active branches $B^{active}$ that make up a graph of nodes and branches that form a circuit, wherein $B^{active}$ consists of (i) a (possibly empty) set $B^L$ of inductive branches, each having a non-zero inductive component but neither a capacitive component nor a variable switch state; (ii) a (possibly empty) set $B^C$ of zero or more capacitive branches, each having a non-zero capacitive component but neither an inductive component nor a variable switch state; and (iii) a (possibly empty) set $B^A$ of additional branches, each having neither an inductive component nor a capacitive component. $B^{active}$ is partitioned into a first branch set $B_{tree}^{active}$ and a second branch set $B_{link}^{active}$, where the branches in $B_{tree}^{active}$ form a spanning tree over $B^{active}$, giving priority in said partitioning to branches not in $B^L$ over branches in $B^L$. $B_{link}^{active}$ is sub-partitioned into a third branch set $B_{link}^L$ and a fourth branch set $B_{link}^{CA}$, where $B_{link}^L = B_{link}^{active} \cap B^L$. A fifth branch set $B^{CA}$ is identified as the union of (i) $B_{link}^{CA}$, (ii) $B^C \cap B_{tree}^{active}$, and (iii) those branches in $B_{tree}^{active}$ that form a closed graph when combined with $B_{link}^{CA}$. $B^{CA}$ is partitioned into a sixth branch set $\tilde{B}_{tree}^{CA}$ and a seventh branch set $\tilde{B}_{link}^{CA}$, where the branches in $\tilde{B}_{tree}^{CA}$ form a spanning tree over $B^{CA}$, giving priority in said partitioning to branches in $B^C$ over branches not in $B^C$. An eighth branch set $B_{tree}^C = \tilde{B}_{tree}^{CA} \cap B^C$ is identified. A set of state variables is selected, comprising (a) for each branch of $B_{link}^L$, either the inductor current or inductor flux, and (b) for each branch of $B_{tree}^C$, either the capacitor voltage or capacitor charge. A plurality of states of the circuit are simulated using the set of state variables.

In a variation on this form of the invention, the partitioning steps each comprise an application of a weighted spanning tree algorithm, such as, for some positive numbers $w_L$ and $w_C$, (a) for the partitioning of $B^{active}$, a minimum spanning tree algorithm is used with weight function $$\omega_L(b_j) = \begin{cases} w_L & \text{if branch } b_j \in B^L \\ 0 & \text{otherwise} \end{cases};$$

and (b) for the partitioning of $B^{CA}$, a maximum spanning tree algorithm is used with weight function $$\omega_C(b_j) = \begin{cases} w_C & \text{if branch } b_j \in B^C \\ 0 & \text{otherwise} \end{cases}.$$

Another form of the invention is a system, including a processor and a computer-readable medium in communication with the processor, where the medium contains programming instructions executable by the processor to: (1) build state equations for a first topology of an electronic circuit that has at least two switching elements, where each switching element has a switching state; (2) solve the state equations at some time $t_i$ to provide a state output vector, in which at least two elements control the switching states of the switching elements; (3) calculate the value of a switching variable as a function of the state output vector, wherein the value reflects whether the switching state of at least one of the switching elements is changing; and (4) if the value of the switching variable at time $t_i$ indicates that at least one of the switching elements is changing, determine a second topology of the electronic circuit for time $t_i^+$ and obtain state equations for the second topology.

In a variation of this form of the invention, the programming instructions include a state equation building module, a solver module for ordinary differential equations, and a switching logic module. The building is performed by the state equation building module, the solving and calculating are performed by the solver module; and the determining is performed by the switching logic module. In some embodiments, the obtaining is performed by said switching logic module, while in others the obtaining is performed by said state equation building module.

In still other embodiments, at some time $t_j$, at least two switching elements are each either rising-sensitive or falling-sensitive switches. Rising-sensitive switches change switching state if and only if a controlling element of the state vector has passed from a negative value to a non-negative value. Conversely, falling-sensitive switches change switching state if and only if a controlling element of the state vector has passed from a positive value to a non-positive value. In these embodiments, the function is the arithmetic maximum of (1) a maximum of all elements of the state vector that control rising-sensitive switches, and (2) the negative of the minimum of all controlling elements of the state vector that control falling-sensitive switches.

A still further form of the invention is a system for simulating electronic circuits having a processor and a computer-readable medium in communication with said processor, where the medium contains programming instructions executable by the processor to read element parameters and node connection information from a data stream. The stream includes at least one switch type specification selected from the group consisting of: a unidirectional, unlatched switch; a bidirectional, unlatched switch; a unidirectional, latched switch; and a bidirectional, latched switch. The instructions are further executable by the processor automatically to calculate state equations for the circuit given the states of switches specified by the at least one switch type specification.

DESCRIPTION OF THE ILLUSTRATED EMBODIMENTS

Figure 1:
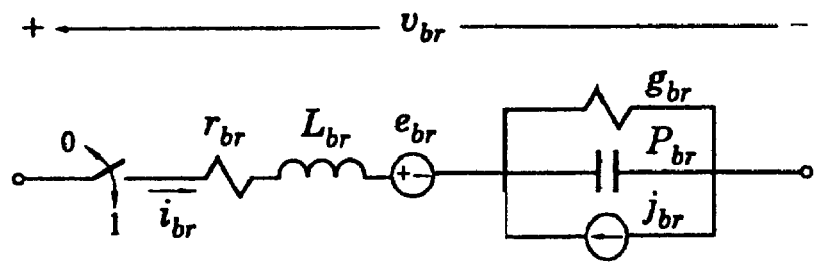
FIG. 1 is a diagram of a generic branch for modeling a circuit using a prior art system.
Figure 2:
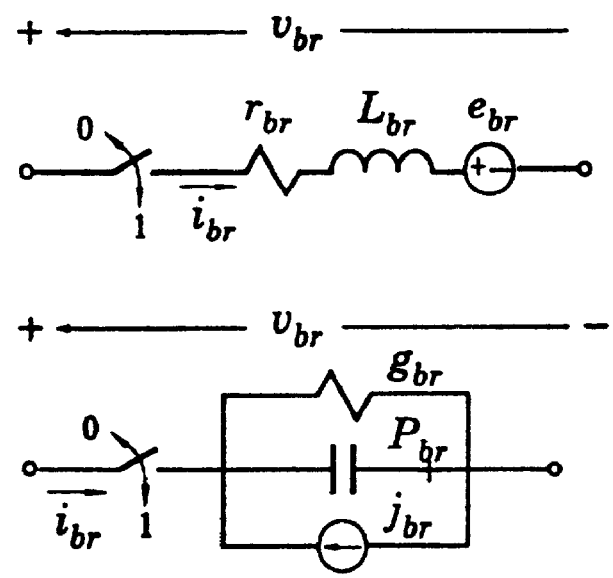
FIG. 2 is a diagram of two branches used to model circuits in another prior art system.

For the purpose of promoting an understanding of the principles of the present invention, reference will now be made to the embodiment illustrated in the drawings and specific language will be used to describe the same. It will, nevertheless, be understood that no limitation of the scope of the invention is thereby intended; any alterations and further modifications of the described or illustrated embodiments, and any further applications of the principles of the invention as illustrated therein are contemplated as would normally occur to one skilled in the art to which the invention relates.

Generally, the system illustrated in FIGS. 3-10 and described herein simulates operation of a circuit in the time domain by collecting component parameters (variable and/or constant) and the overall circuit topology, then establishing a minimal state space for each active topology (as they are encountered), building state equations for that state space, and solving those equations for relevant steps in time. As discussed herein, the above process can be very much streamlined using the additional knowledge and techniques provided in the present invention.

Figure 3:
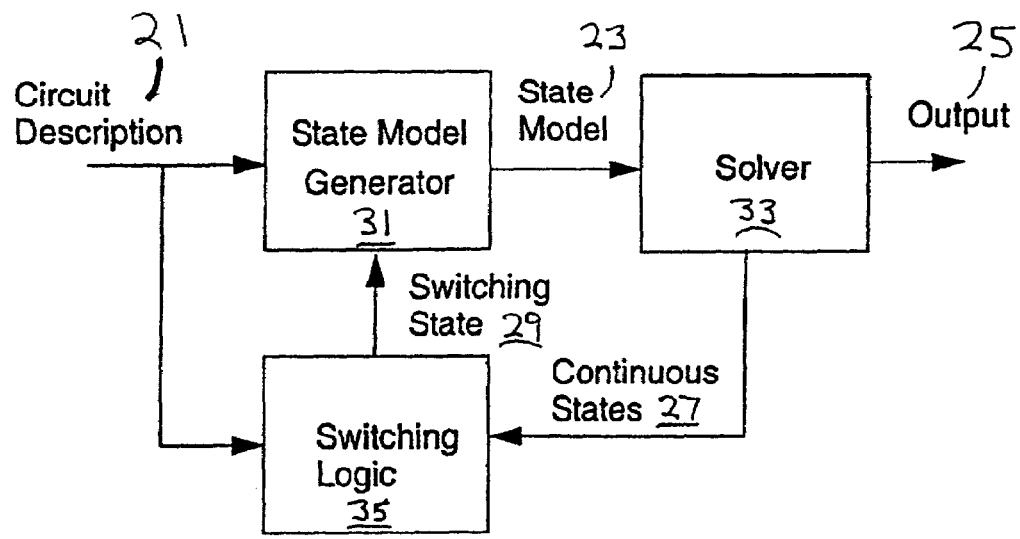
FIG. 3 is a block diagram of the overall process for simulating a circuit according to the present invention.

The overall simulation process will now be discussed with reference to FIG. 3. A description 21 of the circuit, including an identification of constant and variable parameters, initial conditions, and the like are fed into state model generator 31, which provides state model 23 to solver 33. Solver 33 generates the simulation out put 25 for data consumers (such as log files, graphical visualization tools, and the like) as are known in the art. Solver 33 also provides continuous state information 27 to switching logic 35, which determines the state of one or more switches in the circuit should be changed. The result of this analysis, switching state 29, is provided to state model generator 31. If topological changes to the circuit are indicated in switching state 29, state model generator 31 updates the state model and passes that updated model to solver 33 for continued simulation.

Finite Electrical Networks

For the purposes of automated modeling, it is assumed that electrical networks can be composed of inductive, capacitive, and switch branch models depicted in FIGS. 4(a), (b), and (c), respectively. Using this approach, a wide variety of electrical circuits with different topologies can be modeled by appropriately setting the branch parameters. Such a modeling approach also assumes that only a finite number of branches is allowed for representation of any particular circuit, and that all branches have lumped parameters. Electrical networks satisfying this assumption can be modeled using a finite-dimensional state variable approach. Thereafter, it is possible to derive a finite-dimensional system of ordinary differential equations (ODEs) and algebraic equations (AEs) that would portray the dynamic behavior of currents and voltages for any such circuit. It is also important to note that only "practical" or "reasonable" circuits are considered, which means finite energy, finite current, and finite voltage electrical networks. For such networks, all energy storage elements such as capacitors and inductors are allowed to store only a finite amount of energy at any instant of time and that energy cannot change forms instantaneously. Also, no branches are allowed to carry infinite current through their components or have infinite voltage between nodes throughout the existence of the network including the instant of time that the network is switching between topological stages. These restrictions ensure a proper commutation (or proper transition) of the network from one topology to another. Therefore, a class of electrical networks that permits only proper commutation and possess a finite dimensional system of differential algebraic equations (DAEs) can be defined as a class of finite networks. Such a class of finite electrical networks is denoted as $N_q^{\alpha+\beta}$ where $\alpha$ and $\beta$ are the number of state variables in the systems of ODEs for the inductive and capacitive networks, respectively, and q is the number of branches used to represent the layout of the network. Also, $\alpha$ and $\beta$ are often called the network complexity. Thus, hereafter only proper and finite electrical networks from the class $N_a^{\alpha+\beta}$ are considered.

Representation of Electrical Networks

This section will define certain terms with respect to electrical networks from the class $N_a^{\alpha+\beta}$. In particular, a network N can be defined by its topological configuration, which is best described by the associated graph denoted as G, and a set containing branch parameters denoted as P. Also, a particular switch branch may be identified as active or inactive depending on its state. Therefore, in order to specify N completely, a topological vector s, which would contain information regarding whether each branch is active or inactive, should be added. A topological state vector s would have ones in places corresponding to all currently active branches, and zeros for the remaining branches which were identified as inactive for the current topology. Thus a network of a general kind is an object from the class $N_a^{\alpha+\beta}$ and is defined as a triple $$N=(G, P, s) \quad (2.1)$$

It is sometimes convenient not having to deal with inactive branches and assume that all of the network branches are currently active. Such an assumption would significantly simplify notation without a significant loss of generality. Often, a network with all of its branches assumed to be active may be referred to augmented or having augmented topology. In these cases, the vector s would not carry any additional information and, therefore, can be omitted from (2.1).

For the associated graph G to be a circuit, it is required that any single branch of the overall network N must be included in some loop with other branches so as to ensure the existence of a closed path for the current flow. Graphs with such a circuit property are referred to as being closed. For consistency, a reference direction (from − to +) is assigned to each branch with respect to the two nodes at its endpoints. Also, a network N, in the most general case, may be composed of several galvanically independent circuits. Therefore, a directed multi-graph denoted by $G_d^g$ can be associated with network N. Such a multi-graph may consist of g closed subgraphs. That is $$G_d^g = \{G_d^1, G_d^2, \ldots G_d^k, \ldots G_d^g\} \quad (2.2)$$

where each k-th closed subgraph $G_d^k$ corresponds to its circuit. The subscript d indicates that the graph is directed. Even thought all such subgraphs are electrically disjoined they may be coupled through mutual inductances and/or capacitances between branches. On the other hand, if g=1, the associated network becomes a single circuit. Sometimes, for the purposes of analysis, it is also necessary to consider the associated undirected graph or subgraph, which can be denoted at $G^g$ and $G^k$, and obtained by omitting the information regarding the reference direction of each branch. In a closed undirected graph, any branch must be a member of some cycle with more than one branch set The directed multi-graph $G_d^g$ consists of a total of q branches from the branch set $$B=\{b_1, b_2, \ldots b_j, \ldots, b_q\} \quad (2.3)$$

which, in turn, are connected in some arrangement via p nodes from the node set $$N=\{n_1, n_2, \ldots, n_i, \ldots n_p\} \quad (2.4)$$

Branches and nodes appear in (2.3) and (2.4) in a definite order which is given by their respective subscript indices. Using such a representation, it is possible to retrieve a particular branch or a node by referring to the respective ordered set, B or N, with an appropriate index-pointer.

Therefore, the graph is defined in terms of the branch and node sets as $G_d^g=(N, B)$. In general, the network N has a changing topology. At one instant of time, some branches may be inactive and some nodes may be unused. At another instant of time, other branches may switch on and off including different nodes, thus defining a new topology. Whenever it is needed, the number of currently active branches may be denoted as q' and the number of currently used nodes as p'; whereupon the number of inactive branches and nodes may be expressed as q-q', and p-p', respectively. Often, when it is clear what the node and branch sets are, only their dimensions may be specified instead of actual sets. Also, a spanning tree $G_{tree}^k$ can be associated with each k-th closed subgraph $G^k$, and a corresponding forest of such trees $G_{tree}^g=(N, B_y)$ can be associated with the global graph $G^g=(N, B)$. Note that the set of forest branches $B_y$ is the subset of the global branch set, that is $B_y \subset B$.

There are several ways to represent a graph on a computer. Some methods may take advantage of the sparsity of the interconnection matrix and are, therefore more efficient than others in terms of the memory required to store a particular graph. A less efficient but algebraically convenient method is to represent a graph in matrix form. In particular, a node incidence matrix $A_f$ for the multi-graph has p rows and q columns (one row for each node and one column for each branch, all ordered). Even though this matrix never has full rank, it can be referred to as a full node incidence matrix meaning that it is not reduced to the size of its rank. This matrix is conveniently formed from positive and negative node incidence matrices as $$A_f = A_+ - A_- \quad (2.5)$$

where the entries of $A_+$ are $A_+(i, j)=1$ if the j-th branch includes the i-th positive node, and zero otherwise. Similarly, the only non-zero entries of $A_-$ are $A_-(i, j)=1$ if the j-th branch includes the i-th negative node. For the networks with changing topology, this matrix can be updated for each topology such that for each currently inactive branch $b_j$ the corresponding j-th column of $A_f$ is replaced with zeros. The transpose of $A_f$ is also known as the adjacency matrix of a graph. For large graphs, these matrices are quite sparse and, therefore, may be stored using techniques optimized for sparse matrices.

It is understood in the art that each connected subgraph of the network N contributes exactly one zero-row to $A_{RREF}$.

Thus, the rank of $A_f$ is always the number of active nodes less the number of connected subgraphs, which can be written as $$\text{rank}(A_f) = \text{rank}(A_{RREF}) = p' - g = r \quad (2.8)$$

It can be observed that the total number of loops in the undirected graph $G^g = (N, B)$ associated with $N$ may be computed as the number of active branches less the rank of $A_f$, which may be written as $$s = q' - \text{rank}(A_f) = q' - r \quad (2.9)$$

Figure 4:
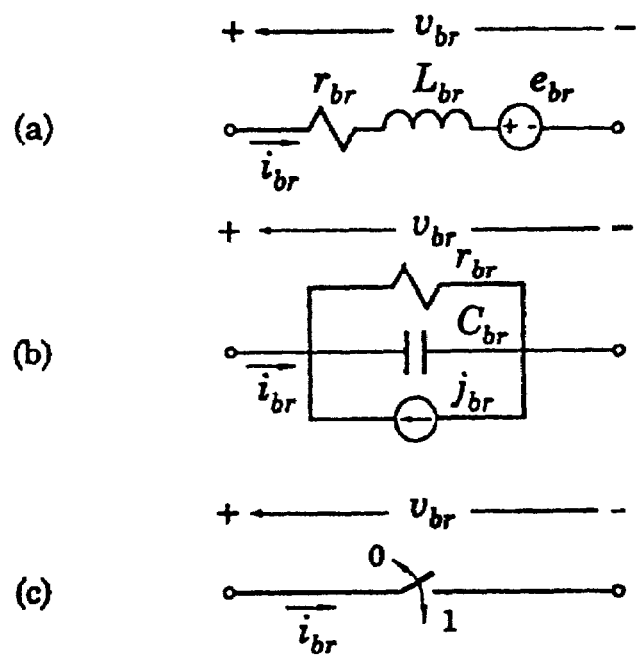
FIGS. 4A-4C are branches used to model circuit components using the present invention.

Using the branch models in FIG. 4, the parameters of the circuit can be conveniently arranged into parameter matrices denoted as $R_{br}$, $G_{br}$, $L_{br}$, and $C_{br}$. In one embodiment, these square matrices would have dimensions equal to the total number of branches in the global network to be modeled, and would contain the parameters of each branch in the corresponding diagonal entry of each matrix. If some branches are coupled through mutual inductances or mutual capacitances, then those mutual parameters are represented in the off-diagonal entries of $L_{br}$ or $C_{br}$ corresponding to these branches. In the same way, mutual resistances or mutual conductances can be modeled between branches. Even though such quantities might not have physical meaning similar to mutual inductances or mutual capacitances, they can be employed for simulation purposes. If some branch parameters are not present in the circuit, the corresponding entries in the parameter matrices are filled with zeros. Similar to parameter matrices, the external independent voltage and current sources are also represented as vectors denoted as $e_{br}$ and $j_{br}$. These vectors would have voltages and currets in those entries corresponding to the branches with respective sources and zeros elsewhere.

In some circuits to be simulated, the network parameters will not depend on the currents and voltages applied to the branches. In other circuits the parameters will vary with time, so the parameter matrices would also become matrix functions of time $R_{br}(t)$, $G_{br}(t)$, $L_{br}(t)$, and $C_{br}(t)$. For simplicity of notation herein, such time dependence will not be written explicitly. Also, since inductors and capacitors are energy storage components, in addition to their time dependence, their total derivatives with respect to time must also be known. Thus, the derivatives of time-varying inductances and capacitances are additional inputs into the model of the energy transformation and exchange processes in the circuit.

The network parameter matrices and the vectors of voltage and current sources can be grouped to form a parameter set for the global network, which can be defined as $$P = \left\{ R_{br}, L_{br}, \frac{dL_{br}}{dt}, e_{br}, G_{br}, C_{br}, \frac{dC_{br}}{dt}, j_{br} \right\} \quad (2.10)$$

It is also convenient to define the following subsets of P Clearly, $$P_L = \left\{ R_{br}, L_{br}, \frac{dL_{br}}{dt}, e_{br} \right\} \quad (2.11)$$

$$P_C = \left\{ G_{br}, C_{br}, \frac{dC_{br}}{dt}, j_{br} \right\} \quad (2.12)$$

$$P_A = \{ R_{br}, G_{br}, e_{br}, j_{br} \} \quad (2.13)$$

Clearly, $$P = P_L \cup P_C \cup P_A \quad (2.14)$$

Subdivision of the parameter set P corresponding to the global network N into subsets (2.11), (2.12), and (2.13) has the following goal. First, consider a grid of branches of either of the two types such that all parameters can be placed in one set $P_A$. A network of this kind does not have energy storage element such as inductors or capacitors. Modeling such a network would require solving a system of AEs relating branch voltages and currents to external sources through the network parameters and topology. From the nature of the equation that needs to be solved in order to obtain all branch currents and voltages, such networks are, referred to as being algebraic and denoted as $N_A$. On the other hand, networks whose parameters are placed in the set $P_L$ have inductive elements which may store energy in the magnetic field. Therefore, a network of this type possesses a system of ODEs, or more precisely a state equation, whose natural state variable may be inductor currents or flux linkages. Similarly, networks whose parameters are placed in $P_C$ have capacitors that may store energy in an electric field, and therefore, possess ODEs whose natural state variables may be capacitor voltages or charges. These two networks are referred to as inductive and capacitive, respectively.

Thus, three types of elementary electrical networks, namely inductive, capacitive, and algebraic, denoted as $N_L$, $N_C$, and $N_A$, respectively, are considered. There, only the first two networks are allowed to have energy storage circuit components, and therefore, only these two networks can have state variables. In the most general case, an electrical system may be composed of all types of branches considered above. Therefore, a corresponding network N can be represented as an interconnection of $N_L$, $N_C$, and $N_A$, which is symbolically expressed in terms of union as $$N = N_L \cup N_C \cup N_A \quad (2.15)$$

Depending on a particular circuit to be modeled, some networks may or may not be present in (2.15).

Topological Canonical Form

Models of electrical networks must obey all laws of circuit theory, and in particular, Kirchhoff's current and voltage laws, KCL and KVL. Automated modeling requires formulation of equations describing the network using KCL and KVL that are written algorithmically for the entire circuit or its sections. Moreover, KCL and KVL may be written for a network of the most general kind based only on its topological configuration and regardless of the actual branch elements of their volt-ampere characteristics. Therefore, the starting point in the analysis of graph $G_d^g = (N, B)$ is the associated fall node incidence matrix $A_f$.

It is necessary to express KCL and KVL for the network whose topology is given by $G_d^g = (N, B)$ and stored in $A_f$. For simplicity of notation, all branches in this section are assumed to be active. The procedure continues as follows. First, instead of $G_d^g = (N, B)$, the corresponding undirected version $G^g = (N, B)$ is considered. Then, suppose that from $G^g = (N, B)$, it is possible to find a forest of spanning trees $G_{tree}^g = (N, B_y)$ that spans the entire node set N using the set $B_y$, which is some subset of B of minimal size over all branch subsets. In general, $G_{trees}^g = (N, B_y)$ is far from being unique for a given $G^g = (N, B)$. In fact, it can be shown that a graph whose full node incidence matrix is $A_f$ has det $(A_f A_f^T)$ total number of spanning trees. Moreover, the partitioning of a multi-graph into spanning trees $G_{trees}^g = (N, B_y)$ and remaining link-branches is a nondeterministic topological problem. One way to simplify this task is to associate appropriate weights with the branches and convert the problem into finding a spanning tree with the minimized/maximized sum of such weights. This approach is known in network optimization as the minimum/maximum spanning tree problem. There are several well-known minimum/maximum spanning tree algorithms which roughly yield the order of complexity O(q log p) and better depending on the data structure used to represent a graph. Also, the branch weights should be relatively simple so as to promote good performance as well as to be able to prove certain useful properties. Thus, the weights can be assigned to network branches based on their respective parameters (2.10). This method of obtaining a spanning tree and a set of links, with some desired property, will be utilized in the present, exemplary embodiment for the purpose of automated modeling.

For the purpose of this section, any proper forest of spanning trees would suffice. Having performed such graph partitioning, the set of tree-branches $B_y$ is identified. Thereafter, the set of remaining link-branches $B_x$ can be determined as $$B_x = B - B_y \tag{2.16}$$

Since the subsets $B_y$ and $B_x$ are identified based on $G_{trees}{}^g = (N, B_y)$, it is now also possible to re-sort the complete branch set B such that all tree-branches appear first from the left and all the remaining link-branches on the right. That is, the branch set B can be re-ordered as $$B = \{B_y, B_x\} \tag{2.17}$$

The new branch order defined in (2.17) can be applied to the columns of $A_f$. In this case, the new branch order can be related to the original branch order through a permutation matrix which is denoted as $T_p$. Multiplying $A_f$ from the right by $T_p$ results in a matrix whose columns are ordered to correspond to the branch set B in (2.17). That is, the permutation matrix $T_p$ should sort the columns of $A_f$ such that $$A_f T_p = [A_{trees}, A_{links}] = \hat{A}_f \tag{2.18}$$

This permutation matrix can be assembled from an identity matrix by sorting its columns at the same time as the branches in (2.17). Note that the multiplication from the right by $T_p{}^T$ performs the reverse column permutation and restores the original column order. That is $$A_f = \hat{A}_f T_p{}^T \tag{2.19}$$

Here, as well as further on, the hat sign above the matrix denotes that the corresponding matrix or vector quantity is referred to a branch order different that the original order.

After the full node incidence matrix is expressed in the form (2.18), its algebraic properties can be utilized. In particular, since the columns of $A_{trees}$ correspond only to branches that form a free-of-cycles forest, this matrix must have a full rank. On the other hand, $A_{links}$ contains only columns corresponding to the link-branches, and therefore, none of its columns add to the rank of $\tilde{A}_f$. Therefore, the rank of $\tilde{A}_f$ as well as the rank of $A_f$ is determined by the columns of $A_{trees}$. Therefore, these columns can be chosen to be the basis columns of $\tilde{A}_f$ or $A_f$. With respect to (2.18), the basis columns appear first from left-to-right. The RREF of (2.18), therefore, will have the identity matrix of the size of its rank as the upper-left block, and its re-ordered structure becomes $$RREF(\hat{A}_f) = \begin{bmatrix} I_{rxr} & \hat{A}_{rxs} \\ 0_{gxr} & 0_{gxs} \end{bmatrix} \tag{2.20}$$

The zero rows on the bottom of (2.20) do not include any useful topological or algebraic information about the network and therefore can be deleted. We define the topological canonical form (TCF) of the node incidence matrix to be the result of the reduction of (2.20):

$$A_{TCF} = TCF(A_f) = [I_{rxr}, \hat{A}_{rxs}] \tag{2.21}$$

The TCF is one of the key concepts used herein to describe networks. From $A_{TCF}$, the reduced incidence matrix $\hat{A}_a$ and the so called basic loop matrix $\hat{B}_b$ are obtained as $$\hat{A}_a = A_{TCF} \tag{2.22}$$

$$\hat{B}_b = [-\hat{A}_{sxr}{}^T I_{sxs}] \tag{2.23}$$

Matrices (2.22) and (2.23) were assembled with respect to the branch order (2.17) and can be easily recovered for the original branch order as $$A_a = \hat{A}_a T_p{}^T \tag{2.24}$$

$$B_b = \hat{B}_b T_p{}^T \tag{2.25}$$

Denoting vectors of branch currents and voltages as $i_{br}$ and $v_{br}$, respectively, KCL and KVL written for the whole network have the usual form $$A_a i_{br} = 0 \tag{2.26}$$

$$B_b v_{br} = 0 \tag{2.27}$$

Also, instead of using recovered matrices (2.24)-(2.25), it is possible to re-sort $i_{br}$ and $v_{br}$ into $\hat{i}_{br}$ and $\hat{v}_{br}$ for the new branch order (2.17) using the same permutation matrix $T_p$, and then use these with (2.22)-(2.23) to form KCL and KVL similar to (2.26)-(2.27). That is $$\hat{A}_a i_{br} T_p = \hat{A}_a \hat{i}_{br} = 0 \tag{2.28}$$

$$\hat{A}_a v_{br} T_p = \hat{B}_b \hat{v}_{br} = 0 \tag{2.29}$$

Furthermore, based on the structure of TCF, an interesting property of matrices (2.22) and (2.23) can be utilized. This property relates voltages and currents of the branches corresponding to subsets $B_y$ and $B_x$ in (2.17). In particular, based on the branch order (2.17) it is possible to define the vectors of tree and link currents and voltages as $$\hat{i}_{br} = [i_y, i_x] \tag{2.30}$$

$$\hat{v}_{br} = [v_y, v_x] \tag{2.31}$$

Then, based on (2.22), (2.23), and (2.30), the vector of re-sorted branch currents can again be expressed in terms of the link currents as $$\hat{i}_{br} = (\hat{B}_b)^T i_x \tag{2.32}$$

Similarly, the vector of re-sorted branch voltages can be expressed in terms of the tree voltages as $$\hat{v}_{br} = (\hat{A}_a)^T v_y \tag{2.33}$$

The relations (2.28)-(2.33) play an important role in formulating the governing DAEs describing electrical networks.

Networks with State Variables

In this section, a class of finite electrical networks $N_q^{\alpha+\beta}$ is considered. In particular, the two types of networks that can be modeled using a state variable approach are inductive and capacitive. Equipped with techniques based on a topological search for an appropriate forest of spanning trees, the conditions under which a corresponding state equation can be assembled are also considered.

Inductive Network State Equation Formulation

An inductive network can be built using branches of the type depicted in FIG. 4(a). Assuming that all switches are active, a network of this type is given as (2.80)

$$N_L = (G, P_L) \quad (2.80)$$

where the parameter set $P_L$ is defined in (2.11).

For a given topology of $N_L$, the branches must be re-sorted into subsets as in (2.17). The subset $B_y$ would collect branches that form spanning trees for all subgraphs. Each such tree is free of cycles, and covers all active nodes in its subgraph. The second category, denoted as subset $B_x$, takes the link-branches. These branches are the links in a sense that addition of any of them to the spanning tree would result in a cycle. These branches can carry state variables—independent currents—and since their number is minimal for each spanning tree, they form a minimal set of states for the $N_L$. Thus, in order to partition $G^g=(N, B)$ and obtain the required branch sets, the following weight function $w_L(b)$ is defined as $$\text{For } j = 1 \ldots q, \; w_L(b_j) = \begin{cases} 0, \text{ if } L_{br}(j,j) = 0 \\ 1, \text{ if } L_{br}(j,j) \neq 0 \end{cases} \quad (2.81)$$

Applying the minimum spanning tree algorithm (MinSTA) to $G^g=(N, B)$ with weight function $w_L(b)$ a minimum spanning forest $G_{trees}^g=(N, B_y)$ is obtained as before. Thereafter, the set of link branches $B_x$ can be determined as in (2.16).

An important observation is that the network $N_L$ has no non-inductive loops if and only if there is a set $B_x$ in which the number of branches equals the sum of their weights $$\sum_{j \in B_x} w_L(b_j) = \text{size}(B_x) = s \quad (2.82)$$

Condition (2.82) in necessary and sufficient. The set $B_x$ need not be unique, but any such set $B_x$, satisfying (2.82) is equivalent in a topological sense. That is, an arbitrary set of branches (that can be larger than $B_x$) may be chosen to represent state variables, such as independent currents, in $N_L$ if and only if it contains a set $B_x$ satisfying topological condition (2.82). If however, (2.82) cannot be met, it follows that the given network is more than just a single inductive network. An algorithm for handling more than one network will be presented in later sections.

Applying the MinSTA with (2.81), assuming (2.82) holds, the order in which all branches are grouped and sorted according to (2.17) is obtained. This final branch order is related to the original branch order through a permutation matrix, which in this case is denoted as $T_L$. Using this permutation matrix and the TCF, matrices $A_a$ and $B_b$ are found as usual. Thereafter, a vector of state variables for $N_L$ may be chosen to be a vector of independent currents, such that $$i_{br} = B_b^T i_x \quad (2.83)$$

The corresponding state equation is obtained using the dimensionality reduction procedure discussed in Wasynczuk and Sudhoff. The procedure may be as follows. The voltage equation written for the network is multiplied from the left by the corresponding matrix of KVL and all vectors of branch currents are replaced with (2.83). The result is $$\frac{di_x}{dt} = -L_x^{-1}\left(R_x + \frac{dL_x}{dt}\right)i_x - L_x^{-1}B_b e_{br} \quad (2.84)$$

Capacitive Network State Equation Formulation

A capacitive network with augmented topology can be defined using the corresponding parameter set and an associated graph as $$N_C = (G, P_C) \quad (2.85)$$

where the set $P_C$ is defined in (2.12).

Also, in the case of $N_C$, the forest $B_y$ of the associated $G_{trees}^g=(N, B_y)$ can represent state variables—the capacitor voltages. Thus, a slightly different topological approach might be used. In particular, a MaxSTA with a different weight function can be applied in order to find maximum spanning trees. This time, the weight function $w_C(b_j)$ is defined such that $$\text{for } i = 1 \ldots p \quad w_C(b_j) = \begin{cases} 0, \text{ if } C_{br}(j,j) = 0 \\ 1, \text{ if } C_{br}(j,j) \neq 0 \end{cases} \quad (2.86)$$

In this case, the network $N_C$ should not have non-capacitive tree-branches. Such a condition is satisfied if and only if there is a branch set $B_y$ for which the following is true $$\sum_{b_i \in B_y} w_C(b_i) = \text{size}(B_y) = r \quad (2.87)$$

Condition (2.87) is also necessary and sufficient, and therefore, the discussion thereof applies to this case as well. Again, the set $B_y$ need not be unique, but all such sets for which (2.87) holds are equivalent in a topological sense. If the condition (2.87) cannot be met, it can be shown that the corresponding network is not just $N_C$ but a union of the form $N_C \cup N_A$. However, for the purpose of this section, a single capacitive network is considered.

Thus, applying the MaxSTA with weight function $w_C(b)$ and condition (2.87), a similar permutation matrix $T_C$, can be formed such that multiplying $A_f$ from the right by $T_C$ the desired branch order (2.17) for the $N_C$ can be obtained. Further, matrices $A_a$, and $B_b$ are formed exactly as before.

The natural state variables for $N_C$ are the capacitor voltages. Therefore, a vector of state variables $v_y$ can be chosen to be a vector of independent capacitor voltages such that $$v_{br} = A_a^T v_y \quad (2.88)$$

The state equation is very similar to (2.84) and is also obtained using the dimensionality reduction procedure applied to the current equation written in matrix form for $N_C$. The result is $$\frac{dv_y}{dt} = -C_y^{-1}\left(G_y + \frac{dC_y}{dt}\right)v_y + C_y^{-1}A_a j_{br} \quad (2.89)$$

where notations are analogous to those used in Wasynczuk and Sudhoff, supra. Specifically $$G_y = A_a G_{br} A_a^T \quad (2.90)$$

$$C_y = A_a C_{br} A_a^T \quad (2.91)$$

$$\frac{dC_y}{dt} = A_a\left(\frac{dC_{br}}{dt}\right)A_a^T \quad (2.92)$$

Transformation of Variables

An important observation regarding the selection of state variables for $N_L$ as well as for $N_C$ is that, once the set of states in (2.84) and (2.92) are obtained based on topological conditions specified previously, none of the actual states are required to be associated with any particular branch. That is, a topologically proper set of state variables in $N_L$ and $N_C$ can be transformed into an equivalent set by any non-singular coordinate transformation. Such a transformation of states is nothing more than a change of variables in the state space. To show this, it is useful to introduce time-varying coordinate transformation defined by two non-singular square matrices $K_L$ and $K_C$ of dimensions corresponding to the number of states in $N_L$ and $N_C$, respectively. Multiplying (2.26) and (2.27) from the left by $K_C^T$ and $K^{LT}$ respectively, KCL and KVL still hold:

$$K_C^T A_a i_{br} = 0 \quad (2.99)$$

$$K_L^T B_b v_{br} = 0 \quad (2.100)$$

Thereafter, the new state variables for $N_L$ and $N_C$ are related to $i_x$ and $v_y$ as $$i_x = K_L x_L \quad (2.101)$$

$$v_y = K_C x_C \quad (2.102)$$

And the corresponding branch currents in $N_L$ and the branch voltages in $N_C$ are expressed as $$i_{br} = B_b^T K_L x_L = \tilde{B}_b^T x_L \quad (2.103)$$

$$v_{br} = A_a^T K_C x_C = \tilde{A}_a^T x_C \quad (2.104)$$

Since the change of variables for the two networks is very similar, only the corresponding state equations for $N_L$ will be written explicitly. Proceeding as follows $$\frac{dx_L}{dt} = -K_L^{-1}L_x^{-1}\left(R_x + \frac{dL_x}{dt}\right)K_L x_L - K_L^{-1}\frac{d}{dt}(K_L)x_L - K_L^{-1}L_x^{-1}B_b e_{br} \quad (2.105)$$

$$= -\left(K_L^{-1}L_x^{-1}R_x K_L + K_L^{-1}L_x^{-1}\frac{d}{dt}(L_x)K_L + K_L^{-1}\frac{d}{dt}(K_L)\right)x_L - K_L^{-1}L_x^{-1}B_b e_{br}$$

Choosing $K_L$ to be a constant matrix, the result of transformation is $$\frac{dx_L}{dt} = -K_L^{-1}L_x^{-1}\left(R_x + \frac{dL_x}{dt}\right)K_L x_L - K_L^{-1}L_x^{-1}B_b e_{br} \quad (2.106)$$

$$= -\tilde{L}_x^{-1}\left(\tilde{R}_x + \frac{d\tilde{L}_x}{dt}\right)x_L - \tilde{L}_x^{-1}\tilde{B}_b e_{br}$$

where the reduced quantities with the subscript "x" and tilde above are defined using $\tilde{B}_b$ from (2.106) instead of just $B_b$. Since (2.84) and (2.106) are related through the similarity transformation via constant matrix $K_L$, the eigenvalues of the resulting dynamic matrices in both state equations are the same. Also, since it is possible to choose $K_L$ to be a permutation matrix, it follows that the branch ordering does not change the eigenvalues of the system.

It is also interesting to observe what happens to (2.105) if the time-varying coordinate transformation is chosen to be $$K_L = L_x^{-1} \quad (2.107)$$

In this case, the new state variables become fluxes $$\lambda_x = K_L^{-1} i_x = L_x i_x \quad (2.108)$$

Then, with the following equality $$\frac{d}{dt}(K_L^{-1})K_L + K_L^{-1}\frac{d}{dt}(K_L) = 0 \quad (2.109)$$

equation (2.105) reduces to state equation $$\frac{d\lambda_x}{dt} = -R_x L_x^{-1}\lambda_x - B_b e_{br} \quad (2.110)$$

A similar change of variables can be performed on $N_C$. The equations can be simplified even further by considering only constant capacitances, wherein a time invariant coordinate transformation $K_C$ can be used. Therefore, (2.105) may be rewritten as $$\frac{dx_C}{dt} = -K_C^{-1}C_y^{-1}G_y K_C x_C + K_C^{-1}C_y^{-1}A_a j_{br} \quad (2.111)$$

$$= \tilde{C}_y^{-1}\tilde{G}_y + \tilde{C}_y^{-1}\tilde{A}_a j_{br}$$

where, as before, the reduced quantities with the subscript "y" and tilde above are defined using $\tilde{A}_a$ from (2.111) instead of $A_a$.

Even though $K_C$ in (2.100) can be any non-singular matrix, it is always possible to choose it in a way that the new state variables have particular physical significance. Similar to $N_L$, where the states can be transformed from currents $i_x$ to fluxes $\lambda_x$, in the case of $N_C$ the states may be transformed from voltages $v_y$ to charges $q_y$ by an appropriate choice of transformation. In particular, by defining the transformation as $$K_C = C_y^{-1} \quad (2.112)$$

$$v_y = C_y^{-1} q_y \quad (2.113)$$

The state equations (2.111) with capacitor charges being states becomes $$\frac{dq_y}{dt} = -G_y C_y^{-1} q_y + A_a j_{br} \quad (2.114)$$

Multiple Networks

An algorithm for automatically deriving a system (or systems) of DAEs for time-domain simulation of many practically useful electrical networks will now be discussed. As noted previously, there are some conditions under which a global network with state variables, here denoted as $$N = (G, P_\zeta), \text{ where } \zeta = L, C \quad (3.1)$$

cannot be structurally represented entirely only as $N_L$ or as $N_C$. Specifically, an attempt to represent the network N structurally entirely as $N_L$ fails if there is a shortage of inductive link branches in the set $B_x$. On the other hand, the network N cannot be viewed only as $N_C$ if the corresponding forest of spanning trees lacks capacitive branches in the set $B_y$. In these cases, the global network cannot be viewed entirely as a single type of a network, and therefore, a more general approach is required.

A method of handling networks with arbitrary topologies is presented here based on the separation of N into interconnected networks. That is, if it is not possible to represent an entire circuit as a network of a single kind, it is necessary to identify some cuts of N that can be grouped together to form several networks based on their topological properties. Separation of N into $N_L$, $N_C$, and $N_A$ in a way such that it is possible to obtain consistent state equations for $N_L$, $N_C$, and a system of algebraic equations for $N_A$ is, therefore, a generalization of the ASMG approach for circuits with arbitrary topologies. In this sense, a robust state selection algorithm is a key to such a generalization.

The selection of branches that can carry state variables in $N_L$ or $N_C$ is determined through a topological partitioning of the global graph $G^g = (N, B)$ into a forest of trees and remaining link branches as $$G^g = (N, B) = \{G_{trees}, G_{links}\} \quad (3.2)$$

where $$G_{trees} = (N, B_y) \quad (3.3)$$

$$G_{links} = (N, B_x) \quad (3.4)$$

In previous discussions devoted to networks with state variables, the actual partitioning of $G^g = (N, B)$ was performed with two distinct objectives. First, with the help of the MinSTA and the weight function $w_L(b)$, it was possible to reorder branches such the that set of link-branches $B_x$ could be chosen to represent state variables in $N_L$. Second, using a similar topological approach based on MaxSTA and the weight function $w_C(b)$, it was shown that branches from the set of tree-branches $B_y$ can represent state variables in $N_C$. Thereafter, the conditions for the state equations to be complete were: for $N_L$ the corresponding set $B_x$ must contain only inductive branches; and for $N_C$ the corresponding set $B_y$ must contain only capacitive branches. These two branch sets could be obtained independently running MinST and MaxST algorithms with different weight functions. These topological conditions are stated in (2.82) and (2.87).

The technique of network identification and partitioning introduced here is based on the TCF of the node incidence matrix assembled for the global network. As it will be shown, the TCF makes topological information about N available in an "algebraic" sense for the further use in KCLs and KVLs. There are also some details about notation that are worth pointing out. The topological quantities referred to a particular branch order, such as in (2.17), will be distinguished by the hat sign, keeping in mind that it is always possible to transform them back to the original order using a corresponding permutation matrix. The superscripts "L", "C", and "A", and the combinations thereof would be employed to relate variables and quantities to the inductive, capacitive, algebraic, and the overlapping networks, respectively.

Starting with $N_L$, in will be shown how an algebraic network can be identified and how the corresponding system of algebraic equations can be assembled. It will also be shown that even in the presence of $N_A$, a minimal and consistent state equation for $N_L$ can still be obtained following the same dimensionality reduction procedure set forth in Wasynczuk and Sudhoff. Then, similar derivations will be repeated for $N_C$, in a somewhat simplified form, using its structural duality with respect to the inductive case. Finally, a way of obtaining a consistent system of DAEs relating all networks will be presented using the established framework.

Inductive and Algebraic Network Interconnection

Here, it is assumed that a network $N = (G, P_L)$ is constructed using branches shown in FIGS. 4A and 4C. This time, it is assumed that the MinSTA with weight function $w_L(b)$ is applied, and that in the end (2.82) does not hold. This implies that there is no way the set of links $B_x$ can be chosen to contain only inductive branches, and $$\sum_{j \in B_x} w_L(b_j) = h < \text{size}(B_x) \quad (3.5)$$

It follows from (2.17) and (3.5), there is at least one non-inductive branch in $B_x$ addition of which to $G_{trees} = (N, B_y)$ would result in a cycle. This cycle would be entirely composed of non-inductive branches. Otherwise, the spanning tree corresponding to this link branch would not be minimal which, in turn, would contradict the result of the MinSTA. In general, addition of any branch from $G_{links}=(N, B_x)$ to $G_{trees}=(N, B_y)$ results in a cycle. Therefore, the global graph $G^g=(N, B)$ has as many non-inductive cycles as there are non-inductive branches in the branch set $B_x$. This property is based on the MinST and the weight function (2.13). Thus, based on (3.2), the total number of non-inductive cycles in $G^g=(N, B)$ can be determined as $$m = \text{size}(B_x) - h = s - h \quad (3.6)$$

These cycles do not have state variables such as currents or fluxes. Therefore, none of the branches participating in such cycles can be placed in $N_L$.

There are many methods that can be used to identify cycle(s) of a particular kind in a graph. Recall that the branches can be reordered similar to (2.17) and (2.18) by a corresponding permutation matrix obtained from the Min-STA. This time, it is necessary to reorder branches in (2.17) and columns in (2.18) in an even more sophisticated way. Specifically, since it is known which branches in $B_x$ are non-inductive, they can be identified and put first on the left side in $A_{links}$. Then, the branches in $B_y$ that correspond to cycles linked by non-inductive branches in $B_x$ are identified, and the block $A_{trees}$ is resorted such that these columns appear on the right. Similar to (2.18) this final branch ordering can be expressed in terms of the node incidence matrix and permutation matrix as $$A_f T_L = [A_{trees}{}^L, A_{trees}{}^A, A_{links}{}^A, A_{links}{}^L] \quad (3.7)$$

According to the system of notation employed, the superscript "L" denotes that the corresponding branches can be safely placed into inductive network $N_L$, and the "A" identifies all other non-inductive branches, as viewed from $N_L$, that belong to $N_A$. Taking the RREF of (3.7) and removing zero rows on the bottom yields a TCF similar to the one introduced in (2.21).

$$A_{TCF} = \begin{bmatrix} I_{\eta \times \eta} & 0 & 0 & \hat{A}^L_{\eta \times h} \\ \hline 0 & I_{\mu \times \mu} & \hat{A}^A_{\mu \times m} & \hat{C}^A_{\mu \times h} \end{bmatrix} \quad (3.8)$$

where h—is the number of inductive link-branches in the set $B_x$, as defined in (3.5);

m—is the number of non-inductive link-branches in $B_x$, as defined in (3.6);

η—is the number of tree-branches in the set $B_y$ that are linked by the h inductive link-branches in $B_x$;

μ—is the number of tree-branches in $B_y$ that are linked by the m non-inductive link-branches from $B_x$.

Also, $\eta + \mu = r$, and $m + h = s$, where s and r are defined in (2.8) and (2.9), respectively. The corresponding subsets of tree-branches in $G_{trees}=(N, B_y)$ can be readily identified from the node incidence matrix $A_f$ in its TCF such as (2.21).

The reduced node incidence matrix and the basic loop matrix for the global network N are found as usual $$\hat{A}_a = A_{TCF} \quad (3.9)$$

$$\hat{B}_b = \begin{bmatrix} 0_{m \times \eta} & -(\hat{A}^A_{\mu \times m})^T & I_{m \times m} & 0_{m \times h} \\ \hline -(\hat{A}^L_{\eta \times h})^T & -(\hat{C}^A_{\mu \times h})^T & 0_{h \times m} & I_{h \times h} \end{bmatrix} \quad (3.10)$$

Even though the TCFs (2.21) and (3.8) are different only in terms of the relative order of some columns (branches), expression (3.8) has more advanced structural properties that can be utilized in writing KCL and KVL for the sections of the global network. Specifically, KCL for $N_L$ can be written based on (3.9) as $$[I_{\eta \times \eta} 0_{\eta \times \mu + m} \hat{A}^L_{\eta \times h}] \hat{i}_{br} = [I_{\eta \times \eta} \hat{A}^L_{r-\mu \times h}] \hat{i}^L_{br} \quad (3.11)$$

$$= \hat{A}^L_a \hat{i}^L_{br} = 0$$

Based on (3.10), KVL for $N_A$ can be derived as $$[0_{m \times \eta} - (\hat{A}^A_{\mu \times m})^T I_{m \times m} 0_{m \times h}] \hat{v}_{br} = [-(\hat{A}^A_{\mu \times m})^T I_{m \times m}] \hat{v}^A_{br} \quad (3.12)$$

$$= \hat{B}^A_b \hat{v}^A_{br} = 0$$

It is interesting to observe that KCL (3.11) is a self-contained equation for $N_L$. Similarly, KVL (3.12) contains only quantities relevant to $N_A$. In this sense, these two equations are de-coupled.

The vector of state variables for $N_L$, which is the vector of independent currents, is then chosen as $$\hat{i}^L_{br} = \begin{bmatrix} -\hat{A}^L_{\eta \times h} \\ I_{h \times h} \end{bmatrix} i_x = (\hat{B}^L_b)^T i_x \quad (3.13)$$

In proceeding further, two more equations describing both networks are needed, specifically KVL for $N_L$, and KCL for $N_A$. First, from (3.10), the following KVL can be written $$[-(\hat{A}^L_{\eta \times h})^T - (\hat{C}^A_{\mu \times h})^T 0_{h \times m} I_{h \times h}] \hat{v}_{br} = 0 \quad (3.14)$$

which may be rewritten using notation for the two networks as $$[-(\hat{A}^L_{\eta \times h})^T I_{h \times h}] \hat{v}^L_{br} = [(\hat{C}^A_{\mu \times h})^T 0_{h \times m}] \hat{v}^A_{br} \quad (3.15)$$

$$\hat{B}^L_b \hat{v}^L_{br} = \hat{C}^{LA}_b \hat{v}^A_{br}$$

Similarly, from (3.9), KCL can be written as $$\left[0_{\mu\times\eta} I_{\mu\times\mu} \hat{A}^A_{\mu\times m} \hat{C}^A_{\mu\times h}\right] \hat{i}_{br} = 0 \qquad (3.16)$$

and $$\left[I_{\mu\times\mu} \hat{A}^A_{\mu\times m}\right] \hat{i}^A_{br} = -\left[0_{\mu\times\eta} \hat{C}^A_{\mu\times h}\right] \hat{i}^L_{br} \qquad (3.17)$$

$$\hat{A}^A_a \hat{i}^A_{br} = \hat{C}^{LA}_a \hat{i}^L_{br} = -\hat{C}^A i_x$$

It is worth noting that (3.15) and (3.17) express the connection between the two networks. To be more specific, KVL (3.15) for $N_L$ now has an additional voltage source term that comes from the interconnection of $N_L$ and $N_A$. Similarly, KCL (3.17) written for N has current source term which comes from $N_L$.

The dimensionality reduction procedure for obtaining state equations for $N_L$ remains the same. That is, the voltage equation written in matrix form for the N is multiplied from the left by the corresponding KVL loop matrix, and the vector of branch currents is substituted with an expression of the form (2.83). Thus, using $B_b^L$ from the KVL (3.15) and the vector of state currents chosen as in (3.13), the state equation for $N_L$ becomes $$\frac{di_x}{dt} = -L_x^{-1}\left(R_x + \frac{dL_x}{dt}\right)i_x - L_x^{-1} B_b^L e_{br}^L - L_x^{-1} C_b^{LA} v_{br}^A \qquad (3.18)$$

where the reduced quantities with the subscript "x" can be obtained as $$R_x = B_b^L R_{br}^L (B_b^L)^T \qquad (3.19)$$
$$= \left[-(\hat{A}^L_{\eta\times h})^T 0_{h\times\mu+m} I_{h\times h}\right] \hat{R}_{br} \left[-(\hat{A}^L_{\eta\times h})^T 0_{h\times\mu+m} I_{h\times h}\right]^T$$

$$L_x = B_b^L L_{br}^L (B_b^L)^T \qquad (3.20)$$
$$= \left[-(\hat{A}^L_{\eta\times h})^T 0_{h\times\mu+m} I_{h\times h}\right] \hat{L}_{br} \left[-(\hat{A}^L_{\eta\times h})^T 0_{h\times\mu+m} I_{h\times h}\right]^T$$

$$R_{br} = T_L^T R_{br} T_L \qquad (3.21)$$

$$L_{br} = T_L^T L_{br} T_L \qquad (3.22)$$

It can be verified that $L_x$ is non-singular, and that (3.18) is in fact a minimal state equation for $N_L$ with the total of h state variables. Also, note the additional source term on the right side of (3.18), which distinguishes (3.18) from (2.84).

It appears that in order to solve (3.18), the branch voltages for $N_A$ should be known. These voltages are functions of internal topology, parameters, and external sources. In general, it is necessary to compute both currents and voltages for all branches in $N_A$. Here, KVL (3.12) and KCL (3.17) are utilized. In particular, suppose the currents of $N_A$ first, and then the branch voltages. However, in (3.17) there are fewer equations than branches in $N_A$. Specifically, (3.17) provides $\mu$ equations with m+$\mu$ unknowns. That is, there should be m more equations, precisely one for each cycle in $N_A$. On the other hand, $N_A$ has its own voltage equation, which may be expressed in terms of the branch order given by the columns of (3.7) as $$\hat{v}^A_{br} = \hat{R}^A_{br} \hat{i}^A_{br} + \hat{e}^A_{br} \qquad (3.23)$$

Substituting (3.23) into (3.11), the following result can be obtained $$\hat{B}^A_b \hat{R}^A_{br} \hat{i}^A_{br} = -\hat{B}^A_b \hat{e}^A_{br} \qquad (3.24)$$

where $\hat{e}_{br}^A$ is the vector of voltage sources corresponding to branches in $N_A$ and the branch order given by (3.7)

Combining (3.17) and (3.24), a complete system of m+$\mu$ equations for the branch currents of $N_A$ can be assembled in the following form $$\begin{bmatrix} \hat{A}^A_a \\ \hat{B}^A_b \hat{R}^A_{br} \end{bmatrix} \hat{i}^A_{br} = -\begin{bmatrix} \hat{C}^A & 0 \\ 0 & \hat{B}^A_b \end{bmatrix} \begin{bmatrix} i_x \\ \hat{e}^A_{br} \end{bmatrix}. \qquad (3.25)$$

If the branch resistances do not depend on currents, the system of equations (3.25) has the form Ax=b. In addition, if $N_A$ has time-invariant resistive branches, A is a constant nonsingular matrix. Therefore, for the time-invariant case, (3.25) can be solved by inverting the corresponding matrix A once for each new topology. Thereafter, the corresponding vector of branch voltages $\hat{v}_{br}^A$ is found using (3.23). Finally, (3.18), (3.23), and (3.25) form a system of DAEs describing the two networks $N_L$ and $N_A$.

Capacitive and Algebraic Network Interconnection

In this section, it is assumed that a network N=(G, $P_C$) is constructed from branch models shown in FIG. 4. It is assumed that the MaxSTA with the weight function $w_C(b)$ is applied and that condition (2.87) does not hold. This result implies that the set of tree-branches $B_y$ cannot be chosen to contain only capacitive branches, and $$\sum_{i \in B_y} w_C(b_i) = \tau < \text{size}(B_y) \qquad (3.26)$$

Then, based on (2.17) and (3.26), the total number of non-capacitive tree-branches in the forest of maximum spanning trees can be determined as $$\zeta = \text{size}(B_y) - \tau = r - \tau \qquad (3.27)$$

When applying the MaxSTA, a permutation matrix that sorts columns of the full node incidence matrix $A_f$ similar to (2.18) is also assembled. Using (2.18) and the maximum spanning tree property, the branches in $A_{links}$ and $A_{trees}$ are reordered in the following way.

First, all $\tau$ columns of $A_{links}$, corresponding to capacitive branches are placed on the left of $A_{links}$. Then, from the set $B_x$, the branches that are links to the capacitive trees in $G_{trees}=(N, B_y)$ are identified and the corresponding columns put on the right of $A_{trees}$. The final branch ordering with the corresponding permutation matrix yields a result similar to (3.7). That is $$A_f T_C = [A_{trees}^C, A_{trees}^A, A_{links}^A, A_{links}^C] \qquad (3.28)$$

Another TCF can be obtained by taking the RREF of (3.28) and removing zero rows from the bottom. This TCF has the following structure $$A_{TCF} = \begin{bmatrix} I_{\tau \times \tau} & 0 & \hat{D}^{CA}_{\tau \times t} & \hat{A}^{C}_{\tau \times z} \\ 0 & I_{\zeta \times \zeta} & \hat{A}^{A}_{\zeta \times t} & 0 \end{bmatrix} \quad (3.29)$$

where
- t—is the number of non-capacitive link-branches in the set $B_x$.
- z—is the number of capacitive link-branches in the set $B_x$.
- τ—is the number of capacitive tree-branches in the set $B_y$ as defined in (3.26).
- ζ—is the number of non-capacitive tree-branches in the set $B_y$ as defined in (3.27).

Also, ζ+τ=r and t+z=s. If any of the dimensions are equal to zero, the corresponding block in (3.29) would simply disappear.

Based on the TCF (3.29), the reduced node incidence matrix and the basic loop matrix, both referred to the branch ordering defined in (3.28), are found as $$A_a = A_{TCF} \quad (3.30)$$

$$\hat{B}_b = \begin{vmatrix} -(\hat{D}^{CA}_{\tau \times t})^T & -(\hat{A}^{A}_{\zeta \times t})^T & I_{t \times t} & 0 \\ -(\hat{A}^{C}_{\tau \times z})^T & 0 & 0 & I_{z \times z} \end{vmatrix} \quad (3.31)$$

Similar to (3.11)-(3.17), KCLs and KVLs can be written for the two networks. That is, writing KCL using (3.30), $$\begin{bmatrix} I_{\tau \times \tau} & 0 & \hat{D}^{CA}_{\tau \times t} & \hat{A}^{C}_{\tau \times z} \end{bmatrix} \hat{i}_{br} = 0 \quad (3.32)$$

$$\begin{bmatrix} I_{\tau \times \tau} & \hat{A}^{C}_{\tau \times z} \end{bmatrix} \hat{i}^{C}_{br} = \begin{bmatrix} 0 & -\hat{D}^{CA}_{\tau \times t} \end{bmatrix} \hat{i}^{A}_{br} \quad (3.33)$$

$$\hat{A}^{C}_a \hat{i}^{C}_{br} = \hat{D}^{CA}_a \hat{i}^{A}_{br}$$

and $$\begin{bmatrix} I_{\zeta \times \zeta} & \hat{A}^{A}_{\zeta \times t} \end{bmatrix} \hat{i}^{A}_{br} = \hat{A}^{A}_a \hat{i}^{A}_{br} = 0 \quad (3.34)$$

Writing KVL based on (3.31), $$\begin{bmatrix} -(\hat{D}^{A}_{\tau \times t})^T & -(\hat{A}^{A}_{\zeta \times t})^T & I_{t \times t} 0_{t \times z} \end{bmatrix} \hat{v}_{br} = 0 \quad (3.35)$$

$$\begin{bmatrix} -(\hat{A}^{A}_{\zeta \times t})^T & I_{t \times t} \end{bmatrix} \hat{v}^{A}_{br} = \begin{bmatrix} (\hat{D}^{A}_{\tau \times t})^T & 0_{z \times z} \end{bmatrix} \hat{v}^{C}_{br} \quad (3.36)$$

$$\hat{B}^{A}_b \hat{v}^{A}_{br} = \hat{D}^{CA}_b \hat{v}^{C}_{br}$$

and $$\begin{bmatrix} -(\hat{A}^{C}_{\tau \times z})^T & I_{z \times z} \end{bmatrix} \hat{v}^{C}_{br} = \hat{B}^{C}_b \hat{v}^{C}_{br} = 0 \quad (3.37)$$

Selecting the vector of state variables for $N_C$ to be the vector of independent voltages $v_y$, similar to (2.88), then $$\hat{v}^{C}_{br} = \begin{bmatrix} I_{\tau \times \tau} \\ (\hat{A}^{C}_{\tau \times z})^T \end{bmatrix} v_y = (\hat{A}^{C}_a)^T v_y \quad (3.38)$$

Expression (3.28) can also be written as $$\hat{B}^{A}_b \hat{v}^{A}_{br} = (\hat{D}^{A})^2 v_y \quad (3.39)$$

Assuming that the vector of branch currents for network $N_A$ can be expressed in terms of the branch order (3.28) as $$\hat{i}^{A}_{br} = \hat{G}^{A}_{br} \hat{v}^{A}_{br} - \hat{j}^{A}_{br} \quad (3.40)$$

the system of linear equations for $\hat{v}_{br}{}^A$ based on (3.34), (3.39), and (3.40) can be written as $$\begin{bmatrix} \hat{B}^{A}_b \\ \hat{A}^{A}_a \hat{G}^{A}_{br} \end{bmatrix} \hat{v}^{A}_{br} = \begin{bmatrix} (\hat{D}^{A})^T & 0 \\ 0 & \hat{A}^{A}_n \end{bmatrix} \begin{bmatrix} v_y \\ \hat{j}^{A}_{br} \end{bmatrix} \quad (3.41)$$

If the branch conductances do not depend on voltages, the system of equations (3.41) has the form Ax=b, with ζ+t equations and the same number of unknowns, and A being a full-rank square matrix.

Using the dimensionality reduction procedure in Wasynczuk and Sudhoff, the state equation for the $N_C$ in the presence of the algebraic network becomes $$\frac{dv_y}{dt} = -C_y^{-1}\left(G_y + \frac{dC_y}{dt}\right)v_y + C_y^{-1} A_\alpha j_{br} - C_y^{-1} D_\alpha^{CA} i^{A}_{br} \quad (3.42)$$

where the reduced quantities are defined as $$C_y = A_\alpha^C C_{br}(A_\alpha^C)^T \quad (3.43)$$

$$= \begin{bmatrix} I_{\tau \times \tau} 0_{\tau \times \zeta + t} \hat{A}^{C}_{\tau \times z} \end{bmatrix} \hat{C}_{br} \begin{bmatrix} I_{\tau \times \tau} 0_{\tau \times \zeta + t} \hat{A}^{C}_{\tau \times z} \end{bmatrix}^T$$

$$G_y = A_\alpha^C G_{br}(A_\alpha^C)^T \quad (3.44)$$

$$= \begin{bmatrix} I_{\tau \times \tau} 0_{\tau \times \zeta + t} \hat{A}^{C}_{\tau \times z} \end{bmatrix} \hat{G}_{br} \begin{bmatrix} I_{\tau \times \tau} 0_{\tau \times \zeta + t} \hat{A}^{C}_{\tau \times z} \end{bmatrix}^T$$

and $$\hat{C}_{br} = T_L{}^T C_{br} T_L \quad (3.45)$$

$$\hat{G}_{br} = T_L{}^T G_{br} T_L \quad (3.46)$$

Inductive, Capacitive, and Algebraic Network Interconnection

Heretofore, both types of network, namely $N_L$ and $N_C$, have been considered with a shortage of branches that can carry state variables. In both cases, the corresponding minimal state equations (3.18) and (3.42) were completed by adding extra source terms that came about due to the algebraic part of the corresponding network. Also, both types of the final systems of DAEs are structurally similar due to their dual circuit. These structural properties can be utilized even, further in obtaining a system of DAEs for the global network N=(G, P) that includes $N_L$, $N_C$, and $N_A$. In doing so, there are two approaches.

In the first approach, $N_L$ and $N_A$ are considered as was done in the beginning of this chapter, whereupon $N_C$ is incorporated into the existing structure. In doing so, capacitor voltages of $N_C$ can be mapped into $e_{br}^L$ and $V_{br}^A$ in (3.18). A second approach would consist of adding $N_L$ to the structure developed for the $N_C$ and $N_A$, and mapping inductor currents into $j_{br}^C$ and $i_{br}^A$ in (3.42). Since both methods yield equivalent results, choosing either one is a matter of pure convenience. Following the order in which the material was presented earlier, preference is given to the first approach.

Suppose that the MinSTA is applied resulting in (3.5) from which the branch order (3.7) and the TCF (3.8) are obtained. In the most general case, $N_C$ could have its branches anywhere in $G_{trees}=(N, B_y)$ and among any non-inductive link-branches in $G_{links}=(N, B_x)$. Relative to (3.7), these branches could be columns corresponding to blocks $A_{trees}^L$, $A_{trees}^A$, and $A_{links}^A$. The capacitive branches corresponding to any of the columns in $A_{trees}^L$ represent the part of $N_C$ that overlaps with $N_L$. As a result of such overlapping, each of such capacitive branches is going to have its own independent state variable within $N_C$. In fact, the branch voltages corresponding to such capacitive branches can be viewed as independent voltage sources $e_{br}^L$ present in (3.18). The remaining capacitive branches are viewed as a part of an algebraic network for $N_L$, and therefore, are going to be represented in the columns of blocks $A_{trees}^A$ and $A_{links}^A$ as given in (3.7).

Now, the challenge is to reorder columns (branches) in (3.7) taking into consideration the capacitive network. The procedure of reordering columns is very similar to the two previous cases. In particular, all columns corresponding to the non-capacitive branches in $A_{trees}^L$ are identified and placed on the left side of this block. Then, the trees of capacitive branches that form a capacitive network need to be separated. In order to achieve this, the MaxSTA with weight function $w_C(b)$ is applied to the branches in $A_{trees}^A$ and $A_{links}^A$. Then, with the result (3.26), the columns of this block are again sorted similar to (3.28). Thereafter, the final branch ordering with corresponding permutation matrix may be expressed as $$A_f T_{LCA} = [A_{trees}^L, A_{trees}^{LC}, A_{trees}^C, A_{trees}^A, A_{links}^A, A_{links}^{CA}, A_{links}^L] \quad (3.47)$$

The permutation matrix $T_{LCA}$ in (3.47) sorts branches of the global network N in groups with very specific topological properties corresponding to different networks. Again, taking the RREF of (3.47) and removing the zero rows, a TCF with the following structure is produced $$A_{TCF} = \begin{bmatrix} I_{\eta \times \eta}^L & 0 & 0 & 0 & 0 & 0 & \hat{A}_{\eta \times h}^L \\ 0 & I_{\mu \times \mu}^{LC} & 0 & 0 & 0 & 0 & \hat{A}_{\mu \times h}^{LC} \\ 0 & 0 & I_{\tau \times \tau}^{CA} & 0 & \hat{D}_{\tau \times t}^{CA} & \hat{A}_{\tau \times z}^C & \hat{C}_{\tau \times h}^{LC} \\ 0 & 0 & 0 & I_{\zeta \times \zeta}^A & \hat{A}_{\zeta \times t}^A & 0 & \hat{C}_{\zeta \times h}^{LA} \end{bmatrix} \quad (3.48)$$

where $\eta$—is the number of non-capacitive tree-branches in the set $B_y$ that are also placed in $N_L$.

$\mu$—is the number of capacitive tree-branches in $B_y$ that are placed in $N_L$ and $N_C$.

$\tau$—is the number of capacitive tree-branches in $B_y$ that are placed in $N_C$.

$\zeta$—is the number of non-capacitive tree-branches in $B_y$ that are placed in $N_A$.

t—is the number of non-capacitive link branches in $B_x$ that are placed in $N_A$.

z—is the number of capacitive link-branches in $B_x$ that are placed in $N_C$.

h—is the number of inductive link-branches in the set $B_x$ that are placed in $N_L$.

The reduced node incidence matrix and the basic loop matrix for the global network referred to the branch order (3.47) are then found as $$A\alpha = A_{TCF} \quad (3.49)$$

$$\hat{B}_b = \begin{bmatrix} 0 & 0 & -(\hat{D}_{\tau \times t}^{CA})^T & -(\hat{A}_{\zeta \times t}^A)^T & I_{t \times t} & 0 & 0 \\ 0 & 0 & -(A_{\tau \times z}^C)^T & 0 & 0 & I_{z \times z} & 0 \\ -(\hat{A}_{\eta \times h}^L)^T & -(\hat{A}_{\mu \times h}^{LC})^T & -(\hat{C}_{\tau \times h}^{LC})^T & -(\hat{C}_{\zeta \times h}^{LA})^T & 0 & 0 & I_{h \times h} \end{bmatrix} \quad (3.50)$$

From this point, it is possible to proceed as usual. KCL for $N_L$ using (3.49) can be written as $$\begin{bmatrix} I_{\eta \times \eta}^L & 0 & 0_{\eta \times \tau + \zeta + t + z} & \hat{A}_{\eta \times h}^L \\ 0 & I_{\mu \times \mu}^{LC} & 0_{\mu \times \tau + \zeta + t + z} & \hat{A}_{\mu \times h}^{LC} \end{bmatrix} \hat{i}_{br} = 0 \quad (3.51)$$

$$\begin{bmatrix} I_{\eta \times \eta}^L & 0 & \hat{A}_{\eta \times h}^L \\ 0 & I_{\mu \times \mu}^{LC} & \hat{A}_{\mu \times h}^{LC} \end{bmatrix} \hat{i}_{br}^L = \hat{A}_\alpha^L \hat{i}_{br}^L = 0 \quad (3.52)$$

For $N_L$ and $N_A$, $$\begin{bmatrix} 0_{\zeta \times \eta + \mu + \tau} & I_{\zeta \times \zeta}^A & \hat{A}_{\zeta \times t}^A & 0_{\zeta \times z} & \hat{C}_{\zeta \times h}^{LA} \end{bmatrix} \hat{i}_{br} = 0 \quad (3.53)$$

$$\begin{bmatrix} I_{\zeta \times \zeta}^A & \hat{A}_{\zeta \times t}^A \end{bmatrix} \hat{i}_{br}^A = \begin{bmatrix} 0_{\zeta \times \eta + \mu + \tau} & -\hat{C}_{\zeta \times h}^{LA} \end{bmatrix} \hat{i}_{br}^L \quad (3.54)$$

$$\hat{A}_\alpha^A \hat{i}_{br}^A = -\hat{C}_\alpha^{LA} \hat{i}_{br}^L$$

Finally, KCL relating $N_C$ to the two remaining networks is $$\begin{bmatrix} 0_{\mu\times\eta} & I_{\mu\times\mu}^{LC} & 0 & 0 & 0 & 0 & \hat{A}_{\mu\times h}^{LC} \\ 0_{\tau\times\eta} & 0_{\tau\times\mu} & I_{\tau\times\tau}^{CA} & 0_{\tau\times\zeta} & \hat{D}_{\tau\times t}^{CA} & \hat{A}_{\tau\times z}^{C} & \hat{C}_{\tau\times h}^{LC} \end{bmatrix} \hat{i}_{br} = 0 \quad (3.55)$$

$$\begin{bmatrix} I_{\mu\times\mu}^{LC} & 0 & 0 \\ 0_{\tau\times\mu} & I_{\tau\times\tau}^{CA} & \hat{A}_{\tau\times z}^{C} \end{bmatrix} \hat{i}_{br}^{C} = \begin{bmatrix} 0_{\mu\times\eta+\mu} - \hat{A}_{\mu\times h}^{LC} \\ 0_{\tau\times\eta+\mu} - \hat{C}_{\tau\times h}^{LC} \end{bmatrix} \hat{i}_{br}^{L} + \begin{bmatrix} 0_{\mu\times\zeta} & 0_{\mu\times t} \\ 0_{\tau\times\zeta} & -\hat{D}_{\tau\times t}^{CA} \end{bmatrix} \hat{i}_{br}^{A} \quad (3.56)$$

$$\hat{A}_a^C \hat{i}_{br}^C = -\hat{C}_a^{LC} \hat{i}_{br}^L - \hat{D}_a^{CA} \hat{i}_{br}^A$$

Based on (3.50), KVL can be written in the following way. First, for the capacitive network $$\left[0_{z\times\eta+\mu} - (\hat{A}_{\tau\times z}^{C})^T 0_{z\times\tau+t} I_{z\times z} 0_{z\times h}\right] \hat{v}_{br} = 0 \quad (3.57)$$

$$\left[-(\hat{A}_{\tau\times z}^{C})^T I_{z\times z}\right] \hat{v}_{br}^{C} = \hat{B}_b^C \hat{v}_{br}^C = 0 \quad (3.58)$$

Then, for $N_C$ and $N_A$ $$\left[0_{t\times\eta+\mu} - (\hat{D}_{\tau\times t}^{CA})^T - (\hat{A}_{\zeta\times t}^{A})^T I_{t\times t} 0_{t\times z+h}\right] \hat{v}_{br} = 0 \quad (3.59)$$

$$\left[-(\hat{A}_{\zeta\times t}^{A})^T I_{t\times t}\right] \hat{v}_{br}^A = \left[0_{t\times\mu} (\hat{D}_{\tau\times t}^{CA})^T 0_{t\times z}\right] \hat{v}_{br}^C \quad (3.60)$$

$$\hat{B}_b^A \hat{v}_{br}^A = -\hat{D}_b^{CA} \hat{v}_{br}^C$$

Finally, KVL relating all three networks can be written as $$\left[-(\hat{A}_{\eta\times h}^{L})^T - (\hat{A}_{\mu\times h}^{LC})^T - (\hat{C}_{\tau\times h}^{LC})^T - (\hat{C}_{\zeta\times h}^{LA})^T 0_{h\times t+z} I_{h\times h}\right] \hat{v}_{br} = 0 \quad (3.61)$$

$$\left[-(\hat{A}_{\eta\times h}^{L})^T 0_{h\times\mu} I_{h\times h}\right] \quad (3.62)$$

$$\hat{v}_{br}^L = \left[(\hat{A}_{\mu\times h}^{LC})^T (\hat{C}_{\tau\times h}^{LC})^T 0_{h\times z}\right] \hat{v}_{br}^C + \left[(\hat{C}_{\zeta\times h}^{LA})^T 0_{h\times t}\right] \hat{v}_{br}^A =$$

$$\hat{B}_b^C \hat{v}_{br}^L = -\hat{C}_b^{LC} \hat{v}_{br}^C - \hat{C}_b^{LA} \hat{v}_{br}^A$$

As before, the vector of state variables for $N_L$ is selected as a vector of independent currents such that $$\hat{i}_{br}^L = \begin{bmatrix} -\hat{A}_{\eta\times h}^{L} \\ -\hat{A}_{\mu\times h}^{LC} \\ I_{h\times h} \end{bmatrix} i_x = (\hat{B}_b^{LC})^T i_x \quad (3.63)$$

Note that in (3.63), it is possible to use $\hat{B}_b^L$ from (3.62) in order to avoid computing currents of capacitive branches.

Similar 016410-112 to (3.38), the vector of states for $N_C$ is chosen to be a vector of independent capacitor voltages such that $$\hat{v}_{br}^C = \begin{bmatrix} I_{\mu\times\mu}^{LC} & 0 \\ 0 & I_{\tau\times\tau}^{CA} \\ 0 & (\hat{A}_{\tau\times z}^{C})^T \end{bmatrix} v_y = (\hat{A}_a^C)^T v_y \quad (3.64)$$

Based on definition (3.63), expression (3.54) becomes $$\hat{A}_a^A \hat{i}_{br}^A = -\hat{C}_a^{LA} \hat{i}_{br}^L = -C^{LA} i_x \quad (3.65)$$

Also, based on (3.63) and (3.56), it follows that $$\begin{bmatrix} 0_{\mu\times\eta+\mu} - \hat{A}_{\mu\times h}^{LC} \\ 0_{\tau\times\eta+\mu} - \hat{C}_{\tau\times h}^{LC} \end{bmatrix} \hat{i}_{br}^L = \begin{bmatrix} -\hat{A}_{\mu\times h}^{LC} \\ -\hat{C}_{\tau\times h}^{LC} \end{bmatrix} i_x = -D^{LC} i_x \quad (3.66)$$

which then can be used to rewrite the compact form of (3.56) as $$\hat{A}_a^C \hat{i}_{br}^C = -\hat{C}_a^{LC} \hat{i}_{br}^L - \hat{D}_a^{CA} \hat{i}_{br}^A = -D^{LC} i_x - \hat{D}_a^{CA} \hat{i}_{br}^A \quad (3.67)$$

Similarly, based on (3.64), KVL (3.60) and (3.62) can be rewritten as $$\hat{B}_b^A \hat{v}_{br}^A = -\hat{D}_b^{CA} \hat{v}_{br}^C = -D^{CA} v_y \quad (3.68)$$

$$\left[(\hat{A}_{\mu\times h}^{LC})^T (\hat{C}_{\tau\times h}^{LC})^T 0_{h\times z}\right] \hat{v}_{br}^C = \left[(\hat{A}_{\mu\times h}^{LC})^T (\hat{C}_{\tau\times h}^{LC})^T\right] v_y = -C^{LC} v_y \quad (3.69)$$

$$\hat{B}_b^L \hat{v}_{br}^L = -\hat{C}_b^{LC} \hat{v}_{br}^C - \hat{C}_b^{LA} \hat{v}_{br}^A = -C^{LC} v_y - \hat{C}_b^{LA} \hat{v}_{br}^A \quad (3.70)$$

Note that KCL (3.67) written for $N_C$ and KVL (3.70) written for $N_L$ are coupled through the corresponding interconnection matrices that are related to each other as $$C^{LC} = -(D^{LC})^T \quad (3.71)$$

Using (3.70), (3.67), and the dimensionality reduction procedure of Wasynczuk and Sudhoff, the state equations for inductive and capacitive networks become $$\frac{di_x}{dt} = -L_x^{-1}\left(R_x + \frac{dL_x}{dt}\right)i_x - L_x^{-1} C^{LC} v_y - L_x^{-1} C_b^{LA} v_{br}^A - L_x^{-1} B_b^L e_{br}^L \quad (3.72)$$

$$\frac{dv_y}{dt} = -C_y^{-1}\left(G_y + \frac{dC_y}{dt}\right)v_y - C_y^{-1} D^{LC} i_x - C_y^{-1} D_a^{CA} \hat{i}_{br}^A + C_y^{-1} A_a^C j_{br}^C \quad (3.73)$$

where all reduced quantities with the subscripts "x" and "y" can be computed very much like the ones in (3.19), (3.20), (3.43), and (3.44) using the corresponding KVL matrix $B_b^L$ and KCL matrix $A_a^C$. As before, it can be verified that (3.72) and (3.73) are the minimal state equations for the $N_L$ and $N_C$, respectively. The reduced quantities $L_x$ and $C_y$ are indeed non-singular matrices for any practical network.

As before, in order to solve (3.72) and (3.73) for the state derivatives, the branch currents and voltages of the algebraic network must be computed first. Here, it is reasonable to assume that $N_A$ contains non-empty resistive branches that are modeled as depicted in FIGS. 4(a) and (b), with voltage or current sources, respectively.

Since a single branch cannot contain both types of sources and assuming that each branch of $N_A$ has a nonzero resistor, the voltage equation for $N_A$ can be written as $$\hat{v}_{br}^A = \hat{R}_{br}^A(\hat{i}_{br}^A + \hat{j}_{br}^A) + \hat{e}_{br}^A \qquad (3.74)$$

Then, in order to obtain a system of equations for $N_A$, KCL (3.65) and KVL (3.68) should be utilized. Thus, substituting (3.74) into (3.68) and combining the result with (3.65), the following system of equations is obtained $$\begin{bmatrix} \hat{A}_a^A \\ \hat{B}_b^A \hat{R}_{br}^A \end{bmatrix} \hat{i}_{br}^A = \begin{bmatrix} -C^{LA} i_x \\ -D^{CA} v_y - \hat{B}_b^A(\hat{R}_{br}^A \hat{j}_{br}^A + \hat{e}_{br}^A) \end{bmatrix} \qquad (3.75)$$

which has $\zeta+t$ equations and the same number of unknowns. If $\hat{R}_{br}^A$ does not depend on branch currents, the system (3.75) would have the form Ax=b with A being a full rank square matrix. Thereafter, (3.75) can be solved for the vector of currents $\hat{i}_{br}^A$ which is then used in (3.74) in order to compute the voltages $\hat{v}_{br}^A$. Finally, (3.72)-(3.75) represent a consistent system of DAEs for the three elementary networks $N_L$, $N_C$, and $N_A$.

Elementary Network Identification Procedure

For large electrical networks, storing the associated multigraphs in matrix format leads to sparse matrices of accordingly large dimensions. Even though the actual topological matrices used for elementary networks as KCLs and KVLs are smaller in size, these matrices are sparse and their dimensions are proportional to the size of the elementary networks. However, in order to gain computational efficiency, it is desirable to employ techniques that would avoid multiplication of large sparse matrices. A direct way to reduce the unnecessary operations is to use the techniques developed for sparse algebra in all computations involving topological matrices. Essentially this would lead to component-wise operations involving all of the network branch parameters. Alternatively, it is possible to use a more compact technique for graph representation such as collections of adjacency lists instead of adjacency matrices. Such lists can be conveniently implemented on a computer, which in turn would enable the usage of more efficient Min/MaxST algorithms. Representation of graphs in terms of compact data structures also suggests reformulation of the network identification procedure using ordered sets instead of topological matrices.

Input Data

Given a general electrical network N, the associated graph is defined in terms of node and branch sets as G=(N, B). The graph G must be closed (G must form a valid circuit), which implies the following (1) each branch in B is a member of some cycle composed of more than one branch (self-loops are not allowed)

(2) The entire branch set B can be partitioned into two subsets $B_y$ and $B_x$ such that they have no branches in common, set $B_y$ has a minimal size and spans the entire node set N. Moreover, $G_{trees}$=(N, $B_y$) is a spanning tree. If G is a multi-graph, then $G_T$ is a spanning forest (forest of spanning trees). Also, based on the parameter set P, the weight functions $\omega_L$ (2.81) and $\omega_C$ (2.86) must be defined over the entire branch set B. Then, depending on the order in which the elementary networks are to be found, a network identification procedure can be formulated in four major steps. Two procedures will now be discussed for the different order of network identification.

L-C-A Procedure

Step 1: Call the minimum spanning tree algorithm $$\text{MinSTA}(G, w_L) \rightarrow G_{trees}=(N, B_y) \qquad (3.80)$$

Given $B_y$ from (3.80), the set of link-branches is defined as $$B_x = B - B_y \qquad (3.81)$$

Branches in $B_x$ for which $\omega_L(b_j)=1$ (inductive link-branches) are identified defining the set $B_x^L$. Then, the set of link-branches is re-ordered as follows $$B_x = \{\hat{B}_x^{CA}, B_x^L\} \qquad (3.82)$$

where $\hat{B}_x^{CA}$ is a temporary set of non-inductive link-branches.

Step 2: $B_x^L$ is removed from the global branch set B and the remaining closed graph is defined $\tilde{G}=(\tilde{N}, \tilde{B}^{CA})$. Then, it is necessary to find all the tree-branches in $B_y$ that are linked by $\tilde{B}_x^{CA}$. Let this temporary branch set be denoted as $\tilde{B}_y^{CA}$. Thereafter, the branch set for $\tilde{G}$ is found as $$\tilde{B}^{CA} = \{\tilde{B}_y^{CA}, \tilde{B}_x^{CA}\} \qquad (3.83)$$

Based on the MinST property, it can be proved that none of the branches in $\tilde{B}^{CA}$ are inductive. The branch set $B_y$ can be partitioned into the following sets $$B_y = \{B_y^{LC}, \tilde{B}_y^{CA}\} \qquad (3.84)$$

Since some of the branches in $B_y^{LC}$ may be capacitive, this branch set may be partitioned further as $$B_y^{LC} = \{B_y^L, B_y^{C1}\} \qquad (3.85)$$

Also note that since the branch set $\tilde{B}^{CA}$ (3.83) forms a closed graph, the remaining branches $\{\tilde{B}_y^{LC}, B_x^L\}$ do not, unless $\tilde{B}^{CA}$ and $\{\tilde{B}_y^{LC}, B_x^L\}$ are sets of galvanically disjointed branches.

Step 3: The maximum spanning tree algorithm is applied $$\text{MaxSTA}(\tilde{G}, w_C) \rightarrow \tilde{G}_{trees}=(\tilde{N}, B_y^{CA}) \qquad (3.86)$$

Since $B_y^{CA}$ has an optimal property, it is no longer a temporary set. Also, due to such possible improvement, this set may be different from the one used in (3.83).

Proceeding further, all branches in $B_y^{CA}$ for which $\omega_C(b_j)=1$ (capacitive branches) are identified and placed into a separate set here denoted as $B_y^{C2}$. Then $B_y^{CA}$ can be partitioned as $$B_y^{CA}=\{B_y^{C2}, B_y^A\} \qquad (3.87)$$

The set of link-branches is retrieved as $$B_x^{CA} = \tilde{B}^{CA} - B_y^{CA} \qquad (3.88)$$

Step 4: $B_y^A$ is removed from the global branch set $B_y^{CA}$ and the remaining closed graph is denoted $\hat{G}=(\hat{N}, \hat{B}^C)$. Next, all link-branches in $B_x$ that correspond to tree-branches in $B_y^{C_2}$ are found. Let this branch set be denoted as $B_x^C$. This set actually may or may not have capacitive branches, but all of its branches are links to capacitive trees in $B_y^{C_2}$. The remaining link-branches can be found as $$B_x^A = B_x^{CA} - B_x^C \qquad (3.89)$$

Then, the following set partitioning can be formed $$B_y^{CA} = \{B_y^{C_2}, B_y^A\} \qquad (3.90)$$

$$B_x^{CA} = \{B_x^A, B_x^C\} \qquad (3.91)$$

Based on the property of MaxSTA, it is possible prove that $B_x^A$ has no capacitive branches.

Finally, the global branch set B can be reordered in terms of the sets identified so far as $$B = \{B_y^L, B_y^{C_1}, B_y^{C_2}, B_y^A, B_x^A, B_x^C, B_x^L\} \qquad (3.92)$$

Thereafter, the elementary networks are formed based on the branch sets as follows $$\{B_y^L, B_x^L\} \in N_L \qquad (3.93)$$

$$\{B_y^{C_1}, B_y^{C_2}, B_x^C\} \in N_C \qquad (3.94)$$

$$\{B_y^A, B_x^A\} \in N_A \qquad (3.95)$$

The branch order established in (3.92) corresponds to the TCF (3.48) with the block matrices having dimensions of their respective sets in (3.93)-(3.95).

C-L-A Procedure

Step 1: The maximum spanning tree algorithm is applied $$\text{MaxSTA}(G, w_C) \rightarrow G_{trees} = (N, B_y) \qquad (3.96)$$

The set of link-branches becomes $$B_x = B - B_y \qquad (3.97)$$

All capacitive branches in $B_y$ are identified. This set is then re-sorted as follows $$B_y = \{B_y^C, \tilde{B}_y^{LA}\} \qquad (3.98)$$

where $B_y^C$ is the largest set of capacitive tree-branches, $\tilde{B}_y^{LA}$ is a temporary set of non-capacitive tree-branches.

Step 2: All link-branches in $B_x$ corresponding to trees in $\tilde{B}_y^{LA}$ are found. This set of link-branches is denoted as $\tilde{B}_x^{LA}$. The combined set $$\tilde{B}^{LA} = \{\tilde{B}_y^{LA}, \tilde{B}_x^{LA}\} \qquad (3.99)$$

has no capacitive branches, moreover (3.99) can form a closed graph $\hat{G}=(\hat{N}, \hat{B}^{LA})$.

The remaining link-branches become $$B_x^{LC} = B_x - \tilde{B}_x^{LA} \qquad (3.100)$$

Among the branches of $B_x^{LC}$, there may be some which are inductive. These inductive link-branches can be identified and placed into set denoted $B_x^{L1}$. After that, $B_x^{LC}$ can be re-sorted as $$B_x^{LC} = \{B_x^{L1}, B_x^C\} \qquad (3.101)$$

where $B_x^C$ includes the remaining non-inductive link-branches that may or may not be capacitive.

Step 3: The minimum spanning tree algorithm is called $$\text{MinSTA}(G, w_L) \rightarrow G_{trees} = (N, B_y^{LA}) \qquad (3.102)$$

The corresponding set of link-branches is $$B_x^{LA} = \tilde{B}^{LA} - B_y^{LA} \qquad (3.103)$$

In the set $B_x^{LA}$, all inductive branches are placed in the set of inductive link branches denoted as $B_x^{L2}$. The remaining non-inductive links are $$B_x^A = B_x^{LA} - B_x^{L2} \qquad (3.104)$$

Thereafter, the set $B_x^{LA}$ can be reordered as $$B_x^{LA} = \{B_x^A, B_x^{L2}\} \qquad (3.105)$$

Step 4: $B_x^{L2}$ is removed from the branch set $\tilde{B}^{LA}$. The remaining closed graph becomes $\hat{G}=(\hat{N}, \hat{B}^A)$. In order to accomplish this, it is necessary to identify all tree-branches in $B_y^{LA}$ that are linked by $B_x^A$. This branch set is denoted as $B_y^A$. Thereafter, $B_y^{LA}$ can be partitioned as $$B_y^{LA} = \{B_y^L, B_y^A\} \qquad (3.106)$$

where $B_y^L$ is found as usual $$B_y^L = B_y^{LA} - B_y^A \qquad (3.107)$$

It is important to note that none of the branches in $\{B_y^A, B_x^A\}$ are inductive or capacitive.

Finally, the global branch set B can be re-ordered in terms of the smaller sets. Let the order be given as follows $$B = \{B_y^C, B_y^L, B_y^A, B_x^A, B_x^{L2}, B_x^C\} \qquad (3.108)$$

The elementary networks are formed based on the branch sets as follows $$\{B_y^C, B_x^C\} \in N_C \qquad (3.109)$$

$$\{B_y^L, B_x^{L2}, B_x^{L1}\} \in N_L \qquad (3.110)$$

$$\{B_y^A B_x^A\} \in N_A \qquad (3.111)$$

Based on the branch order established in (3.108), the TCF of the node incidence matrix has the following structure $$A_{TCF} = \begin{bmatrix} I_{\tau \times \tau}^C & 0 & 0 & \hat{D}_{\tau \times t}^{CA} & \hat{D}_{\tau \times h}^{L2} & \hat{A}_{\tau \times h}^{L1} & \hat{A}_{\tau \times z}^C \\ 0 & I_{\eta \times \eta}^L & 0 & 0 & \hat{A}_{\eta \times h}^L & 0 & 0 \\ 0 & 0 & I_{\zeta \times \zeta}^A & \hat{A}_{\zeta \times t}^A & \hat{C}_{\zeta \times h}^{LA} & 0 & 0 \end{bmatrix} \qquad (3.112)$$

where blocks have dimensions corresponding to the respective branch sets in (3.108). In particular $\tau = \text{size}(B_y^C)$, as determined in (3.98)
$\eta = \text{size}(B_y^L)$, as determined in (3.107)
$\zeta = \text{size}(B_y^A)$, as determined in (3.106)
$t = \text{size}(B_x^A)$, as determined in (3.104)
$h = \text{size}(B_x^{L2})$, as determined in (3.105)
$k = \text{size}(B_x^{L1})$, as determined in (3.101)
$z = \text{size}(B_x^C)$, as determined in (3.101)

The previous procedures are the techniques for sequential identification of elementary networks. Depending on the relative order in which the networks are identified from the global graph, the sequence of steps in the procedure may differ. Similar procedures may be constructed in which the order of elementary network identification is different from the two cases considered above. However, as it is expected, the results of such procedures are topologically equivalent.

General Interconnected Networks

In the previous chapter, electrical circuits constructed of branches with components selected from one of the parameter sets (2.10)-(2.13) were considered. The topological conditions under which a circuit of a particular kind can be modeled as a single network of an appropriate type were also presented. Such differentiation was motivated on a basis of the type of equation and state variables (if any) required to describe the respective network. Furthermore, it was shown that as more freedom is allowed in terms of the circuit components and their topology, it is no longer possible to describe the entire circuit as a single type of network. Instead, for the circuits composed of branch models FIG. 4A, it was necessary to partition the global network N as $$N = N_L \cup N_A \quad (3.113)$$

In the case of circuits constructed from branch models FIG. 1.2(b), the necessary partitioning was of the form $$N = N_C \cup N_A \quad (3.114)$$

Finally, when both types of branch models FIGS. 4(a) and (b) were considered at the same time, it was shown that the circuit can be consistently described by viewing the corresponding global network as being partitioned as $$N = (N_L \cup N_{LC} \cup N_C) \cup N_A \quad (3.115)$$

Even though (3.115) comes directly from the TCF (3.48), it may also be written in simplified form as $$N = N_L \cup N_C \cup N_A \quad (3.116)$$

Several observations can also be made about the actual coupling between DEs (3.72)-(3.73). The DE (3.72) has currents as state variables, and voltages as its driving input. The states in DE (3.73) are voltages, and it is the currents that represent the external driving force. Therefore, these two state equations are said to be input-output compatible. Extending this framework, models $N_L$ and $N_C$ can be viewed as interconnected dynamical systems each of which is represented by its own state equation that are coupled through their respective inputs and outputs and, for certain topologies, through an additional interconnection term due to the AE corresponding to $N_A$.

Generic Network Identification

Sometimes it may also be useful to partition the global system into several networks based not only on branch contents but also on some other additional constraints or criteria that may come from the description of the actual system and the topological layout of its sections. The property that must be maintained in any network partitioning is the ability to automatically produce KCL and KVL matrices that can be used to describe the corresponding networks and the coupling among them.

In constructing the KCL and KVL matrices, an algorithm for assembling the TCF is needed. Previously, in order to assemble the TCF, the multi-graph $G_g = (N, B)$ was searched for a forest of spanning trees $G_{trees}{}^g = (N, B_y)$ with some particular topological properties reflected in an appropriate weight function. This very technique may be extended to accommodate other constraints in addition to those which come from branch components. For instance, it may be possible to have several, possibly pre-specified or guessed, networks. Then, a generic weight function associated with the branch set B can be defined as follows $$\text{for } \begin{matrix} j = 1 \ldots q \\ \zeta = L, C, A \\ \xi = 1 \ldots \text{size}(P_\zeta) \end{matrix} \quad \omega_\zeta^\xi(b_j) = \begin{cases} 0, & \text{if } P_\zeta\{\xi\}(j) = 0 \\ 1, & \text{if } P_\zeta\{\xi\}(j) \neq 0 \\ \pm\infty, & \text{if } b_j \notin N_\zeta^k \end{cases} \quad (3.119)$$

where $P_\zeta\{\xi\}$ is to be understood as $\xi$-th member of the corresponding parameter set $P_\zeta$ as defined in (2.10)-(2.13). If the member of $P_\zeta$ is a matrix, then by convention $P_\zeta\{\xi\}$ (j) is the j-th diagonal entry of the corresponding matrix. Similarly, when $P_\zeta\{\xi\}$ is a vector, then the notation $P_\zeta\{\xi\}$ (j) is the j-th element. The $N_\zeta^k$ is the k-th network to be identified. The $\pm$ sign in front of the infinity symbol in (3.119) is taken such that the branch $b_j \notin N_\zeta^k$ is not likely to be included in $G_{trees}{}^g = (N, B_y)$ whether the search is performed for the MinST or MaxST.

Furthermore, it is desirable to assemble separate systems of DAEs along with the corresponding coupling terms for some, possibly pre-specified sections of a larger network. Ideally, the network should be partitioned in such a way that the number of variables coupling the corresponding systems of DAEs is minimized. If such a goal is feasible and the number of state variables in each of the DEs is significantly larger than the number of coupling variables, the corresponding networks may be viewed as being weakly coupled. In terms of the topology of weakly coupled networks, it is reasonable to expect that the number of common or connecting branches is small.

Thus, a generic step of partitioning the network N into two smaller ones may be considered as $$N = N_1 \cup N_2 \quad (3.120)$$

In doing so, the columns in the node incidence matrix would also be reorganized such that the corresponding TCF would have a particular block structure needed to assemble the KCL and KVL matrices on a network-by-network basis. In this regard, two types of structures of the right hand side of TCF have been heretofore encountered: lower-block triangular as in (3.8); and upper-block triangular as in (3.29). Even though these two TCFs were computed based on different topological objectives, they are in fact equivalent. Therefore, without loss of generality, for the network partitioning (3.120), the lower-block triangular TCF may be considered. Based of such structure for the TCF, the KCL and KVL matrices would have the following form $$A_a = A_{TCF} = \begin{bmatrix} I_1 & 0 & 0 & A_1 \\ 0 & I_2 & A_2 & A_{21} \end{bmatrix} \quad (3.121)$$

$$B_b = \begin{bmatrix} 0 & -(A_2)^T & I_2 & 0 \\ -(A_1)^T & -(A_{21})^T & 0 & I_1 \end{bmatrix} \quad (3.122)$$

If the partitioning (3.120) is final, then (3.121)-(3.122) would already require a particular choice of state variables for each network. That is, if a single set of state variables is to be used to completely describe a network, it is necessary to have a KCL or a KVL (whichever is appropriate for the selected states) to include only the branches corresponding to this network. With respect to (3.120), it appears from (3.121) that it is possible to write KCL including only the branches of $N_1$. Therefore, one can select the set of branches corresponding to the block $A_1$ in (3.121) to represent states such as independent currents. Such a choice of state variables would require $N_\zeta$ to be an inductive network. Relative to network $N_2$, it is possible to write an independent KVL based on (3.122). This suggests a set of independent voltages to be the states and the network to be capacitive. If the TCF with its right-hand side being block diagonal (instead of block triangular) then the networks corresponding to these blocks would be topologically disconnected. In fact, for the multi-graph $G^g=(N, B)$, the TCF would have as many diagonal blocks as there are graphs in $G^g$.

On the other hand, if partitioning (3.120) is not final, it is possible to recursively apply similar sub-network identification procedures to either or both $N_1$ and $N_2$ each time updating the TCF. Ideally, this procedure could be continued until a final collection of elementary networks is obtained. The result of this sequential network partitioning may be symbolically expressed as $$N = N_\zeta^1 \cup N_\zeta^2 \cup \ldots \cup N_\zeta^k \cup \ldots \cup N_\zeta^n \quad (3.123)$$

The corresponding TCF can be expressed in the general lower block-triangular $$A_{TCF} = \begin{bmatrix} I_1 & & & & | & & & & A_1 \\ & I_2 & & & | & & & A_2 & A_{21} \\ & & \ddots & & | & & \iddots & \vdots & \vdots \\ & & & I_k & | & A_k & \ldots & A_{k2} & A_{k1} \\ & & & & | & \iddots & \vdots & \vdots & \vdots \\ & & & I_n & | & A_n & \ldots & A_{nk} & \ldots & A_{n2} & A_{n1} \end{bmatrix} \quad (3.124)$$

Based on the TCF (3.124), and following the usual procedure, it is possible to assemble the KCL and KVL matrices for the global network as well as for each of the networks present in (3.123). Thus, based on (3.124), the KCL matrix for the k-th network (that is, the self-KCL matrix) is defined as $$A_a^k = [I_k A_k] \quad (3.125)$$

Then, the corresponding KCL coupling matrix relating the k-th and i-th networks can be written from the k-th row of the TCF as $$A_a^{ki} = [0 A_{ki}] \quad (3.126)$$

Using definitions (3.125)-(3.126), the KCL equations for all networks in (3.123) can be expressed as $$A_a^k i_{br}^k + \sum_{i=1}^{k-1} A_a^{ki} i_{br}^i = 0, \quad \text{for } k = 1, 2, \ldots, n \quad (3.127)$$

where for k=1 the summation is defined to be zero. Furthermore, based on the structure of (3.126), it can be seen that only currents of the link branches of the other networks are needed in (3.127). Thus, defining new matrices as $$D_a^{ki} = A_{ki} \quad (3.128)$$

the KCL equations (3.127) can be rewritten as $$A_a^k i_{br}^k + \sum_{i=1}^{k-1} D_a^{ki} i_x^i = 0, \quad \text{for } k = 1, 2, \ldots, n \quad (3.129)$$

The KVL matrices are defined in a similar way. In particular, the KVL self-matrix for the k-th network is determined from (3.124) to be $$B_b^k = [-(A_k)^T I_k] \quad (3.130)$$

The KVL matrix coupling the k-th and i-th networks is assembled as $$B_b^{ki} = [-(A_{ik})^T 0] \quad (3.131)$$

Thereafter, the KVL equations relating all networks in (3.123) can be written as $$B_b^k v_{br}^k + \sum_{i=k+1}^{n} B_b^{ki} v_{br}^i = 0, \quad \text{for } k = 1, 2, \ldots, n \quad (3.132)$$

with the convention that for k=n, the summation is defined to be zero. Noting that only voltages corresponding to the tree branches of the other networks are needed in (3.132), the following definition can be made $$C_b^{ki} = -(A_{ik})^T \quad (3.133)$$

Then (3.132) can be rewritten with only the tree voltages under summation as $$B_b^k v_{br}^k + \sum_{i=k+1}^{n} C_b^{ki} v_y^i = 0, \quad \text{for } k = 1, 2, \ldots, n \quad (3.134)$$

It can also be noted that (3.128) and (3.133) are related very much like the similar matrices in (3.71).

Furthermore, based on the KCL equations (3.129) and KVL equations (3.134) it is possible to express the state equations for general interconnected networks (3.123). In order to do this it is necessary to assume that there is no mutual coupling among branches belonging to different networks. As usual, the derivation goes through the dimensionality reduction procedure applied to each network in (3.123) that has state variables. Since there are two types of such networks, namely inductive and capacitive, there are only two types of state equations involved. In particular, if for some k, the network type index is $\zeta=L$, meaning that network $N_\zeta^k$, is inductive, then the corresponding state equation is $$L_x^k \frac{di_x^k}{dt} = -\left(R_x^k + \frac{dL_x^k}{dt}\right)i_x^k - B_b^k e_{br}^k - \sum_{i=k+1}^{n} C_b^{ki} v_y^i \quad (3.135)$$

where all the reduced matrices are defined as before in terms of $B_b^k$. Of course, in order to solve all DEs for multiple inductive networks simultaneously and without additional constraints, all state equations (3.135) must be input-output compatible. That is, for all i in (3.135) for which the network type index is $\zeta=L$, it is necessary to have $B_b^{ki}=0$, implying that the external forcing voltage may come only from other non-inductive networks. If it is not possible to satisfy this condition for two or more inductive networks in (3.123), then those networks should be combined into one. Similarly if, for some k, $\zeta=C$, then network $N_\zeta^k$ is capacitive, and the corresponding state equation is $$C_y^k \frac{dv_y^k}{dt} = -\left(G_y^k + \frac{dC_y^k}{dt}\right)v_y^k + A_a^k j_{br}^k - \sum_{i=1}^{k-1} D_a^{ki} i_x^i \qquad (3.136)$$

Figure 12:
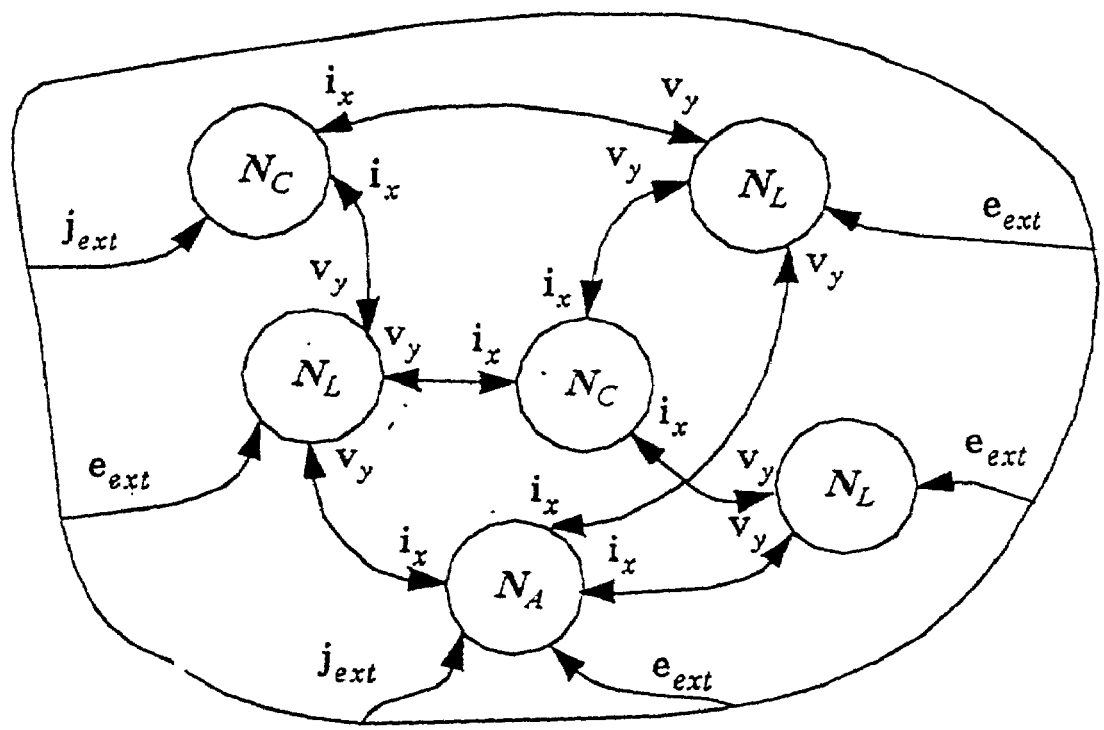
FIG. 12 is a block diagram of the interaction between subnetworks as analyzed for use with the present invention.

Here, all reduced matrices are defined in terms of $A_a^k$. Also, in order to be able to simultaneously model multiple capacitive networks without additional constraints, all state equations (3.136) must be input-output compatible. That is, all external forcing currents should come only from other non-capacitive networks, which implies that for all i in (3.135) for which $\zeta=C$, it is necessary to have $A_a^{ki}=0$. Whenever it is not possible to satisfy this condition for some capacitive networks in (3.123), then those networks should be re-combined. The relation of multiple elementary networks is symbolically depicted in FIG. 12. There, the external voltage and current sources are denoted as $e_{ext}$ and $j_{ext}$. Also, none of the inductive networks are connected with each other directly. Similarly, the capacitive networks are not coupled among each other through their branch variables. However, all networks are interconnected in such a way that each network with state variables has its proper inputs and outputs. On the other hand, algebraic networks may accommodate any inputs and outputs that are required by respective inductive and capacitive networks. Such an arrangement of networks allows all DAEs to be solved simultaneously.

The TCF (3.124) has a very general structure applicable to interconnected networks. The KCLs (3.127) and KVLs (3.132) also reflect possible coupling among all networks in (3.123) through their branch currents and voltages. If many of the networks in (3.123) are mutually de-coupled or weakly coupled, it can be expected that many of the block matrices with double subscripts in (3.124) are zero. For instance, if it is possible to make the right side of the TCF (3.124) block-bi-diagonal, the corresponding networks in (3.123) would be sequentially connected. Another useful way of formulating the relations among the networks is to have one (or maybe several) specific networks that represent all interconnections. In terms of the right side of the TCF, an attempt would be made to form a block diagonal structure as far down as possible by appropriately selecting the networks.

Selective Network Partitioning

When modeling a switched electrical network N=(G, P, S), it may be of practical interest to partition N into more than just three elementary networks $N_L$, $N_C$, and $N_A$. In general, the network partitioning may be of a more advanced form such as (3.123) where the branches may be assigned to networks based on some additional constraints. For instance, it is reasonable to establish additional constraints such that some of the networks of (3.123) remain unchanged throughout the entire simulation study. The same goal can also be pursued on the basis of elementary networks.

For convenience, it is assumed that each elementary network is partitioned into two smaller ones as $$N_\zeta = N_\zeta^1 \cup N_\zeta^2 \qquad (3.143)$$

where the running subscript is given as $\zeta=L, C, A$. The network identification in (3.143) could be performed with the objectives given in the following subsections.

Identification of Networks with Variable Parameters

Some of the branch parameters of $N_\zeta$ may depend on time as well as on applied currents and voltages. In this case, the equations corresponding to $N_\zeta$ become nonlinear with time-varying coefficients. Therefore, it is desirable to partition the network as in (3.143) such that one of the networks, say $N_\zeta^1$, takes all branches with nonlinear and/or time varying parameters. It may be necessary to include other branches in order to make $N_\zeta^1$ a proper network. After performing such network partitioning, it may become possible to assemble two systems of equations for $N_\zeta^1$ and $N_\zeta^2$, respectively, such that each of them possess smaller dimensions. Then, the equations corresponding to $N_\zeta^2$ can be assembled once per topology, and the nonlinear equations with time-varying parameters corresponding to $N_\zeta^1$ would be easier to deal with due to their reduction in size. In order to perform partitioning of $N_\zeta$ into $N_\zeta^1$ and $N_\zeta^2$ such that their interconnection can be conveniently handled using dimensionality reduction procedures, it is necessary only to assign appropriate weights to the network branches as in (3.119).

Identification of Switched Networks

For large switched electrical networks, the automated procedure of equation generation becomes quite expensive. As a result of this computational expense, the models of systems with fast switching, such as models that include PWM, hysteresis current inverters, converters, etc., tend to require significantly longer CPU time to run the simulation. However, for a given network N=(G, P, S), it is likely that not all of its structural sections participate in the switching transients throughout the history of topological changes. One might, therefore, attempt to identify system sections with constant topology and group them into separate networks. This idea can also be applied to each elementary network of N. Therefore, with respect to (3.143), an elementary network $N_{70}$ can be partitioned such that either $N_\zeta^1$ or $N_\zeta^2$ possess a system of equations that need not be reassembled for each new topology. Thereafter, an attempt is made to exclude all such networks from the equation assembling procedures that are performed at each switching instance. Separating the global network N into its switching and non-switching parts would not only reduce the total amount of computations required per change in topology, but also provide a means for the local averaging of state equations for the switched subnetwork as is known in the art.

Network Partitioning for Stability Estimation

The structure of the DAEs produced by ASMG may also be utilized for the non-impedance-based stability analysis of energy conversion systems represented by their equivalent circuits. That is, instead of relying on the linearization of the state equations and using Nyquist-type criteria, it is possible to generate the DAEs in a form suitable for the Lyapunov analysis. For instance, if needed, a change of variables could be used to rewrite the state equations in the following autonomous form.

$$\frac{dx_L}{dt} = f_L(x_L) + g_L(x_L, x_C) \qquad (3.144)$$

where $g_L(x_L, x_C)$ and $g_C(x_L, x_C)$ are the interconnection terms that also include the algebraic network. The stability of (3.144)-(3.145) can be analyzed as similar to a problem of perturbed motion and studied using Lyapunov functions. However, for this technique, it is necessary to establish Lyapunov functions for each system in (3.144)-(3.145) ignoring the interconnections to begin with.

Alternatively, since it may be feasible to assemble a separate state equation for the part of the network N which is time invariant and linear, it may be advantageous to formulate the problem of stability analysis into a robust control framework. For instance, if it is possible to collect all nonlinear elements into a separate algebraic network with no current and/or voltage sources, then the terms that are due to $N_A$ can be viewed as a perturbation to the rest of the system.

The underlying power of the robust control framework is that it not only enables analysis of the stability of nonlinear systems in certain regions of the state space (attractors, invariant subspaces, etc.) but it also makes possible the design of controllers that ensure some desirable properties. In particular, considering quadratic Lyapunov functions, many analysis and design control problems associated with the model of N can be formulated as linear matrix inequalities (LMIs) that can be solved numerically. In this regard, it can be very advantageous to automatically assemble state and output equations for the global network N directly in a form permitting a linear differential inclusion (LDI) of a particular type.

Realization of the Global Network

In this section, a global network N=(G, P) with augmented topology is considered further. As shown in the previous chapter, a network of this kind, in general, possesses an interconnection of the form $N=N_L \cup N_C \cup N_A$. Such a network representation allows the corresponding systems of DAEs (3.72)-(3.75) to be assembled in a consistent manner for each elementary network with respective interconnections. For compactness, (3.72)-(3.75) can be written as $$\frac{dx_{LC}}{dt} = f(x_{LC}, y_{iv}^A, u_{ej}, t) \tag{4.1}$$

$$g(x_{LC}, y_{iu}^A, u_{ej}, t)=0 \tag{4.2}$$

where the global state vector $x_{LC}=[x_L, x_c]$ consists of minimal state vectors corresponding to the inductive and capacitive networks, $y_{iv}^A=[i_{br}^A, v_{br}^A]$ is a vector of branch currents and voltages corresponding to the algebraic network, and $u_{ej}=[e_{br}, j_{br}]$ is an input vector that is composed of input voltage and current sources.

System (4.1) is a first-order system of ODEs, whereas (4.2) is a system of AEs. The AE (4.2) has the form (3.23), (3.25), (3.39), (3.41) and (3.74)-(3.75). If the elements of $N_A$ are some known, possibly nonlinear functions of applied currents and voltages, then (4.2) may not have a unique solution. In general, (4.2) may be solved using iterative methods for solving systems of nonlinear equations.

Global Network with Linear Parameters

Here, it is assumed that the network parameters are possibly time-varying, but do not depend on branch currents or voltages. Then, assuming that (3.75) is well-posed, the linear AE (4.2) always has a unique solution. Moreover, it is possible to solve (4.2) explicitly for the $y_{iv}^A$. After doing so, (4.1) and (4.2) can be merged into one system of first order ODEs. Thereafter, a system of DAEs describing the global network N can be mapped into a state space realization in its standard form $$\frac{dx_{LC}}{dt} = A(t)x_{LC} + B(t)u_{ej} \tag{4.3}$$

$$y_{iu}=C(t)x_{LC}+D(t)u_{ej} \tag{4.4}$$

where the output vector is defined as $y_{iv}=[i_{br}, v_{br}]$.

Before the state equations (3.72)-(3.73) can actually be written in the form of (4.3), some work with AEs (3.74)-(3.75) is needed. For simplicity of derivation, it is assumed that the state variables for the $N_L$ and $N_C$ are chosen to be independent currents and voltage as defined in (3.63) and (3.64), respectively. Then, defining matrix $M_A$ as $$M_A = \begin{bmatrix} \hat{A}_a^A \\ \hat{B}_b^A \hat{R}_{br}^A \end{bmatrix} \tag{4.5}$$

which is assumed to have full rank, (3.75) can be rewritten as $$\hat{i}_{br}^A = M_A^{-1} \begin{bmatrix} -C^{LA} \\ 0 \end{bmatrix} i_x + M_A^{-1} \begin{bmatrix} 0 \\ -D^{CA} \end{bmatrix} v_y + \tag{4.6}$$

$$M_A^{-1} \begin{bmatrix} 0 \\ -\hat{B}_b^A \end{bmatrix} \hat{e}_{br}^A + M_A^{-1} \begin{bmatrix} 0 \\ -\hat{B}_b^A \hat{R}_{br}^A \end{bmatrix} \hat{j}_{br}^A$$

$$= D_I^A i_x + D_V^A v_y + D_e^A \hat{e}_{br}^A + D_J^A \hat{j}_{br}^A$$

The expression for the branch voltages (3.74) for $N_A$ can be rewritten as $$\hat{v}_{br}^A = \hat{R}_{br}^A M_A^{-1} \begin{bmatrix} -C^{LA} \\ 0 \end{bmatrix} i_x + \hat{R}_{br}^A M_A^{-1} \begin{bmatrix} 0 \\ -D^{CA} \end{bmatrix} v_y + \tag{4.7}$$

$$\left(I + \hat{R}_{br}^A M_A^{-1} \begin{bmatrix} 0 \\ -\hat{B}_b^A \end{bmatrix}\right) \hat{e}_{br}^A + \hat{R}_{br}^A \left(I + M_A^{-1} \begin{bmatrix} 0 \\ -\hat{B}_b^A \hat{R}_{br}^A \end{bmatrix}\right) \hat{j}_{br}^A =$$

$$C_I^A i_x + C_V^A v_y + C_e^A \hat{e}_{br}^A + C_J^A \hat{j}_{br}^A$$

Substituting (4.6) into (3.72), and (4.7) into (3.73), and collecting terms, the state equations for $N_L$ and $N_C$ become $$\frac{di_x}{dt} = -L_x^{-1}\left(R_x + \frac{dL_x}{dt} + C_b^{LA} C_I^A\right) i_x - L_x^{-1}(C^{LC} + C_b^{LA} C_V^A) v_y - \tag{4.8}$$

$$L_x^{-1}(B_b^L + C_b^{LA} C_e^A) e_{br}^{LA} - L_x^{-1} C_b^{LA} C_J^A j_{br}^A =$$

$$A_L^{LA} i_x + A_L^A v_y + B_L^{LA} e_{br}^{LA} + B_L^A j_{br}^A$$

$$\frac{dv_y}{dt} = -C_y^{-1}\left(G_y + \frac{dC_y}{dt} - D_a^{CA} D_V^A\right) v_y - C_y^{-1}(D^{LC} + D_a^{CA} D_I^A) i_x + \tag{4.9}$$

$$C_y^{-1}(A_a^C + D_a^{CA} D_J^A) j_{br}^{CA} - C_y^{-1} D_a^{CA} D_e^A e_{br}^A =$$

$$A_C^{CA} v_y + A_C^{LA} i_x + B_C^{CA} j_{br}^A + B_C^A e_{br}^A$$

Finally (4.8) and (4.9) can be assembled to form a state equation in its standard form $$\frac{d}{dt}\begin{bmatrix} i_x \\ v_y \end{bmatrix} = \begin{bmatrix} A_L^{LA} & A_L^{CA} \\ A_C^{LA} & A_C^{CA} \end{bmatrix}\begin{bmatrix} i_x \\ v_y \end{bmatrix} + \begin{bmatrix} B_L^{LA} & B_L^{A} \\ B_C^{A} & B_C^{CA} \end{bmatrix}\begin{bmatrix} e_{br} \\ j_{br} \end{bmatrix} \quad (4.10)$$

The stage is set for assembling (4.4). Expressions (4.6) and (4.7) already provide currents and voltages for the branches of $N_A$. Thus, it is necessary to express currents and voltages for the branches of the two remaining networks, $N_L$ and $N_C$. Starting with $N_L$, a vector of corresponding branch currents is determined from independent currents as $$i_{br}^L = (B_b^L)^T i_x \quad (4.11)$$

A vector of branch voltages for the $N_L$ can be written as $$v_{br}^L = R_{br} i_{br}^L + L_{br}\frac{d i_{br}^L}{dt} + \frac{dL_{br}}{dt} i_{br}^L + e_{br}^L = \quad (4.12)$$

$$\left(R_{br} + \frac{dL_{br}}{dt}\right) i_{br}^L + L_{br}\frac{d i_{br}^L}{dt} + e_{br}^L$$

Substituting (4.11) into (4.12), an expression for branch voltages in terms of independent currents can be obtain as $$v_{br}^L = \left(R_{br} + \frac{dL_{br}}{dt}\right)(B_b^L)^T i_x + L_{br}(B_b^L)^T \frac{d i_x}{dt} + e_{br}^L \quad (4.13)$$

After substituting state equation (4.8) into (4.13) and collecting terms, the final expression for branch voltages becomes $$v_{br}^L = \left(\left(R_{br} + \frac{dL_{br}}{dt}\right)(B_b^L)^T - L_{br}(B_b^L)^T L_x^{-1}\left(R_x + \frac{dL_x}{dt} + C_b^{LA} C_I^A\right)\right) i_x - \quad (4.14)$$

$$\left(L_{br}(B_b^L)^T L_x^{-1}(C^{LC} + C_b^{LA} C_V^A)\right) v_y -$$

$$\left(L_{br}(B_b^L)^T L_x^{-1}(B_b^L + C_b^{LA} C_e^A) - I^L\right) e_{br}^{LA} -$$

$$\left(L_{br}(B_b^L)^T L_x^{-1} C_b^{LA} + C_j^A\right) j_{br}^A = C_L^{LA} i_x + C_L^{CA} v_y + D_L^{LA} e_{br} + D_L^A j_{br}$$

where $I^L$ is an identity-like matrix with ones in diagonal entries corresponding to branches in $N_L$ and zeros elsewhere.

The equations for a capacitive network are assembled in a similar way. That is, recalling (3.64), a vector of corresponding branch voltages is determined as $$v_{br}^C = (A_a^C)^T v_y \quad (4.15)$$

A vector of branch currents for the $N_C$ can be found as $$i_{br}^C = \left(G_{br} + \frac{dC_{br}}{dt}\right) v_{br}^C + C_{br}\frac{dv_{br}^C}{dt} - j_{br}^C \quad (4.16)$$

Combining (4.15) and (4.16) yield $$i_{br}^C = \left(G_{br} + \frac{dC_{br}}{dt}\right)(A_a^C)^T v_y + C_{br}(A_a^C)^T \frac{dv_y}{dt} - j_{br}^C \quad (4.17)$$

Similar to (4.14), (4.9) can be substituted for the state derivative in (4.17). Collecting corresponding terms, the following result is obtained $$i_{br}^C = \quad (4.18)$$

$$\left(\left(G_{br} + \frac{dC_{br}}{dt}\right)(A_a^C)^T - C_{br}(A_a^C)^T C_y^{-1}\left(G_y + \frac{dC_y}{dt} - D_a^{CA} D_V^A\right)\right) v_y +$$

$$\left(C_{br}(A_a^C)^T C_y^{-1}(D^{LC} + D_a^{CA} D_I^A)\right) i_x +$$

$$\left(C_{br}(A_a^C)^T C_y^{-1}(A_a^C + D_a^{CA} D_j^A) - I^C\right) j_{br}^{CA} +$$

$$\left(C_{br}(A_a^C)^T C_y^{-1} D_a^{CA} + D_e^A\right) e_{br}^A =$$

$$C_C^{CA} v_y + C_C^{LA} i_x + D_C^{CA} j_{br}^{CA} + D_C^A e_{br}^A$$

where $I^C$ is also an identity-like matrix with ones in diagonal entries corresponding to branches in $N_C$ and zeros elsewhere.

Assuming that vectors of currents and voltages for all branches of the global network N can be assembled (concatenated) from the corresponding currents and voltages of $N_L$, $N_C$, and $N_A$ as $$i_{br} = i_{br}^L + i_{br}^C + i_{br}^A \quad (4.19)$$

$$v_{br} = v_{br}^L + v_{br}^C + v_{br}^A \quad (4.20)$$

the expressions (4.14) and (4.18) are put together to form (4.4) which becomes $$\begin{bmatrix} i_{br} \\ v_{br} \end{bmatrix} = \begin{bmatrix} (B_b^L)^T + C_C^{LA} + D_I^A & C_C^{CA} + D_V^A \\ C_C^{LA} + C_I^A & (A_a^C)^T + C_L^{CA} + C_V^A \end{bmatrix}\begin{bmatrix} i_x \\ v_y \end{bmatrix} + \quad (4.21)$$

$$\begin{bmatrix} D_C^A + D_e^A + D_C^{CA} + D_j^A \\ D_L^{LA} + C_e^A + D_L^A + D_j^A \end{bmatrix}\begin{bmatrix} e_{br} \\ j_{br} \end{bmatrix}$$

Thus, (4.10) and (4.21) form an automatically assembled minimal realization for the global network N.

Global Network with Nonlinear Parameters

Heretofore, only networks with linear time-varying parameters were considered. Electrical networks with such parameters are linear in the sense that it is possible to apply superposition with respect to state variables. Such networks can be successfully modeled using topological algorithms and dimensionality reduction procedures and that, if needed, the resulting system of DAEs can be mapped into a standard form state space realization. In general, network parameters may not only depend on time but also be some functions of state variables such as inductor currents and fluxes, and capacitor voltages and charges. For instance, a branch resistance may depend on the current flowing through or the voltage applied to the branch. Also, if nonlinear magnetic properties are to be included in the model, the corresponding branch inductances become state dependent. This phenomena is caused by the saturation of the magnetic materials used in inductors. In modeling semiconductor power electronic devices, the effective capacitance of the junction may also depend on voltage or current depending upon the type of device considered. Therefore, it should be considered that $$R_{br} = R_{br}(t, x_L) \quad (4.22)$$

$$G_{br} = G_{br}(t, x_C) \quad (4.23)$$

$$L_{br} = L_{br}(t, x_L) \quad (4.24)$$

$$C_{br} = C_{br}(t, x_C) \quad (4.25)$$

As before, a system of DAEs for each elementary network and their interconnection will be derived ignoring inactive branches for the sake of convenience. First, the system of AEs (3.75) for the network $N_A$ is rewritten as $$\begin{bmatrix} \hat{A}_a^A \\ \hat{B}_b^A \hat{R}_{br}^A \end{bmatrix} \hat{i}_{br}^A - \begin{bmatrix} -C^{LA} & 0 \\ 0 & -D^{CA} \end{bmatrix} \begin{bmatrix} i_x \\ v_y \end{bmatrix} - \begin{bmatrix} 0 & 0 \\ -\hat{B}_b^A & -\hat{B}_b^A \hat{R}_{br}^A \end{bmatrix} \begin{bmatrix} \hat{e}_{br}^A \\ \hat{j}_{br}^A \end{bmatrix} = 0 \quad (4.26)$$

which is a system of nonlinear equations that can be solved iteratively for $\hat{i}_{br}^A$. After doing so, the vector of corresponding branch voltages, $\hat{v}_{br}^A$ is computed using (3.74).

To assemble DAEs for the inductive network, the voltage equation for branches of this network may be expressed in its most general form $$v_{br}^L = R_{br}^L i_{br}^L + \frac{d\lambda_{br}}{dt} + e_{br}^L \quad (4.27)$$

Taking into account other networks KVL (3.70) can be written as $$B_b^L v_{br}^L + \sum^{CA} = 0 \quad (4.28)$$

where the symbol $\Sigma^{CA}$ represents all terms that are due to interconnection of $N_L$ with capacitive and algebraic networks.

Working with nonlinear inductances, (4.24) represents an inconvenience in that it becomes necessary to compute the total time derivative of the matrix $L_x$ which, in turn, contains partial derivatives of $L_x$ with respect to the vector $i_x$. A partial derivative of a matrix with respect to vector is a "large" and cumbersome object. However, the nonlinear relationship between fluxes and currents must be incorporated into the system of DAEs for the network $N_L$. Therefore, instead of (4.24), the relationship between fluxes and currents can be modeled using a saturation function that would "penalize" the flux linkages at high currents. Using this technique of representing magnetic saturation, the branch fluxes are expressed as $$\lambda_{br} = L_{br} i_{br}^L - \phi_{br}(i_{br}^L) \quad (4.29)$$

where $\phi_{br}$, is a vector-valued saturation function. From this point, (4.29) is substituted into (4.27) and the dimensionality reduction procedure using KVL (4.28) is applied to the resulting voltage equation. In doing so, the vector of independent fluxes is found as follows $$\lambda_x = L_x i_x - B_b^L \phi_{br}[(B_b^L)^T i_x] = L_x i_x - \phi_x(i_x) \quad (4.30)$$

where, by analogy to all other reduced quantities, $\phi_x(i_x)$ is the reduced saturation function.

A direct result of the dimensionality reduction procedure is a state equation with independent fluxes as state variables. For consistency, this equation is written as $$\frac{d\lambda_x}{dt} = -R_x i_x - B_b^L e_{br}^L - \sum^{CA} \quad (4.31)$$

Equations (4.30)-(4.31) form a system of DAEs for the network $N_L$. Here, it is necessary to solve the nonlinear AE (4.30) for $i_x$ at each integration step, or more precisely, at each call to the derivative function (4.31). In general, iterative methods would be used for solving (4.30) for the vector of currents. For small integration steps, Newton's method with an initial guess taken as $i_x$ from the previous integration step could yield fast convergence. It may also be possible to re-parameterize the saturation function $\phi_x(i_x)$ into $\phi'_x(\lambda_x)$. If this is achieved, then (4.30) would become $$L_x i_x = \lambda_x + \phi'_x(\lambda_x) \quad (4.32)$$

which is a linear equation with respect to $i_x$.

Instead of re-parameterization of the saturation function $\phi_x(i_x)$, $i_x$ can be chosen to be the state vector in order to avoid having to solve a system of nonlinear equations. Using the chain rule, the time derivative of fluxes in (4.30) can be expressed as $$\frac{d\lambda_x}{dt} = \frac{\partial \lambda_x}{\partial i_x} \frac{di_x}{dt} + \frac{\partial \lambda_x}{\partial t} = \left(L_x - \frac{\partial \varphi_x}{\partial i_x}\right) \frac{di_x}{dt} + \frac{\partial L_x}{\partial t} i_x \quad (4.33)$$

Combining (4.30) and (4.33), the state equation for the network $N_L$ with currents as the state variables can be written in implicit form as $$\left(L_x - \frac{\partial \varphi_x}{\partial i_x}\right) \frac{di_x}{dt} = -\left(R_x + \frac{\partial L_x}{\partial t}\right) i_x - B_b^L e_{br}^L - \sum^{CA} \quad (4.34)$$

The vector of branch currents is computed as usual using (4.11), and (4.28) can be used to compute branch voltages. Applying the chain rule to (4.30) and utilizing (4.11), the derivative of branch fluxes can be expressed as $$\frac{d\lambda_{br}}{dt} = \left(L_{br} - \frac{\partial \varphi_{br}}{\partial i_{br}}\right)(B_b^L)^T \left(\frac{di_x}{dt}\right) + \frac{\partial L_{br}}{\partial t}(B_b^L)^T i_x \quad (4.35)$$

Combining (4.28) and (4.35), the output equation becomes $$v_{br}^L = \left(L_{br} - \frac{\partial \varphi_{br}}{\partial i_{br}}\right)(B_b^L)^T \left(\frac{di_x}{dt}\right) + \left(R_{br}^L + \frac{\partial L_{br}}{\partial t}\right)(B_b^L)^T i_x + e_{br}^L \quad (4.36)$$

In (4.36), there is a term proportional to the derivative of the state vector. If (4.35) can be expressed in explicit form, it could be substituted into (4.36). However, since the derivative of the state vector is computed anyway, this term can be present in (4.36) without any computational disadvantage.

A similar system of DAEs can also be assembled for capacitive networks. The current equation for branches of $N_C$ is $$i_{br}^C = G_{br}^C v_{br}^C + \frac{dq_{br}}{dt} - j_{br}^C \qquad (4.37)$$

and KCL (3.67) can be written here as $$A_a^C i_{br}^C + \Sigma^{LA} = 0 \qquad (4.38)$$

For the capacitive network, the nonlinear relation between capacitor charges and voltages can be represented in a form similar to magnetic saturation. That is $$q_{br} = C_{br} v_{br}^C - \phi_{br}(v_{br}^C) \qquad (4.39)$$

where $\phi_{br}$ is also a vector-valued function representing a part of capacitance that depends on the voltage. Using the dimensionality reduction procedure with (4.15) and (4.38), a vector of independent charges can be found as $$q_y = C_y v_y - A_a^C \phi_{br}((A_a^C)^T v_y) = C_y v_y - \phi_y(v_y) \qquad (4.40)$$

Using the chain rule and (4.15), the derivatives of (4.39)-(4.40) with respect to time are found as $$\frac{dq_{br}}{dt} = \left(C_{br} - \frac{\partial \phi_{br}}{\partial v_{br}}\right)(A_a^C)^T\left(\frac{dv_y}{dt}\right) + \frac{\partial C_{br}}{\partial t}(A_a^C)^T v_y \qquad (4.41)$$

$$\frac{dq_y}{dt} = \left(C_y - \frac{\partial \phi_y}{\partial v_y}\right)\frac{dv_y}{dt} + \frac{\partial C_y}{\partial t} v_y \qquad (4.42)$$

Finally, following the procedure, the state equation for $N_C$ can also be obtained in implicit form as $$\left(C_y - \frac{\partial \phi_y}{\partial v_y}\right)\frac{dv_y}{dt} = -\left(C_y + \frac{\partial C_y}{\partial t}\right)v_y + A_a^C j_{br}^C - \sum^{LA} \qquad (4.43)$$

The vector of branch currents is computed based on (4.37) and (4.41) as $$i_{br}^C = \left(C_{br} - \frac{\partial \phi_{br}}{\partial v_{br}}\right)(A_a^C)^T\left(\frac{dv_y}{dt}\right) + \left(G_{br}^C + \frac{\partial C_{br}}{\partial t}\right)(A_a^C)^T v_y - j_{br}^C \qquad (4.44)$$

The equations developed thus far can be written more compactly. For the algebraic network, (4.26) and (3.74) have the following form $$f_A(i_{br}^A, i_x, v_y, \hat{e}_{br}^A, j_{br}^A, t) = 0 \qquad (4.45)$$

$$\hat{v}_{br}^A = q_A(i_{br}^A, i_x, v_y, \hat{e}_{br}^A, j^A, t) \qquad (4.46)$$

The two state equations (4.34) and (4.43) are rewritten as $$M_L(t)\frac{di_x}{dt} = f_L(i_x, v_y, v_{br}^A, e_{br}^L, t) \qquad (4.47)$$

$$M_C(t)\frac{dv_x}{dt} = f_C(i_x, v_y, j_{br}^A, j_{br}^C, t) \qquad (4.48)$$

where $M_L(t)$ and $M_C(t)$ are so-called mass matrices that can dependent on time and state.

Combined, (4.11) and (4.38) are written compactly as $$y_{br}^L = g_L\left(\frac{di_x}{dt}, i_x, e_{br}^L, t\right) \qquad (4.49)$$

Similarly, (4.44) together with (4.15) are expressed as $$y_{br}^C = g_C\left(\frac{dv_y}{dt}, v_y, j_{br}^C, t\right) \qquad (4.50)$$

where $y_{br}^L = [i_{br}^L, v_{br}^L]$ and $y_{br}^C = [i_{br}^C, v_{br}^C]$ are the output vectors.

Equations (4.45)-(4.50) form a system of DAEs which describe the global network N. Here, (4.45) is a system of nonlinear equations that could be solved numerically. Then, (4.46) and (4.49)-(4.50) are explicit systems of AEs that are not expensive to evaluate. The implicit systems of DEs (4.47)-(4.48) may be solved for the respective derivatives using some efficient techniques developed for systems of linear equations. In such arrangements, a linear solver would be called at each call to the corresponding derivative function. Alternatively, there are efficient numerical techniques that have been designed to accommodate time dependent mass matrices.

Switched Electrical Networks

A network of a general kind was previously defined as $N=(G, P, s)$, where s is some given topology. If N is a switched network, the vector s is different for each new topology. In order for the constructed model to be meaningful, N should be a finite electrical network for each encountered topology. Throughout the simulation process, the network N may switch sequentially from an initial topology $s_0$ to the final topology $s_m$, say as $$s_0, s_1, \ldots, s_i, \ldots, s_j, \ldots, s_m \qquad (5.1)$$

Based on this sequence, a so-called topology matrix can be formed as $$S = [s_0, s_1, \ldots, s_i, \ldots, s_j, \ldots, s_m] \qquad (5.2)$$

For each distinct topology of (5.1), there is a minimal realization for the inductive and capacitive networks present in N. In general, these minimal realizations may have a different number of states for each topology. That is, for a given topology $s_i$ of the sequence (5.1), the state vectors of $N_L$ and $N_C$ belong to some appropriate vector spaces given topology $s_i$ of the sequence (5.1), the state vectors of $N_L$ and $N_C$ belong to some appropriate vector spaces $$x_L^i \in \Re^{\alpha_i} \qquad (5.4)$$

$$x_C^i \in \Re^{\beta_i} \qquad (5.4)$$

where the dimensions of the minimal state vectors for the networks $N_L$ and $N_C$ are denoted with respect to (5.1) as $$\alpha_0, \alpha_1, \ldots, \alpha_i, \ldots, \alpha_j, \ldots, \alpha_m \qquad (5.5)$$

$$\beta_0, \beta_1, \ldots, \beta_i, \ldots, \beta_j, \ldots, \beta_m \qquad (5.6)$$

respectively.

It is also expected that in the topological sequence (5.1), there exists an $s_i$ and $s_j$ in which the number of state variables is maximum for the realizations of $N_L$ and $N_C$, respectively. Of course, there may be several distinct topologies that require the same maximum number of states for their respective realizations. Assuming that it is always possible to obtain a non-minimal realization of a desired size by including some redundant states, it is possible to define the maximum numbers of state variables required to implement networks $N_L$ and $N_C$ as $$\alpha = \max\{\alpha_0, \alpha_1, \ldots, \alpha_i, \ldots, \alpha_j, \ldots, \alpha_m\} \quad (5.8)$$

$$\beta = \max\{\beta_0, \beta_1, \ldots, \beta_i, \ldots, \beta_j, \ldots, \beta_m\} \quad (5.8)$$

respectively.

Furthermore, since for each single topology si the network $N=(G, P, s_i)$ must be finite, the same is required for the switched network $N=(G, P, S)$. Symbolically this requirement can be rewritten as $$N=(G, P, S) \in N_q^{\alpha+\beta} \quad (5.9)$$

where $\alpha$ and $\beta$ are defined in (5.7) and (5.8), and $\alpha+\beta \leq q$. Sometimes $\alpha$ and $\beta$ are referred to as the network complexity. Also, since S is a topology matrix, $N=(G, P, S)$ is equivalent to a family of networks.

The sequence (5.1) may contain repeated topologies, and the actual number of distinct topologies may be small relative to the length m of the complete sequence of topologies throughout the entire simulation history. In this case, a reduced topology matrix that includes only the distinct topological vectors may be defined. Without loss of generality, it can be assumed that in the sequence $s_0, s_1, \ldots, s_i, \ldots s_j, \ldots s_r, \ldots$, for some $r \leq m$, the first $r+1$ vectors are distinct. Thereafter, a reduced topology matrix is defined as $$S_r = [s_0, s_1, \ldots, s_r] \quad (5.10)$$

With respect to the network N, it is possible to say that $S_r$ spans all encountered allowable topologies.

Calculation of Initial Conditions After Switching Event

Here, the two types of switched networks, namely inductive and capacitive are considered. For this case, it is required that the currents through inductive branches and the voltages across capacitive branches are continuous as the network undergoes topological changes. Then, the continuity conditions for inductive and capacitive networks can be written as $$i_i^L = i_{i+1}^L = i_{br}^L, \text{ and } \|i_{br}^L\|_\infty < \infty \quad (5.11)$$

$$v_i^C = v_{i+1}^C = v_{br}^C, \text{ and } \|v_{br}^C\|_\infty < \infty \quad (5.12)$$

In other words, the vectors (or more precisely trajectories) $i_{br}^L$ and $v_{br}^C$ must be bounded and continuous across topological boundaries. Recalling how $i_{br}^L$ and $v_{br}^C$ are related to the vectors of independent inductor currents and capacitor voltages, (5.11)-(5.12) can also be rewritten as $$(B_i^L)^T i_x^i = (B_{i+1}^L)^T i_x^{i+1} = i_{br}^L \quad (5.13)$$

$$(A_i^C)^T v_i^y = (A_{i+1}^C)^T v_y^{i+1} = v_{br}^C \quad (5.14)$$

The KVL and KCL matrices corresponding to the second topology $s_{i+1}$ can also be expressed in terms of the branch order in the respective TCF as $$B_{i+1}^L = [-(\hat{A}_{i+1}^L)^T I_{i+1}^L 0](T_L^{i+1})^T \quad (5.15)$$

$$A_{i+1}^L = [I_{i+1}^C \hat{A}_{i+1}^L 0](T_C^{i+1})^T \quad (5.16)$$

where $T_L^{i+1}$ and $T_C^{i+1}$ are appropriate permutation matrices. Based on the structure of (5.15)-(5.16), it is possible to define the following right pseudo inverses $$(B_{i+1}^L)^+ = T_L^{i+1}[0 I_{i+1}^L 0]^T = (B_{i+1}^{base})^T \quad (5.17)$$

$$(A_{i+1}^L)^+ = T_C^{i+1}[I_{i+1}^C 0\ 0]^T = (A_{i+1}^{base})^T \quad (5.18)$$

It can be noted that $B_{i+1}^{base}$ and $A_{i+1}^{base}$ are full-rank matrices containing only columns that make the basis in either case. Therefore, (5.17)-(5.18) can be used to compute the corresponding initial conditions for the new topology. In particular, the initial values of the independent currents and voltages for the topology $S_{i+1}$ can be computed as $$i_x^{i+1} = B_{i+1}^{base} i_i^L \quad (5.19)$$

$$v_y^{i+1} = A_{i+1}^{base} v_i^C \quad (5.20)$$

That is, based on branch currents and voltages just before commutation, it is possible to compute initial values for the state variables for the next topology such that the usual continuity conditions are satisfied.

In the present embodiment, the values in the system are constrained to represent finite currents and voltages. Thus, in resistive networks, $$\|i_i^A\|_\infty < \infty, \text{ and } \|i_{i+1}^A\|_\infty < \infty \quad (5.24)$$

$$\|v_i^A\|_\infty < \infty, \text{ and } \|v_{i+1}^A\|_\infty < \infty \quad (5.25)$$

In networks with state variables, this constraint may be expressed as $$i_i^L = i_{i+1}^L = i_{br}^L, \text{ and } \|i_{br}^L\|_\infty < \infty \quad (5.26)$$

$$v_i^C = v_{i+1}^C = v_{br}^C, \text{ and } \|v_{br}^C\|_\infty < \infty \quad (5.27)$$

Non-Minimal Realization

Thus far, all state equations for the networks $N_L$ and $N_C$ were assembled algorithmically based on topological conditions using the minimal number of state variables required to represent the dynamics of each network. That is, for each individual topology, the system of DAEs constitutes a minimal state-space realization. Since the topology of $N=(G, P, S)$ is changing, it is reasonable to expect that the dimensions of the minimal state vectors may also change. In general, the size of the minimal realization for each network $N_L$ or $N_C$ may vary significantly throughout the sequence of topologies $s_0, s_1, \ldots, s_i, \ldots, s_m$. On the other hand, for analytical and/or numerical reasons, it may be convenient to have matrices and vectors that do not change their sizes dynamically from one topology to the next. For this reason, in a computer implementation of the ASMG, matrices $A_a^C$ and $B^{iL}$ can be defined so that the dimensions do not change throughout the entire simulation of $N=(G, P, S)$. Whenever needed, the appropriate number of zero rows can be appended to the bottom in order to maintain the same matrix size. That is, $A_a^C$, and $B_b^L$ can be modified as $$\tilde{A}_a^C = \begin{bmatrix} A_a^C \\ 0 \end{bmatrix} \quad (5.36)$$

$$\tilde{B}_b^L = \begin{bmatrix} B_b^L \\ 0 \end{bmatrix} \quad (5.37)$$

The total number of rows for $A_a^C$ and for $B_b^L$ is then determined by the maximum number of state variables (5.7)-(5.8) needed to represent networks $N_L$ and $N_C$ for any topology in the sequence $s_0, s_1, \ldots, s_i, \ldots, s_m$. Furthermore, $\tilde{A}_a^C$ and for $\tilde{B}_b^L$ using in the dimensionality reduction procedures for $N_L$ and $N_C$, respectively, the reduced matrices $L_x$ and $C_y$ will be block-diagonal, with full-rank upper-left blocks and zeros elsewhere. Therefore, having such a structure, these matrices are also block-invertible. Moreover, the same block-diagonal structure is preserved under any non-singular coordinate transformation applied to the state variables in (2.106) or (2.111).

Besides having the same state-space dimensions for all encountered topologies, it is also possible to make some specific state variables redundant. For a network $N_\zeta$ with state variables and constant parameters, a minimal state-space realization can be assembled in its standard form $$\frac{dx_\zeta}{dt} = A_\zeta x_\zeta + B_\zeta u \qquad (5.38)$$
$$y_{iv} = C_\zeta x_\zeta + D_\zeta u$$

where $\zeta = L, C$, meaning that the network $N_\zeta$ may be inductive or capacitive.

A coordinate transformation matrix can be defined as $$K_\zeta = \begin{bmatrix} I \\ M \end{bmatrix} \qquad (5.39)$$

and the new vector of state variables as $$\tilde{x}_\zeta = K_\zeta x_\zeta \qquad (5.40)$$

where $M$ can be any real matrix of appropriate dimensions. Note that $Mx_\zeta$ is an additional vector of redundant states. That is, any element of this vector is nothing more than some linear combination of the state variables in $x_\zeta$. Then, defining the right pseudo inverse of $K_\zeta$ to be of the form $$K_\zeta^\dagger = [I\ 0] \qquad (5.41)$$

(5.38) can be rewritten in terms of the new states as $$\frac{d\tilde{x}_\zeta}{dt} = K_\zeta A_\zeta K_\zeta^\dagger \tilde{x}_\zeta + K_\zeta B_\zeta u = \tilde{A}_\zeta \tilde{x}_\zeta + \tilde{B}_\zeta u \qquad (5.42)$$
$$y_{iv} = C_\zeta K_\zeta^\dagger \tilde{x}_\zeta + D_\zeta u = \tilde{C}_\zeta \tilde{x}_\zeta + \tilde{D}_\zeta u$$

This transformation of variables can be carried through it, instead of (5.38), the more general system of DAEs (4.10), (4.21), and (4.45)-(4.50) is considered.

Minimal Common Realization

Herein, a switched electrical network $N=(G, P, S) \in N_q^{\alpha+\beta}$ with the sequence of topologies given in (5.1) is considered. It is assumed that $N$ is switching between two distinct generic topologies, $s_i$ and $s_{i+1}$. As usual, for any single topology $s$, the global network $N=(G, P, s)$ possesses an interconnection of elementary networks of the form $N = N_L \cup N_C \cup N_A$. If inactive branches are included in their respective elementary networks, the commutation conditions (5.24)-(5.27) must also be satisfied with respect to some fixed branch order. In particular, for networks with state variables, the continuity of inductor currents and capacitor voltages across topological boundaries results in continuity of respective branch currents and voltages as expressed in (5.11)-(5.12).

In addition to the switching of the branch currents and voltages, it is also interesting to consider the commutation of state variables between topologies. For this purpose, a network with state variables $N_\zeta$, where $\zeta = L, C$, is considered. If $N_\zeta$ is modeled using its respective minimal state equation, then it is reasonable to expect that the state vector $x_\zeta$ will also change its dimension from one topology to the next. Specifically, based on (5.3)-(5.4) and with respect to $s_i$ and $s_{i+1}$, the state vector $x_\zeta$ can be related to the corresponding vector space as $$x_\zeta^i \in \mathfrak{R}^{\gamma_i} \qquad (5.43)$$

$$x_\zeta^{i+1} \in \mathfrak{R}^{\gamma_{i+1}} \qquad (5.44)$$

where the index $\gamma_i = \alpha_i, \beta_i$ denotes the size of the minimal state vector for inductive or capacitive network as given in (5.5)-(5.6) with respect to the sequence (5.1). Naturally, since the topologies $s_i$ and $s_{i+1}$, are distinct, with regard to (5.43)-(5.44), it is reasonable to expect that $$\gamma_i \neq \gamma_{i+1} \qquad (5.45)$$

and $$x_\zeta^i \neq x_\zeta^{i+1} \qquad (5.46)$$

from which it follows that for the simulation process of switched network $N_\zeta$, the state variables are discontinuous. Note that (5.46) is likely to be the case not only because of (5.45), but also due to the fact that the natural state variables (independent currents, fluxes, voltages, and charges) are selected algorithmically based only on the topological information for the active portion of the network. That is, the state vector $x_\zeta^i$ is assembled based only on $N=(G, P, s_i)$. Similarly, the state variables in $x_\zeta^{i+1}$ are selected based on knowledge of $N=(G, P, s_{i+1})$. Therefore, even though the dimensions of $x_\zeta^i$ and $x_\zeta^{i+1}$ may happen to be the same, in general, the state variables will not be continuous across topological boundaries.

As shown in the preceding section, it is always possible to obtain a non-minimal realization for each topology of the sequence (5.1) such that instead of (5.43)-(5.44), $$x_\zeta^i, x_\zeta^{i+1} \in \mathfrak{R} \qquad (5.47)$$

where "$\gamma$"$=\alpha, \beta$ denotes the maximum required size for the state vectors as defined in (5.7)-(5.8). Realizations of the maximum required size for which (5.47) holds can be obtained by appropriately applying the transformation of variables (5.39)-(5.41) for each new topology of the sequence (5.1). However, in general, condition (5.47) does not guarantee continuity of state variable across the topological boundaries, and $\tilde{x}_\zeta^i \notin C$.

In addition to (5.47), it is desirable to replace (5.46) with an expression of the form $$\tilde{x}_\zeta^i = \tilde{x}_\zeta^{i+1}. \qquad (5.48)$$

If the transformation of state variables is performed in such a way that (5.39)-(5.41) holds for every switching event in the sequence (5.1), the resulting model would exhibit global state-space continuity, $\tilde{x}_\zeta \in C$. The ASMG with the state scheduling algorithm developed in this thesis is capable of mapping each network incidence $N=(G, P, s_i)$ into a system of DAEs. However, there are many numerical as well as analytical reasons that make the property $\tilde{x}_\zeta \in C$ very desirable.

Without condition (5.48), the simulation of the network $N=(G, P, S)$ is essentially a concatenation of solutions of m+1 initial value problems (IVPs) corresponding to the time intervals between topologies (5.1). Therefore, the simulation would require re-computing the initial conditions and restarting the integration routine for each new topology. In the case of continuous state variables, the, need for re-initializing the integration routine would disappear.

If conditions (5.47)-(5.48) are satisfied for all switching instances of (5.1), the corresponding systems of DAEs for different topologies also become compatible. That is, having state continuity $\tilde{x}_\zeta \in C$, it is possible to apply averaging techniques known in the art to the state equations obtained for distinct topologies. Another important advantage of working with state-space realizations for which (5.47)-(5.48) are enforced, is that it becomes possible to apply Lyapunov-based stability analysis for polytopic systems. Therefore, the development of a deterministic state selection algorithm subject to the continuity constraints (5.47)-(5.48) should be considered.

The first step in deriving the state selection algorithm subject to $\tilde{x}_\zeta \in C$ is to define the change of variables (5.39)-(5.41) for two adjacent generic topologies $s_i$ and $s_{i+1}$, and enforce (5.47)-(5.48). To achieve this, it is necessary to relate state vectors $x_\zeta^i$ and $x_{70}^{i+1}$ through some matrices such that $$x_\zeta^i = {}^i T_\zeta^{i+1} x_\zeta^{i+1} \tag{5.49}$$

$$x_\zeta^{i+1} = {}^{i+1} T_\zeta^i x_\zeta^i \tag{5.50}$$

where ${}^i T^{i+1}$ and ${}^{i+1} T_\zeta^i$ are right and left pseudo inverses of each other, respectively.

As done above, it is assumed that all branches, active as well as inactive, are assigned to their respective networks and that this particular branch order is fixed for both topologies. Also, for convenience of derivation, the state variables are selected to be inductor currents and capacitor voltages; whereas the dimensions of respective state vectors are kept constant by utilizing (5.36)-(5.42). Then the state variables for the instance of commutation between two topologies can be related as $$i_x^{i+1} = B_{i+1}{}^{base} i_L^i = B_{i+1}{}^{base}(B_i^L)^T i_x^i = {}^{i+1} T_L^i i_x^i \tag{5.51}$$

$$v_y^{i+1} = A_{i+1}{}^{base} v_i^C = A_{i+1}{}^{base}(A_i^C)^T v_y^i = {}^{i+1} T_C^i v_y^i \tag{5.52}$$

If the appropriate redundant states are included in $i_x^i$, $i_x^{i+1}$ and $v_y^i$, $v_y^{i+1}$, then the transformation matrices ${}^{i+1}T_L^i$ and ${}^{i+1}T_C^i$ under conditions of any proper commutation, can always be made to have full rank. Thereafter, ${}^iT_\zeta^{i+1}$ and ${}^{i+1}T_\zeta^i$ become inverses of each other.

The second step in deriving an algorithm for global state space continuity consists of applying results of the first step recursively to all topologies of the sequence (5.1). During the time interval of topology si, network $N=(G, P, s_i)$ is modeled using a transformation of variables of the form $$\tilde{x}_\zeta = {}^0 K_\zeta^i x_\zeta^i \tag{5.53}$$

where for $\zeta=L, C$; $x_\zeta^i$ denotes $i_x^i$ or $v_y^i$, and $\tilde{x}_\zeta$ is the respective state vector transformed by ${}^0K_\zeta^i$ such that state variables are continuous starting from initial topology so all the way up to topology $s_i$. This step represents an inductive assumption. Then, in order to keep continuity of $\tilde{x}_\zeta$ during the switching from $s_i$ to $s_{i+1}$, based on (5.49), the following relation must be satisfied $$\tilde{x}_\zeta = {}^0 K_\zeta^{ii} T_\zeta^{i+1} x_\zeta^{i+1} \tag{5.54}$$

From (5.54), it follows that the transformation of variables for the topology $s_{i+1}$ is in fact $$\tilde{x}_\zeta = {}^0 K_\zeta^{i+1} x_\zeta^{i+1} \tag{5.55}$$

where $$^0 K_\zeta^{i+1} = \prod_{n=0}^{n=i} {}^n T_\zeta^{n+1} \tag{5.56}$$

Based on (5.50), and very similar to (5.54), it is clear that the inverse of ${}^0K_\zeta^{i+1}$ can also be found as $$^{i+1} K_\zeta^0 = {}^{i+1} T_\zeta^{ii} K_\zeta^0 = \prod_{n=0}^{n=i} {}^{i+1-n} T_\zeta^{i-n} \tag{5.57}$$

The transformation matrices (5.56)-(5.57) can be used in (5.42) in order to achieve $\tilde{x}_\zeta \in C$. The same transformation of variables can be applied to the more general system of DAEs (4.10), (4.21), and (4.45)-(4.50), in order to obtain global continuity of state variables.

Implementation

The state selection method discussed herein provides a convenient structure of DAEs for the ASMG. This methodology can be readily implemented on a computer using a matrix representation of a graph corresponding to the global switched network $N=(G, P, S)$. Thereafter, all DAEs for elementary networks can be readily assembled based on the TCF for each topology of $N=(G, P, S)$. However, a brute-force implementation of the ASMG involving sparse topological matrices together with sparse parameter matrices would result in very long simulation run times in the case of electrical networks with time-varying and/or non-linear parameters and a large number of branches. Therefore, an efficient numerical implementation of the ASMG-generated DAEs is a very important issue that will now be addressed.

Instead of employing matrices for the representation of graphs in $N=(G, P, S)$, it is possible to use a collection of linked lists or arrays with multiple indirections. Running spanning tree algorithms on the resulting, more compact data structures requires less CPU time. Utilizing this data structure, the network identification procedure produces arrays containing tree and link branches for each elementary network. Similar arrays can also be assembled by reading the indices of the appropriate rows and columns of the TCF matrix (3.48) or (3.112). Thereafter, it is possible to obtain arrays of branches forming a cycle corresponding to each link branch. Each such array represents a set of branches forming a loop headed by its respective link branch. Also, for each network branch, it is possible to assemble an array that records the loop numbers corresponding to the loops in which this branch participates. Such an array represents a loop participation set for the given branch. Similarly, it is possible to form arrays of cutset branches corresponding to each tree-branch, and arrays of cutset participations for all branches. These compact arrays of loop (loop participation) and cutsets (cutset participation) sets can be formed on a network-by-network basis. As it will be shown, assembling DAEs and computing their terms using arrays of branch sets avoids unnecessary operations and, therefore, significantly reduces the computational complexity.

Implementation of State and Output Equations

In order to reduce the computational effort associated with solving the network DAEs, it is instructive to recall those equations in matrix form. In this section, the output equations (4.13), (4.17), (4.36), and (4.44) are considered first. Then attention is turned to the state equations (3.72) and (3.73), and their more general form (4.34) and (4.43).

Output Equations

Following the sequence in which the material was presented in preceding sections, the inductive network is considered first. For convenience, the voltage equation for $N_L$ with time-varying parameters is repeated here.

$$v_{br}^L = R_{br}^L i_{br}^L + \frac{dL_{br}}{dt} i_{br}^L + L_{br} \frac{di_{br}^L}{dt} + e_{br}^L \qquad (6.1)$$

The voltage for the k-th branch of $N_L$ can be written directly from (6.1) in terms of summations as $$v_{br}^L(k) = \sum_{l \in B^L} R_{br}^L(k,l) i_{br}^L(l) + \qquad (6.2)$$

$$\sum_{l \in B^L} \frac{dL_{br}}{dt}(k,l) i_{br}^L(l) + \sum_{l \in B^L} L_{br}(k,l) \frac{d}{dt} i_{br}^L(l) + e_{br}^L(k)$$

where both indices i and k span all branches of $N_L$. The number of calculations in (6.2) can be significantly reduced if the summations are performed including only those branches that are coupled through mutual resistances and inductances. Since the coupling among the network branches is known ahead of time, it is possible to define sets that compactly store this information. For instance, it is convenient to define $M_k^R$ as the set containing indices of all branches that are coupled by a mutual resistance with the k-th branch of $N_L$. Also, if branch $b_k$ has a non-zero resistance, it is convenient to let $M_k^R$ contain k as well. On the other hand, if $b_k$ has zero resistance, it cannot be coupled resistively to any other branches and consequently $M_k^R$ is empty. Similarly, $M_k^L$ is defined to contain indices of inductive branches that are coupled with $b_k$ by a mutual inductance. Again, $M_k^L$ contains k only if branch $b_k$ is inductive and is not coupled with other network branches. If $b_k$ has zero inductance, the corresponding set is $M_k^L = \emptyset$. Furthermore, among branches represented in $M_k^L$ there are some that have time-varying inductance. Thus, it is possible to identify a subset $M_k^{Lt} \subset M_k^L$ that includes all branches with time-varying inductance. Utilizing such sets, (6.2) can be rewritten as $$v_{br}^L(k) = \sum_{l \in M_k^R} R_{br}^L(k,l) i_{br}^L(l) + \qquad (6.3)$$

$$\sum_{m \in M_k^{Lt}} \frac{dL_{br}}{dt}(k,m) i_{br}^L(m) + \sum_{n \in M_k^L} L_{br}(k,n) \frac{d}{dt} i_{br}^L(n) + e_{br}^L(k)$$

Assuming that sets $M_k^R$, $M_k^L$, and $M_k^{Lt}$ are assembled for each branch of $N_L$, the vector of branch voltages $V_{br}^L$ can be computed using (6.3) with reduced expense compared to (6.2).

The same concept can be applied to the capacitive network. The output equation for the time-varying case of $N_C$ is $$i_{br}^C = G_{br}^C v_{br}^C + \frac{dC_{br}}{dt} v_{br}^C + C_{br} \frac{dv_{br}^C}{dt} - j_{br}^C \qquad (6.4)$$

Similar sets corresponding to the branches with mutual conductances $M_k^G$ and mutual capacitances $M_k^C$ and subsets of branches with time-varying capacitances $M_k^{Ct} \subset M_k^C$ can be assembled for the k-th branch of $N_C$. The expression for computing the k-th component of $i_{br}^C$ becomes $$i_{br}^C(k) = \sum_{l \in M_k^G} G_{br}^C(k,l) i_{br}^L(l) + \qquad (6.5)$$

$$\sum_{m \in M_k^{Ct}} \frac{dC_{br}}{dt}(k,m) v_{br}^C(m) + \sum_{n \in M_k^C} C_{br}(k,n) \frac{d}{dt} v_{br}^C(n) - j_{br}^C(k)$$

The sets $M_k^R$, $M_k^L$, $M_k^{Lt}$, and $M_k^G$, $M_k^C$, $M_k^{Ct}$ can be obtained for the initial topology and then updated for each new topology.

This technique of summing over only relevant terms can be extended to the more general form of output equations (4.36) and (4.44). In the case of inductive networks, among branches represented in $M_k^L$, there may be some branches for which the inductance depends on network currents. The indices of these branches can be placed in a set $M_k^\Phi$. Similarly, among the capacitive branches represented in $M_k^C$, there may be some branches for which the capacitance is a function of applied voltage. These branches are collected in $M_k^\Phi$. Clearly, $M_k^\Phi \subset M_k^L$ and $M_k^\Phi \subset M_k^C$. After obtaining these additional branch sets, components of (4.36) and (4.44) can be computed as follows $$v_{br}^L(k) = \left( \sum_{m \in M_k^R} R_{br}^L(k,m) i_{br}^L(m) \right) + \left( \sum_{n \in M_k^L} L_{br}(k,n) \frac{d}{dt} i_{br}^L(n) \right) + \qquad (6.6)$$

$$\left( \sum_{i \in M_k^{Lt}} \frac{\partial}{\partial t} L_{br}(k,i) i_{br}^L(i) \right) + \left( \sum_{j \in M_k^\Phi} \frac{\partial}{\partial i_{br}^L(k)} \varphi_{br}(j) \frac{d}{dt} i_{br}^L(j) \right) + e_{br}^L(k)$$

-continued $$i_{br}^C(k) = \left(\sum_{m \in M_k^C} G_{br}^L(k,m)v_{br}^C(m)\right) + \qquad (6.7)$$

$$\left(\sum_{n \in M_k^C} C_{br}(k,n)\frac{d}{dt}v_{br}^C(n)\right) + \left(\sum_{i \in M_k^{C_t}} \frac{\partial}{\partial t}C_{br}(k,i)v_{br}^C(i)\right) +$$

$$\left(\sum_{j \in M_k^\phi} \frac{\partial}{\partial v_{br}^C(k)}\phi_{br}(j)\frac{d}{dt}v_{br}^C(j)\right) + j_{br}^C(k)$$

State Equations

For the purposes of numerical implementation, it is convenient to view the state equation, either for $N_L$, or for $N_C$, in the following general form $$M(x,t)\frac{dx}{dt} = A(x,t) + g(u,t) \qquad (6.8)$$

where $A(x, t)$ represents all terms that define the state self-dynamics. The forcing term $g(u, t)$ takes into account all external sources and interconnections with other networks. Since all inputs represented by u have the same units, the function $g(u, t)$ will have the form of a summation. Finally, $M(x, t)$ is the mass matrix.

Thus, $N_L$ with time-varying parameters is considered first. The state equation for this case can be written as $$L_x\frac{di_x}{dt} = -\left(R_x + \frac{dL_x}{dt}\right)i_x - B_b^L e_{br}^L - C_b^{LA}v_{br}^A - C^{LC}v_y^C \qquad (6.9)$$

The forcing vector $g(u, t)$, with respect to (6.9), can be expressed as $$g^L(u,t) = -B_b^L e_{br}^L - C_b^{LA}v_{br}^A - C^{LC}v_y^C \qquad (6.10)$$

Of course, computing (6.10) by the means of full matrix multiplication is not efficient. Instead, it is possible to utilize the topological information about the matrices in (6.10). In particular, recalling KVL matrix (3.50) and expression (3.62), it can be concluded that the k-th component of the forcing vector (6.10) is the sum of external (forcing) voltages taken around the k-th loop with respect to the inductive network. Then, by examining the nonzero entries of the respective KVL matrices $B_b^L$, $C_b^{LA}$, and $C^{LC}$, it is possible to assemble special sets of loop branches for, each term in (6.10). The set of branch indices corresponding to the k-th inductive link-branch is denoted as $L_k^L$, which contains the k-th branch. The set $L_k^{Le} \subseteq L_k^L$ includes only those $N_L$ loop-branches that have non-zero external voltage sources. Similarly, $L_k^{LA}$ contains the indices of the loop-branches that happen to be in the algebraic network, and $L_k^{LC}$ includes the loop-branches that are in $N_C$. Clearly, $L_k = L_k^L \cup L_k^{LA} \cup L_k^{LC}$ contains all loop-branches (complete basic loop) corresponding to the k-th inductive link-branch. These branch sets can be assembled for each new network topology. Based on these compact loop-sets, the k-th component of the forcing vector can be computed with reduced effort as follows $$g^L(k) = -\sum_{l \in L_k^{Le}} B_b^L(k,l)e_{br}^L(l) - \qquad (6.11)$$

$$\sum_{m \in L_k^{LA}} C_b^{LA}(k,m)v_{br}^A(m) - \sum_{n \in L_k^{LC}} C^{LC}(k,n)v_y^C(n)$$

The reduced inductance and reduced resistance matrices in (6.9) are defined as a triple product of appropriate matrices. Using to the typical matrix multiplication process, the entries of these matrices are found as $$L_x(i,j) = \sum_{m=1}^{\eta+h}\sum_{n=1}^{\eta+h} B_b^L(i,m)B_b^L(j,n)L_{br}(m,n) \qquad (6.12)$$

$$R_x(i,j) = \sum_{m=1}^{\eta+h}\sum_{n=1}^{\eta+h} B_b^L(i,m)B_b^L(j,n)R_{br}^L(m,n) \qquad (6.13)$$

The terms under summations in (6.12) and (6.13) are non-zero only when the internal indices m and n correspond to the branches that are members of the i-th and j-th respective loops and to the non-zero entry of the respective parameter matrix. Then, using loop sets earlier denoted as $L^L$, each (i, j)-th element of $L_x$ and $R_x$ can be computed with reduced computational effort as $$L_x(i,j) = \sum_{(m \in L_i^L)}\sum_{(n \in L_j^L)} B_b^L(i,m)B_b^L(j,n)L_{br}(m,n) \qquad (6.14)$$

$$R_x(i,j) = \sum_{(m \in L_i^L)}\sum_{(n \in L_j^L)} B_b^L(i,m)B_b^L(j,n)R_{br}^L(m,n) \qquad (6.15)$$

For networks with time-varying inductances and resistances, (6.14) and (6.15) can be updated by running the summation indices m and n only over those branches that have time-varying parameters.

This method of computing the reduced parameter matrices is advantageous over performing the full triple matrix multiplication. An even better performance can be obtained by using loop participation sets. It can be recalled that in the case of $N_L$, only the network loop branches that are linked by inductive links make a contribution to (6.12)-(6.13). Thus, for each k-th branch of $N_L$, it is possible to assemble a set that contains all network loops (loop indices) in which this branch participates as determined by the local KVL matrix $B_b^L$. For convenience, the loop numbering can be made the same as for the rows of $B_b^L$. It is useful to define $LP_k$ as the set that stores loop numbers in which the k-th branch takes part. This set can be assembled by recording indices of the non-zero entries of the k-th column of $B_b^L$. Thereafter, it is possible to express the contribution of mutual inductance between the m-th and n-th branches in the reduced inductance matrix as follows $$\Delta L_x(i,j) = \sum_{(i \in LP_m)}\sum_{(j \in LP_n)} B_b^L(i,m)B_b^L(j,n)L_{br}(m,n) \qquad (6.16)$$

When k=m=n, expression (6.16) defines the contribution of the self inductance corresponding to the k-th network branch. In the same way, the contribution of a mutual resistance between the m-th and n-th branches in the reduced resistance matrix can be expressed as $$\Delta R_x(i, j) = \sum_{(i \in LP_m)} \sum_{(j \in LP_n)} B_b^L(i, m) B_b^L(j, n) R_{br}^L(m, n) \quad (6.17)$$

Thus, using (6.16)-(6.17), the reduced parameter matrices in the state equation (6.9) can be computed and updated in a very efficient way.

Considering $N_C$ with time-varying parameters, the duality with respect to the previous network can be utilized. The corresponding state equation is $$C_y \frac{dv_y}{dt} = -\left(G_y + \frac{dC_y}{dt}\right)v_y + A_a^C j_{br}^C - D_a^{CA} i_{br}^A - D^{LC} i_x^L \quad (6.18)$$

where the forcing vector can be expressed as $$g^C(n, t) = A_a^C j_{br}^C - D_a^{CA} i_{br}^A - D^{LC} i_x^L \quad (6.19)$$

In this case, it is possible to utilize the topological information available in the TCF (3.48). In particular, recalling KCL expression (3.56), it can be concluded that the k-th component of the forcing vector (6.19) is the sum of currents external to the capacitive network. Moreover, the non-zero entries of the KCL matrices $A_a^C$, $D_a^{CA}$, and $D^{LC}$ correspond to some cutset branches. The set of cutset branches corresponding to the k-th capacitive tree branch is denoted as $C_k^C$, and the subset $C_k^j \subseteq C_k^C$ includes the branches that have nonzero external current sources. The sets $C_k^{CA}$ and $C_k^{CL}$ include the indices of the cutset branches that are in the algebraic and inductive networks, respectively. Clearly, $C^k = C_k^C \cup C_k^{CA} \cup C_k^{CL}$ is the complete set of cutset branches corresponding to the k-th capacitive tree-branch. As before, all branch sets are assembled for each new network topology. Thereafter, the k-th component of the forcing vector can be computed with minimized effort as $$g^C(k) = -\sum_{l \in C_k^{Ci}} A_a^C(k, l) j_{br}^C(l) - \\ \sum_{m \in C_k^{CA}} D_a^{CA}(k, m) i_{br}^A(m) - \sum_{n \in C_k^{CL}} D^{LC}(k, n) i_x^L(n) \quad (6.20)$$

The reduced parameter matrices can be computed using cutset participation sets. For convenience, the cutset numbering can be made the same as that for the rows of $A_a^C$. The set $CP_k$ includes the cutset indices in which the k-th capacitive branch participates. By analogy, this set can be assembled by recording indices of the non-zero entries of the k-th column of $A_a^C$. Thereafter, the contribution of a mutual capacitance and/or mutual conductance between the m-th and n-th branches in their respective reduced matrices can be expressed as $$\Delta C_x(i, j) = \sum_{(i \in CP_m)} \sum_{(j \in CP_n)} A_a^C(i, m) A_a^C(j, n) C_{br}(m, n) \quad (6.21)$$

$$\Delta G_x(i, j) = \sum_{(i \in CP_m)} \sum_{(j \in CP_n)} A_a^C(i, m) A_a^C(j, n) G_{br}(m, n) \quad (6.22)$$

Similarly, when k=m=n, (6.21)-(6.22) define contributions of the self-capacitance and self-conductance of the k-th branch of the capacitive network. Using (6.21) (6.22), the reduced parameter matrices in (6.18) can be computed and updated efficiently.

Building Algorithm for Networks with Variable Parameters

After the appropriate branch sets have been assembled, the implementation of the inductive and capacitive networks becomes very similar. In this section, a pseudo code implementing the output and state equations is described with respect to the inductive network only. The same techniques and conclusions can be directly applied to the capacitive network.

To implement output equation (6.3), the branch sets earlier defined as $M_k^R$, $M_k^L$, and $M_k^{Lt}$ are used. In order to have convenient and fast access to parameters, it is assumed that all parameter matrices use full matrix storage. If standard matrix-vector multiplication is used to implement (6.2), the computational complexity is $$\eta_{6.2}(n) = \Theta(3n^2 + n) \quad (6.23)$$

However, since the density of matrices in (6.1) is a function the number of mutual parameters, the complexity of (6.3) is somewhat reduced as compared to $\Theta(3n^2+n)$. In particular, the complexity of the pseudo code in Code Block 1 implementing (6.3) is $$\eta_{6.3}(n) = \Theta[n + n_s^R + n_s^L + n_s^{Lt} + 2(n_m^R + n_m^L + n_m^{Lt})] \quad (6.24)$$

which, in turn, can be anywhere between $\Theta(4n)$ and $\Theta(3n^2+n)$, and would still have the same upper bound on the order of growth of $O(n^2)$. In the previous expressions for complexity, n is the number of branches in the given network, $n_s^R$, $n_s^L$, $n_s^{Lt}$ and $n_m^R$, $n_m^L$, $n_m^{Lt}$ are the total numbers of self and mutual resistive, inductive, and time-varying inductive parameters, respectively. The values of those numbers are readily determined from the branch sets $M^R$, $M^L$, and $M^{Lt}$.

---

Code Block 1

```
for (∀k ∈ B^L) { /* each k-th branch in N_L */
    /* initialize memory slot with e_br^L */
    VLnw [k] = EsL [k] ;
    /* j-th and k-th branches have mutual R */
    for (∀j ∈ M_k^R) {
        VLnw [k] = VLnw [k] + RLnw [k] [j] * ILnw [j];
    }
    /* j-th and k-th branches have mutual L */
    for (∀j ∈ M_k^L) {
        VLnw [k] = VLnw [k] + Lnw [k] [j] * dILnw [j];
    }
    /* j-th and k-th branches have mutual L(t) */
    for (∀j ∈ M_k^Lt) {
        VLnw [k] = VLnw [k] + dLnw [k] [j] * ILnw [j] ;
    }
}
```

---

Implementation of the state equation (6.8) is accomplished in parts. First, the forcing vector is computed according to (6.10). Second, depending on the type of network parameters and choice of state variables, the vector of state derivatives is calculated. A pseudo code block implementing (6.10) is shown in Code Block 2. The code is similar to that shown in Code Block 1. The computational complexity of the pseudo code in Code Block 2 is $$\eta_{6.10}(n) = \Theta\left(n + \sum_{i=1}^{n} n_i^{Le} + \sum_{i=1}^{n} n_i^{LA} + \sum_{i=1}^{n} n_i^{LC}\right) \quad (6.25)$$

which has the same upper bound of $O(n^2)$. Here, parameter n denotes the number of inductive link branches or the total number of inductive loops, and $n_i^{Le}$ is the number of voltage sources in each i-th inductive loop. Then $n_i^{LA}$ and $n_i^{LC}$ are the numbers of algebraic and capacitive network branches, respectively, that are also part of i-th inductive loop. These quantities are determined by the branch sets $L^{Le}$, ---
Code Block 2
---
```
for (k =-1...size(B_x^L)) { /* each k-th inductive link/loop */
    gL[k] = 0.0; /* initialize memory slot */
    /* j-th branch in k-th loop has voltage source */
    for (∀j ∈ L_k^Le) {
        gL[k] = gL[k] - B[k] [j] * EsL[j] ;
    }
    /* j-th branch in k-th loop is also in N_A */
    for (∀j ∈ L_k^LA) {
        gL[k] = gL[k] - CbLA[k] [j] * VAnw[j] ;
    }
    /* j-th branch in k-th loop is also in N_C */
    for (∀j ∈ L_k^LC) {
        gL[k] = gL[k] - C__LC[k] [j] * vy[j] ;
    }
}
```

The building algorithm for assembling reduced parameter matrices consists of two parts: initialization and update. The pseudo code implementing these procedures is given in Code Blocks 3-5. Since all reduced parameter matrices can be assembled using their respective loop and loop participation (cutset and cutset participation branch sets, the building algorithm for the other reduced matrices can be obtained by appropriately modifying the pseudo code given therein. Therefore, only the reduced inductance matrix is discussed.

The computational complexity as well as features of algorithms given in Code Blocks 3-5 are very different. The pseudo code in Code Block 3 can be used to assemble the reduced parameter matrices utilizing loop (cutset) sets as in (6.14). This code may be used to the initialize and update the parameter matrices. The initialization is performed by writing zeros in each memory slot, and then by computing the appropriate contribution due to the constant inductances into an auxiliary storage matrix $L_x$. Pre-computing the contribution of all time-invariant inductances into a separate matrix suggests this approach $$L_x(t) = L_x + \Delta L_x(t) \quad (6.26)$$

---
Code Block 3
---
```
for (i = 1...size(B_x^L)) { /* i-th inductive loop */
    for (j = 1...size(B_x^L)) { /* j-th inductive loop */
        Lx[i] [j] = 0.0; /* initialize memory slot */
        /* m-th branch is in i-th loop */
        for (∀m ∈ L_i^L) {
            /* n-th branch is in j-th loop */
            for (∀n ∈ L_j^L) {
```

---
-continued
Code Block 3
---
```
                Lx[i] [j] = Lx[i] [j]
                    + BbL[i] [m] * BbL[j] [n] * Lnw[m] [n] ;
            }
        }
    }
}
```

---
Code Block 4
---
```
/* inductance between m-th and n-th branches of N_L */
for (∀<m,n> ∈ L_{N_L}) {
    /* m-th branch is in i-th inductive loop */
    for (∀i ∈ LP_m) {
        /* n-th branch is in j-th inductive loop */
        for (∀j ∈ LP_n) {
            Lx[i] [j] = Lx[i] [j]
                + BbL[i] [m] *BbL[j] [n] *L[m] [n] ;
        }
    }
}
```

---
Code Block 5
---
```
/* variable L between m-th and n-th branches of N_L */
for (∀<m, n> ∈ L_{N_L}^{var}) {
    /* m-th branch is in i-th inductive loop */
    for (∀i ∈ LP_m) {
        /* n-th branch is in j-th inductive loop */
        for (∀j ∈ LP_n) {
            Lx[i] [j] = Lx[i] [j] + BbL[i] [m] * BbL[j] [n]
                *(Lvar[m] [n] - Lold[m] [n]);
        }
    }
    /* record used value for the future call */
    Lold[m] [n] = Lvar[m] [n];
}
``` where $\Delta L_x(t)$ is the respective contribution due to remaining variable inductances. Then the procedure for updating $L_x(t)$ can be implemented by initializing each memory slot of $L_x(t)$ with pre-computed values from corresponding slots in $L_x$. This technique, however, has the disadvantage of having to copy the entire matrix $L_x$ at each update. In large networks where only few parameters are variable, copying the entire matrix $L_x$ over to $L_x(t)$ may represent significant and unnecessary overhead.

Utilizing the loop participation sets according to (6.16)-(6.17), the reduced parameter matrices can be assembled as shown in Code Block 4, without the disadvantage, of having to copy the entire matrix for each update. Thus, the code in Code Block 4, avoids the scheme (6.26) altogether. However, if the code in Code Block 4 is used to update the reduced matrix, the original matrix will be destroyed which, in turn, makes it difficult to carry the contribution due to time-invariant parameters from one update to the next. In the algorithm shown in Code Block 3, this function is accomplished by copying the entire matrix; whereas Code Block 4 updates only the relevant entries. One way of using the algorithm in Code Block 4 for systems with both time-varying and time-invariant parameters is to "undo" the previous update before performing a new one. This two-step update procedure is equivalent to updating the matrix once with the difference between the old and the new values of the variable parameters. The pseudo code illustrating the update procedure is given in Code Block 5. Therein, the reduced inductance matrix is updated due only to changes in variable inductances. The implementation of this update algorithm requires auxiliary static memory for storing previous update values. This storage should be of the same size and type as the original reduced parameter matrix. It is also noted that the subtraction of the old and new inductances should be performed first as indicated by the parentheses so as to reduce the round-off errors due to finite precision machine arithmetic.

The complexity of the algorithms in Code Blocks 3-5 is a function of the size of the loop and loop participation sets. The sizes of these sets and their structures are, in turn, determined by the self parameters and the mutual coupling between network branches. Therefore, the complexity of algorithms Code Blocks 3-5 is highly system-dependent. Analyzing each algorithm for the worst case, which corresponds to all branches having variable parameters with all branches coupled with each other, results in similar complexity for all algorithms and reveals little about their actual performances with respect to practical networks. Instead, the problem of assembling the reduced parameter matrices using algorithms in Code Block 3 and Code Block 4 should be considered with respect to some typical cases. Expressions for the complexities can be significantly simplified using certain assumptions. Thus, for the purpose of derivation, it is assumed that there is no mutual coupling. Then, inspecting Code Block 3 for implementing (6.14) with this assumption in mind, the complexity can be expressed as $$\eta_{16.14}(n) = \Theta[n^2(\overline{m}^2+1)] \tag{6.27}$$

where n is the number of inductive loops, and m is the average number of branches in each loop. Denoting $m_i$ to be the number of branches in the i-th loop, (6.27) can be developed further as $$\eta_{6.14}(n) = \Theta\left[n^2\left(\frac{1}{n}\sum_{i=1}^{n}m_i\right)^2 + n^2\right] = \Theta\left[\left(\sum_{i=1}^{n}m_i\right)^2 + n^2\right] \tag{6.28}$$

With respect to (6.16), the complexity of the code in Code Block 4 is determined by the sizes of the loop participation sets LP. In particular, assuming only self inductances, the computational effort for the contribution from one branch is proportional to the square of the number of loops in which this branch participates. Denoting the number of loops in which the i-th branch participates as $p_i$, including initialization, the expression for the complexity for the code in Code Block 4 becomes $$\eta_{6.16}(n) = \Theta\left(\sum_{i=1}^{n}p_i^2 + n^2\right) \tag{6.29}$$

Both (6.28) and (6.29) demonstrate significant computational savings when compared to $\Theta[n^2(n_{br}^2+1)]$, which is the cost of triple matrix multiplication. Here, $n_{br}$ denotes the total number of branches in the given network. A closer look at (6.28) and (6.29) suggests that for large networks, the advantage of the building algorithm presented here should become more noticeable.

Figure 5:
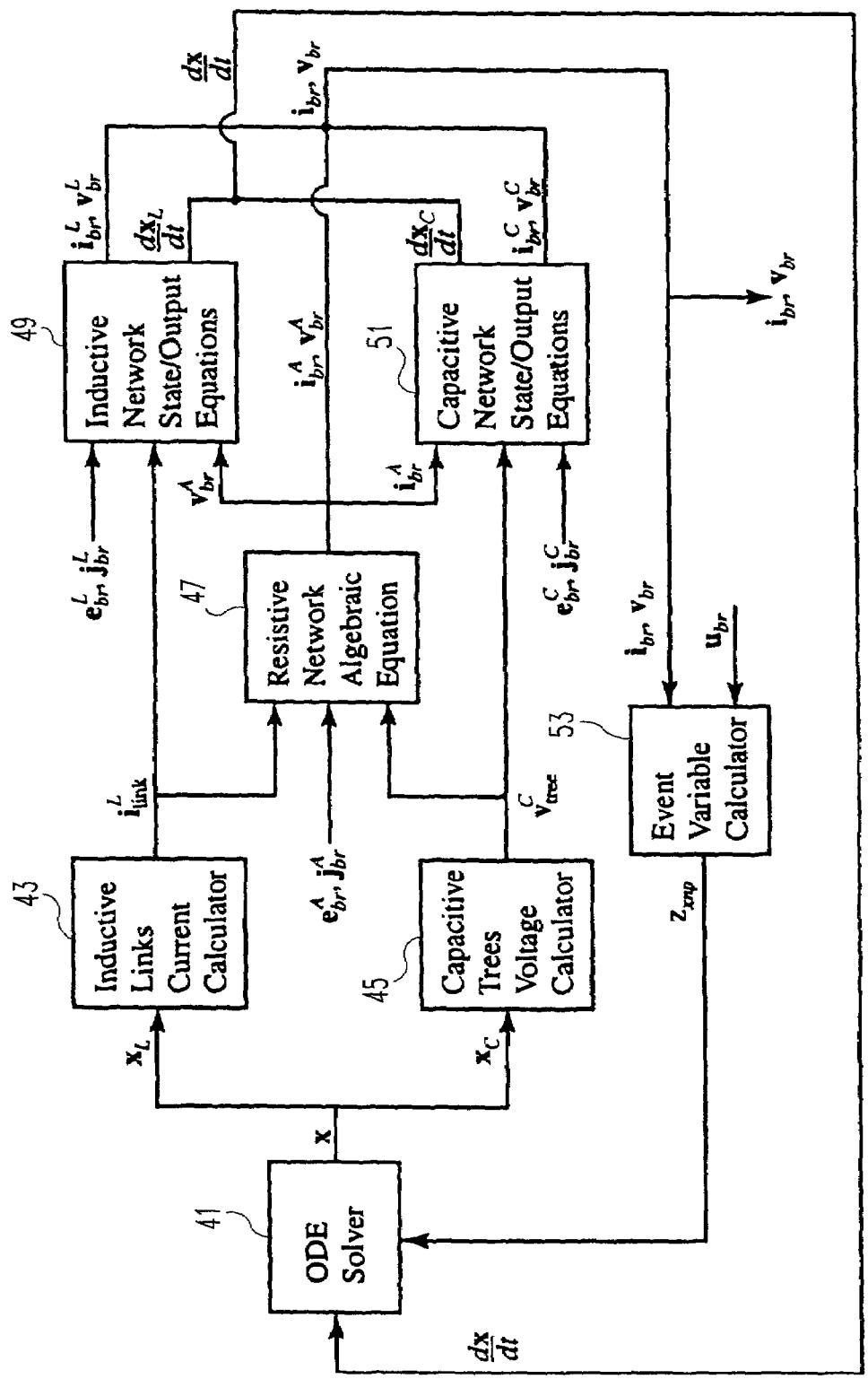
FIG. 5 is a-block diagram of the run-time computational routines in one embodiment of the invention.

The run-time computational routines in one embodiment of the present invention will now be discussed in relation to FIG. 5. ODE solver 41 maintains state vector x, which is provided to inductive links current calculator 43 (for state variables relating to inductive elements) and capacitive trees voltage calculator 45 (the portions $x_C$ represent state variables relating to capacitive elements). Inductive links current calculator 43 calculates the current $i_{link}^L$ in the inductive link branches of the circuit, providing that information to resistive network algebraic equation calculator 47 and inductive network state/output equation evaluator 49. Likewise, capacitive trees voltage calculator 45 calculates the voltages $V_{tree}^C$ in capacitive tree branches as discussed above, and provides that information to resistive network algebraic equation component 47 and capacitive network state/output equation evaluator 51.

Resistive network algebraic equation evaluator 47 uses $i_{link}^L$ and $v_{tree}^C$ with $e_{br}^A$ and $j_{br}^A$ to calculate $i_{br}^A$ and $v_{br}^A$, which are provided to inductive network state/output equation component 49, capacitive network state/output equation component 51, event variable calculator 53, and the system output. Inductive network state/output equation component 49 uses $i_{link}^L$ and $v_{br}^A$ along with inputs $e_{br}^L$ and $j_{br}^L$ to determine $i_{br}^L$, $v_{br}^L$, (provided to event variable calculator 53 and the system output) and $dx_L/dt$ (provided to the ODE solver 41). Capacitive network state/output equation component 51 uses $i_{br}^A$ and $v_{tree}^C$ along with $e_{br}^C$ and $j_{br}^C$ to calculate $i_{br}^C$, $v_{br}^C$, (provided to event variable calculator 53 and the system output) and $dx_C/dt$ (provided to the ODE solver 41).

The branch voltages and currents are output as vectors $i_{br}$ and $v_{br}$. These values are used with $u_{br}$ by event variable calculator 53 to produce event variable $Z_{xnp}$, which is passed to the ODE solver 41. In addition to solving the differential equations for the system, ODE solver 41 monitors for negative-to-positive zero crossings of $Z_{xnp}$. If a zero crossing is encountered, which indicates that a switch or switches are opening or closing, the state selection algorithm (part of state model generator 31 in FIG. 3) if invoked to establish a new set of state variables and to update the branch sets and matrices used by the state equation building algorithm discussed above.

Figure 6:
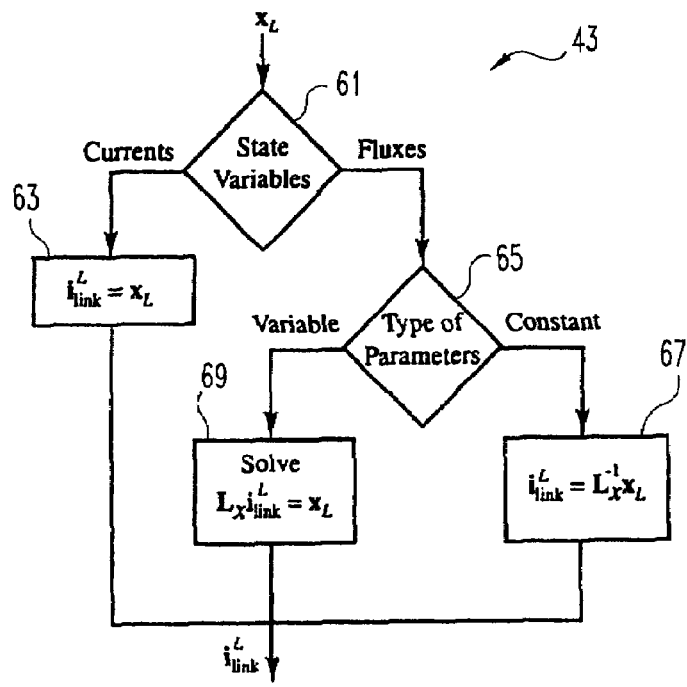
FIG. 6 is a block diagram detailing the inductive link current calculator for use with the routines shown in FIG. 5.

Inductive links current calculator 43 will now be discussed in relation to FIG. 6. At decision block 61, it is determined whether currents or fluxes have been used to define the state variables for the system. If currents have been used, then the state variables from $x_L$ are already in the proper form and are provided as output. Otherwise, if fluxes have been used, it is determined at decision block 63 whether constant or variable inductance parameters are present. If the parameters are constant, the output is calculated at block 67 as $L_x^{-1}x_L$. Alternatively, if the inductance parameters are variable, block 69 determines the output vector by solving $L_x i_{link}^L = x_L$.

Figure 7:
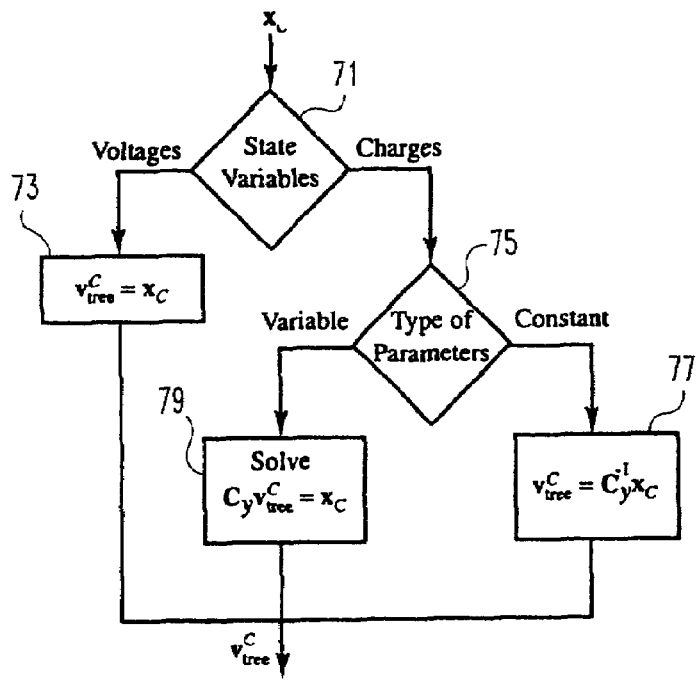
FIG. 7 is a block diagram detailing the capacitive tree voltage calculator for use with the routines shown in FIG. 5.

The analogous calculations for capacitive tree voltage calculator 45 will now be discussed in relation to FIG. 7. At decision block 71, it is determined whether voltages or charges have been used to define the state variables for the system. If voltages have been used, then the state variables from $x_C$ are already in the proper form and are provided as output. Otherwise, if charges have been used, it is determined at decision block 75 whether constant or variable capacitance parameters are present. If the parameters are constant, the output is calculated at block 77 as $C_y^{-1}x_C$. Alternatively, if the capacitance parameters are variable, block 79 determines the output vector by solving $C_y v_{tree}^C = x_C$.

Figure 8:
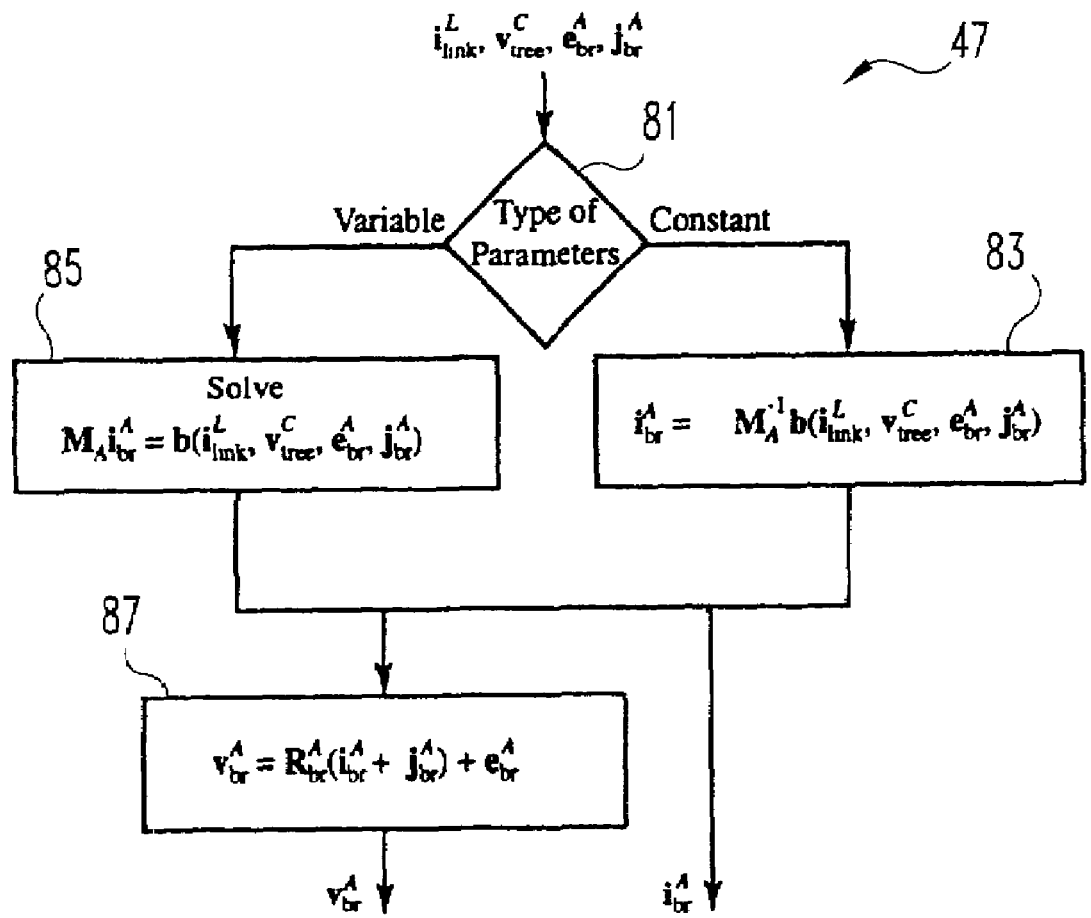
FIG. 8 is a block diagram detailing the resistive network algebraic equation calculator for use with the routines shown in FIG. 5.

Resistive network algebraic calculation block 47 will now be discussed in more detail in relation to FIG. 8. At decision block 81, it is determined whether the resistive network parameters are constant or variable. If they are constant, the output current vector is calculated as shown in block 83. If it is determined at decision block 81 that the resistive network parameters are variable, the current vector for the algebraic network branches is determined in block 85 by solving the equation shown therein. After the current vector is determined in either block 83 or block 85, the voltage vector is determined at block 87, as shown therein.

Figure 9:
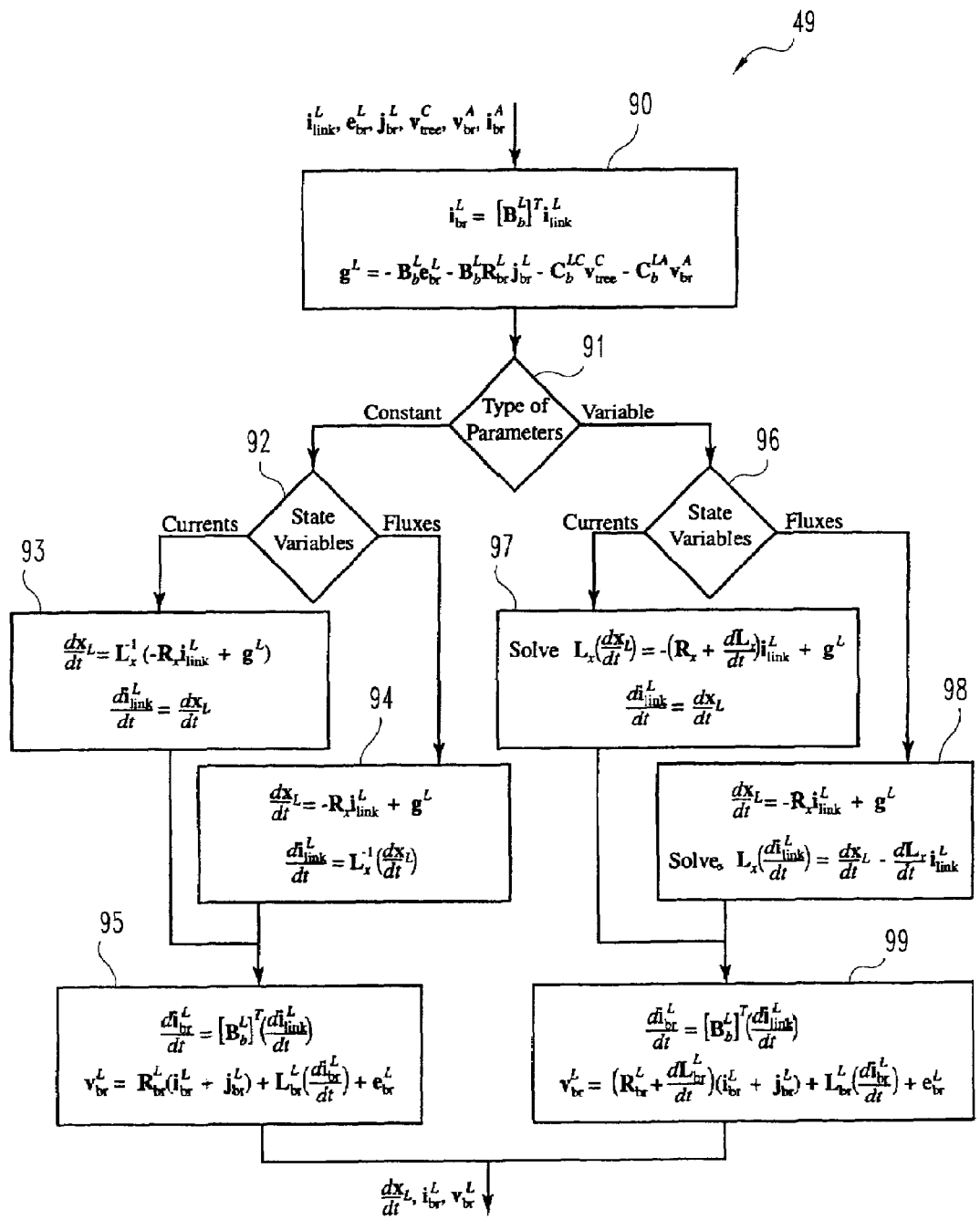
FIG. 9 is a block diagram detailing the inductive network state/output equation calculator for use with the routines shown in FIG. 5.

The inductive network state and algebraic equation determining block 49 is shown in more detail and will now be discussed in relation to FIG. 9. First, at block 90, the inductive network branch currents $i_{br}^L$ and forcing term $g^L$ are computed. At decision block 91 it is determined whether the inductive network contains constant or variable parameters. If the parameters are constant, then the type of state variables being used is identified at decision block 92. For currents, the derivatives with respect to time of the inductive portion of the state vector and the currents in the inductive link branches are calculated. Similarly, for state variables defined as fluxes, those values are calculated at block 94. In either event (from either block 93 or block 94), the time-derivative of inductive branch currents and the voltages for inductive branches are determined at block 95, and the outputs are generated.

If it is determined at decision block 91 that variable parameters are present, then it is determined at decision block 96 whether currents or fluxes have been selected as state variables for the inductive portion of the network. If currents have been selected, then the time-derivatives of $x_L$ and the inductive link-branch currents are determined at block 97. Correspondingly, if fluxes are used as state variables, then those values are determined at block 98. In either event (from either block 97 or block 98), the time-derivative of inductive branch currents, as well as the inductive branch voltages, are determined at block 99, and the output of overall block 49 is generated.

Figure 10:
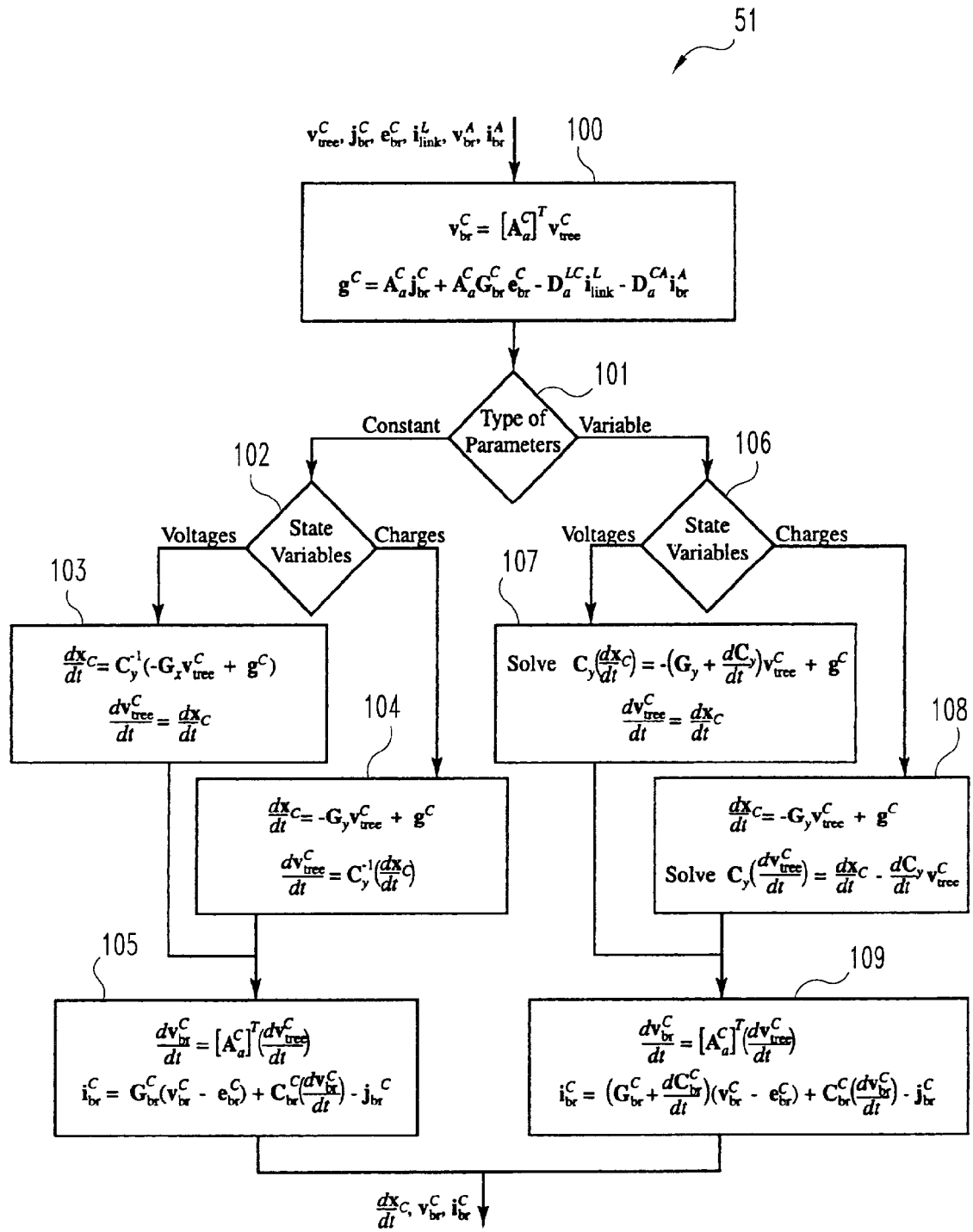
FIG. 10 is a block diagram detailing the capacitive network state/output equation calculator for use with the routines shown in FIG. 5.

Analogously to other discussion in relation to FIG. 9, the capacitive network state in algebraic equation component 51 will now be discussed in relation to FIG. 10. At block 100, values are calculated for the voltages $v_{br}^C$ and forcing term $g^C$ for the capacitive network. At decision block 101, it is determined whether constant or variable parameters are present. If constant parameters are being used, then it is determined at decision block 102, whether voltages or charges are used as state variables for the capacitive network. In the former case, the time-derivative of the state variables relating to the capacitive network and the voltages for the capacitive tree branches are calculated at block 103. Likewise, if charges are being used as state variables, those values are calculated at block 104. In either event (whether from block 103 or block 104), the system calculates the capacitive branch currents and the time-derivative of the capacitive branch voltages at block 105, and the output values are generated.

If at decision block 101 it is determined the variable parameters are present, then the type of state variables (voltages or charges) is determined at decision block 106. If voltages are being used, then the time-derivatives of the state variables relating to capacitive branches, as well as the voltages relating to capacitive tree branches, are determined at block 107. If charges are being used for state variables, then the equations of block 108 are solved. In either event (whether from block 107 or block 108), the capacitive branch currents and the time-derivative of the capacitive branch voltages are determined at block 109, and the output of overall block 51 is generated.

Built-In Switching Logic

Figure 11:
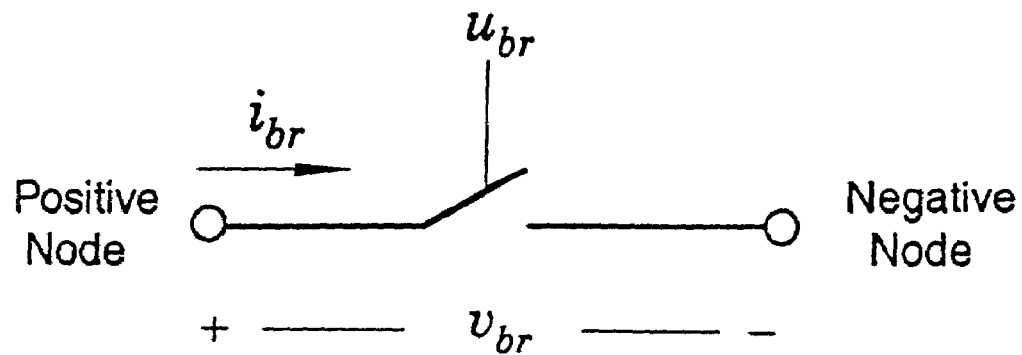
FIG. 11 is a schematic diagram of a switch element.

Although, as shown in FIG. 4, the ASMG has a single switch branch, different logic may be specified by the user to determine when a given switch is opened or closed. Four built-in switch types, each implementing specific switching logic, have been considered in an exemplary embodiment of the invention. These switch types were selected to represent many common solid-state switching devices such as diodes, thyristors, transistors (MOSFET, BJT, IGBT, for example), triacs, and the like. In general, the built-in switching logic does not permit the opening of switches that would cause discontinuities of currents in inductors and/or current sources, as well as closing of switches that would cause discontinuities of capacitor voltages and/or voltage sources. Such attempts would violate Kirchhoff's current law and/or Kirchhoff's voltage law and, therefore, are not allowed. In some embodiments, violation of KCL, KVL, and/or energy conservation principles results in appropriate error messages. The four types of switches built into the system will now be discussed in relation to FIG. 11, in which the switching control signal is denoted as $u_{br}$.

Unlatched Bidirectional Switch (UBS)

The switch of this type can conduct current in either direction when the switching control signal $u_{br}$ is greater than zero, and block positive or negative voltages otherwise. That is, $u_{br}>0$ implies $v_{br}=0$, while $u_{br}\leq0$ implies $i_{br}=0$. The switch can be opened or closed at any instant of time by controlling variable $u_{br}$, subject to KCL, KVL, and energy conservation principles.

Unlatched Unidirectional Switch (UUS)

The switch of this type is similar to the UBS, but can conduct current only in the positive direction. That is, $u_{br}>0$ and $i_{br}>0$ implies $u_{br}=0$, while $u_{br}\leq0$ implies $i_{br}=0$. In any case, $i_{br}\geq0$. The switch is closed when the variable $e_1=\min(u_{br}, v_{br})$ crosses zero going negative-to-positive. The snitch becomes open when the variable $e_2=\min(u_{br}, i_{br})$ crosses zero going positive-to-negative. This switch should not be used to short-circuit a loop of capacitors and/or voltage sources, unless the resulted sum of the voltages equals to zero.

Latched Bidirectional Switch (LBS)

The switch of this type is also similar to the UBS with the exception that it can be open only at the current-zero-crossing. That is, the switch is closed when $u_{br}>0$, which results in $u_{br}=0$. In this case, the event variable $e_1=u_{br}$ is monitored for negative-to-positive zero crossing. In order to open, the switch state controlling variable $u_{br}$ has to become negative first. After that, the switch automatically opens at the next current zero crossing. This logic can be used to represent AC arcing switch or an ideal solid-state triac.

Latched Unidirectional Switch (LUS)

The switch of this type is similar to the LBS with the exception that it can conduct current only in positive direction. That is, $u_{br}>0$ and $i_{br}>0$ implies $u_{br}=0$. Thee switch is closed when the variable $e_1=\min(u_{br}, v_{br})$ crosses zero going negative-to-positive. The switch becomes open when the variable $e_2=\min(u_{br}, i_{br})$ crosses zero going positive-to-negative. This switch can be used to model an ideal thyristor. These four switch types can be advantageously integrated into the circuit simulation system routines. For example, switching analysis and topology evaluation for state selection can be optimized using the additional information inherent in each switch type, as will occur to those skilled in the art.

Many variations on the above-disclosed exemplary embodiments will be apparent to those skilled in the art. For example, the processes discussed above can be implemented on many different hardware platforms running many different operating systems. The computational portions might be implemented as an integrated portion of the overall system, or might rely on a computational platform such as ACSL (published by The Aegis Technologies Group, Inc., of Huntsville, Ala., USA), or MATLAB/Simulink (published by The MathWorks, Inc., of Natick, Mass., USA).

Furthermore, in various embodiments, the processes might be carried out on a single processor or be distributed among multiple processors.

Still further, the time-domain steps in the simulation might be the same throughout the system, or might vary between variables, for a single variable (over time), between portions of the circuit being simulated, or other divisions as would occur to one skilled in the art. Likewise, the numerical techniques used to perform integration and/or differentiation (e.g., trapezoidal, NDF, or Adams techniques), the rates and maximum error parameters can also vary and might be consistent across the system, vary among portions of the circuit, change over time, or otherwise be applied as would occur to one skilled in the art.

Various embodiments of the present invention will also use different techniques to revise the state equations stored for each topology. In some cases, the data structure(s) that describe the state equations before a topology change event are modified only as much as necessary to take into account the new topology (i.e., only the changed portions of the circuit). Alternatively or additionally, new state equations may be derived in whole or in part for one or more topologies. In still other embodiments, a cache is maintained of state equations for some or all of the topologies that are encountered. A wide variety of caching strategies and techniques are available for use with the present invention, as would occur to one skilled in the art.

The parameters of the branches in the system can also be updated during the simulation, using a variety of strategies. In some embodiments, a data structure reflecting the constant parameters is maintained. Each time the variable parameter values are updated in the system, the constants are copied into a new data structure, and the variable parameters are added to them. In other embodiments, the parameters for the circuit at a given time $t_i$ are stored in a data structure. When the parameters are being updated for processing time $t_{i+1}$, the variable parameters from time $t_i$ are subtracted from the values in the data structure, then updated for time $t_{i+1}$, and the new values are added to the values in the data structure.

While a detailed description of one form of nodal analysis is presented herein, many additional and alternative techniques, approaches, and concepts may be applied in the context of the present invention. Likewise, a variety of different circuits can be simulated using the present system, such as all-inductive circuits with no capacitors, circuits with resistors and voltage or current sources, but neither inductors nor capacitors, to name just a few examples. Parameters may be set for a branch or combination of branches to model ideal or real circuit components or sub-circuits, such as diodes, transistors, thyristors, or triacs.

Using the techniques discussed above for time-varying parameters, multiple models can be used for a single physical component or sub-circuit. For example, a detailed, computationally intensive model might be used for a component when it has a rapidly varying input. Then, when the input has settled to a slower-varying state, a simpler, less computationally intensive model may be substituted for the complex one.

Yet further, the data structures used to represent information in various embodiments of the present invention vary widely as well. The stated structures may be optimized for programming simplicity, code size, storage demands, computational efficiency, cross-platform transferability, or other considerations as would occur to one skilled in the art.

Partitioning of branch sets as discussed herein may employ a wide variety of algorithms as would occur to one skilled in the art. Some spanning tree algorithms that are well adapted for use with the present invention are presented in T. H. Cormen, C. E. Leiserson, R. L. Rivest, *Introduction to Algorithms*, MIT Press, McGraw Hill, 1993; and R. E. Tarjan, *Data Structures and Network Algorithms*, Bell Laboratories, Murray Hill, 1983. The implementation of partitioning algorithms to the data structures involved will likely be a consideration for each particular implementation of the present invention.

All publications, prior applications, and other documents cited herein are hereby incorporated by reference in their entirety as if each had been individually incorporated by reference and fully set forth.

While the invention has been illustrated and described in detail in the drawings and foregoing description, the same is to be considered as illustrative and not restrictive in character, it being understood that only the preferred embodiments have been shown and described and that all changes and modifications that would occur to one skilled in the relevant art are desired to be protected. It should also be understood that while the use of the word "preferable," "preferably," or "preferred" in the description above indicates that the feature so described may be more desirable in some embodiments, it nonetheless may not be necessary, and embodiments lacking the same may be contemplated as within the scope of the invention, that scope being defined only by the claims that follow. In reading the claims it is intended that when words such as "a," "an," "at least one," "at least a portion," and the like are used, there is no intention to limit the claim to exactly one such item unless specifically stated to the contrary in the claim.

What is claimed is:

1. A computer-implemented method, comprising:
    creating one or more data structures that together store characteristics of a plurality of active branches $B^{active}$ that make up a graph of nodes and branches that form a circuit, wherein $B^{active}$ consists of
        a set $B^L$ of zero or more inductive branches, each having a non-zero inductive component but neither a capacitive component nor a variable switch state;
        a set $B^C$ of zero or more capacitive branches, each having a non-zero capacitive component but neither an inductive component nor a variable switch state; and
        a set $B^A$ of additional branches, each having neither an inductive component, nor a capacitive component;
    partitioning $B^{active}$ into a first branch set $B_{tree}^{active}$ and a second branch set $B_{link}^{active}$, where the branches in $B_{tree}^{active}$ form a spanning tree over $B^{active}$, giving priority in said partitioning to branches not in $B^L$ over branches in $B^L$;
    sub-partitioning $B_{link}^{active}$ into a third branch set $B_{link}^L$ and a fourth branch set $B_{link}^{CA}$, where $B_{link}^L = B_{link}^{active} \cap B^L$;

identifying a fifth branch set $B^{CA}$ as the union of
$B_{link}^{CA}$,
$B^C \cap B_{tree}^{active}$, and
those branches in $B_{tree}^{active}$ that form a closed graph when combined with $B_{link}^{CA}$;
partitioning $B^{CA}$ into a sixth branch set $\tilde{B}_{tree}^{CA}$ and a seventh branch set $\tilde{B}_{link}^{CA}$, where the branches in $\tilde{B}^{treeCA}$ form a spanning tree over $B^{CA}$, giving priority in said partitioning to branches in $B^C$ over branches not in $B^C$;
identifying an eight branch set $B_{tree}^C = \tilde{B}_{tree}^{CA} \cap B^C$;
selecting a set of state variables comprising:
for each branch of $B_{link}^L$, either the inductor current or inductor flux, and
for each branch of $B_{tree}^C$, either the capacitor voltage or capacitor charge; and
simulating a plurality of states of the circuit using the set of state variables.

2. The method of claim 1, wherein said partitioning steps each comprise an application of a weighted spanning tree algorithm.

3. The method of claim 2 wherein, for some positive numbers $w_L$ and $w_C$:
for the partitioning of $B^{active}$, a minimum spanning true algorithm is used with weight function $$\omega_L(b_j) = \begin{cases} w_L & \text{if branch } b_j \in B^L \\ 0 & \text{otherwise} \end{cases} ;$$

and
for the partitioning of $B^{CA}$, a maximum spanning true algorithm is used with weight function $$\omega_C(b_j) = \begin{cases} w_C & \text{if branch } b_j \in B^C \\ 0 & \text{otherwise} \end{cases} .$$

4. A system, comprising a processor and a computer-readable medium in communication with said processor, said medium containing programming instructions executable by said processor to:
build state equations for a first topology of an electronic circuit having at least two switching elements, wherein each switching element has a switching state;
solve said state equations at time $t_t$ to provide a state output vector, in which at least two elements control the switching states of tlie switching elements;
calculate the value of a switching variable as a function of the state output vector, wherein the value reflects whether the switching state of at least one of the switching elements is changing; and
if the value of the switching variable at time $t_t$ indicates that at least one of the switching elements is changing, determine a second topology of the electronic circuit for time $t_i^+$ and obtain state equations forte second topology;
wherein:
said programming instructions comprise a state equation building module, a solver module for ordinary differential equations, and a switching logic module;
said building is performed by the state equation building module;
said solving and calculating are performed by the solver module;
said determining is performed by the switching logic module;
at a time $t_j$, at least two switching elements are each either rising-sensitive or falling-sensitive switches, wherein
rising-sensitive switches change switching state if and only if a controlling element of the state vector has passed from a negative value to a non-negative value; and
falling-sensitive switches change switching state if and only if a controlling element of the state vector has passed from a positive value to a non-positive value; and
the function is the arithmetic maximum of
a maximum of all controlling elements of the state vector that control rising-sensitive switches, and
the negative of the minimum of all controlling elements of the state vector that control falling-sensitive switches.

* * * * *

UNITED STATES PATENT AND TRADEMARK OFFICE
CERTIFICATE OF CORRECTION

PATENT NO.       : 7,353,157 B2
APPLICATION NO.  : 10/043981
DATED            : April 1, 2008
INVENTOR(S)      : Wasynczuk et al.

It is certified that error appears in the above-identified patent and that said Letters Patent is hereby corrected as shown below:

Column 4, line 16, the formula should appear as follows: -- $B_{tree}^{active}$ --

Column 8, line 35, the formula should appear as follows: -- $G_{trees}^{g} = (N, By)$ --

Column 12, line 42, figure (2.28) the formula should appear as follows:
-- $\hat{A}_a i_{br} T_p = \hat{A}_a \hat{i}_{br} = 0$ --

Column 12, line 52, figure (2.30), the formula should appear as follows:
-- $\hat{i}_{br} = [i_y, i_x]$ --

Column 17, line 20, figure (2.112), the formula should appear as follows:
-- $\mathbf{K}_C = \mathbf{C}_y^{-1}$ --

Column 32, line 6, figure (3.102), the formula should appear as follows:
-- $\text{MinSTA}(\tilde{G}, w_L) \Rightarrow \tilde{G}_{trees} = (\tilde{N}, B_y^{LA})$ --

Column 42, line 14-23, figure (4.18), the formula should read as follows:

$$\begin{aligned}
i_{br}^C &= \Big(\big(G_{br} + \tfrac{dC_{br}}{dt}\big)(A_a^C)^T - C_{br}(A_a^C)^T C_y^{-1}\big(G_y + \tfrac{dC_y}{dt} - D_a^{CA} D_v^A\big)\Big) v_y \\
&\quad + (C_{br}(A_a^C)^T C_y^{-1}(D^{LC} + D_a^{CA} D_I^A)) i_x \\
&\quad + (C_{br}(A_a^C)^T C_y^{-1}(A_a^C + D_a^{CA} D_j^A) - I^C) j_{br}^{CA} \\
&\quad + (C_{br}(A_a^C)^T C_y^{-1} D_a^{CA} D_e^A) e_{br}^A = C_C^{CA} v_y + C_C^{LA} i_x + D_C^{CA} j_{br}^{CA} + D_C^A e_{br}^A
\end{aligned}$$

Column 46, line 2, should read --where $M_L(t)$ and $M_C(t)$ are so-called mass matrices that can be dependent on time and state--

Column 47, lines 52-56 should read

--In other words, the vectors (or more precisely trajectories) $i_{br}^L$ and $v_{br}^C$ must be bounded and continuous across topological boundaries. Recalling how $i_{br}^L$ and $v_{br}^C$ are related to the vectors of independent inductor currents and capacitor voltages, (5.11)-(5.12) can also be rewritten as--

UNITED STATES PATENT AND TRADEMARK OFFICE
CERTIFICATE OF CORRECTION

PATENT NO. : 7,353,157 B2
APPLICATION NO. : 10/043981
DATED : April 1, 2008
INVENTOR(S) : Wasynczuk et al.

It is certified that error appears in the above-identified patent and that said Letters Patent is hereby corrected as shown below:

Column 48, lines 5-6, figures (5.17) and (5.18) should read:

$$-- \left(B_{i+1}^L\right)^+ = T_L^{i+1}\begin{bmatrix}0 & I_{i+1}^L & 0\end{bmatrix}^T = \left(B_{i+1}^{base}\right)^T --$$

$$\left(A_{i+1}^L\right)^+ = T_C^{i+1}\begin{bmatrix}I_{i+1}^C & 0 & 0\end{bmatrix}^T = \left(A_{i+1}^{base}\right)^T$$

Column 48, line 8, should read --It can be noted that $\mathbf{B}_{i+1}^{base}$ and $\mathbf{A}_{i+1}^{base}$ are full-rank--

Column 48, lines 15-17, figures (5.19) and (5.20) should read:

$$-- \mathbf{i}_x^{i+1} = \mathbf{B}_{i+1}^{base}\mathbf{i}_i^L --$$

$$\mathbf{v}_y^{i+1} = \mathbf{A}_{i+1}^{base}\mathbf{v}_i^C$$

Column 48, lines 31-34, figures (5.24) and (5.25) should read:

$$-- \mathbf{i}_i^L = \mathbf{i}_{i+1}^L = \mathbf{i}_{br}^L, \text{ and } \|\mathbf{i}_{br}^L\|_\infty < \infty --$$

$$\mathbf{v}_i^C = \mathbf{v}_{i+1}^C = \mathbf{v}_{br}^C, \text{ and } \|\mathbf{v}_{br}^C\|_\infty < \infty$$

Column 54, line 33-34, figure (6.5) should read:

$$-- i_{br}^C(k) = \sum_{l \in M_i^C} G_{br}^C(k,l) i_{br}^L(l) + \sum_{m \in M_i^C} \frac{dU_{br}}{dt}(k,m) v_{br}^C(m) + \sum_{n \in M_i^C} C_{br}(k,n)\frac{d}{dt}v_{br}^C(n) - j_{br}^C(k) --$$

Column 57, line 21, figure (6.19) should read:

$$-- g^C(\mathbf{u}, t) = A_a^C j_{br}^C - D_a^{CA} i_{br}^A - D^{LC} i_x^L --$$

Column 61, line 33, figure (6.27) should read as follows:

$$-- \eta_{6.14}(n) = \Theta[n^2(\overline{m}^2 + 1)] --$$

UNITED STATES PATENT AND TRADEMARK OFFICE
CERTIFICATE OF CORRECTION

| | | |
|---|---|---|
| PATENT NO. | : 7,353,157 B2 | |
| APPLICATION NO. | : 10/043981 | |
| DATED | : April 1, 2008 | |
| INVENTOR(S) | : Wasynczuk et al. | |

It is certified that error appears in the above-identified patent and that said Letters Patent is hereby corrected as shown below:

Column 66, beginning with line 46, the text of claim 1 should be replaced in its entirety with the following:

--A computer-implemented method, comprising:

creating one or more data structures that together store characteristics of a plurality of active branches $B^{active}$ that make up a graph of nodes and branches that form a circuit, wherein $B^{active}$ consists of a set $B^L$ of zero or more inductive branches, each having a non-zero inductive component but neither a capacitive component nor a variable switch state;

a set $B^C$ of zero or more capacitive branches, each having a non-zero capacitive component but neither an inductive component nor a variable switch state; and a set $B^A$ of additional branches, each having neither an inductive component, nor a capacitive component;

partitioning $B^{active}$ into a first branch set $B^{active}_{tree}$ and a second branch set $B^{active}_{link}$, where the branches in $B^{active}_{tree}$ form a spanning tree over $B^{active}$, giving priority in said partitioning to branches not in $B^L$ over branches in $B^L$;

sub-partitioning $B^{active}_{link}$ into a third branch set $B^L_{link}$ and a fourth branch set $B^{CA}_{link}$, where $B^L_{link} = B^{active}_{link} \cap B^L$;

identifying a fifth branch set $B^{CA}$ as the union of $B^{CA}_{link}$,

UNITED STATES PATENT AND TRADEMARK OFFICE
CERTIFICATE OF CORRECTION

| | | |
|---|---|---|
| PATENT NO. | : 7,353,157 B2 | Page 4 of 5 |
| APPLICATION NO. | : 10/043981 | |
| DATED | : April 1, 2008 | |
| INVENTOR(S) | : Wasynczuk et al. | |

It is certified that error appears in the above-identified patent and that said Letters Patent is hereby corrected as shown below:

$B^C \cap B_{tree}^{active}$, and those branches in $B_{tree}^{active}$ that form a closed graph when combined with $B_{link}^{CA}$; partitioning $B^{CA}$ into a sixth branch set $\widetilde{B}_{tree}^{CA}$ and a seventh branch set $\widetilde{B}_{link}^{CA}$, where the branches in $\widetilde{B}_{tree}^{CA}$ form a spanning tree over $B^{CA}$, giving priority in said partitioning to branches in $B^C$ over branches not in $B^C$;

identifying an eighth branch set $B_{tree}^C = \widetilde{B}_{tree}^{CA} \cap B^C$;

selecting a set of state variables comprising:

for each branch of $B_{link}^L$, either the inductor current or inductor flux, and, for each branch of $B_{tree}^C$, either the capacitor voltage or capacitor charge; and simulating a plurality of states of the circuit using the set of state variables.--

Column 67, line 34, the word "-true-" should be replaced with the word --tree--

Column 68, line 4, "-t$_t$-" should be replace with --t$_i$--

Column 68, line 11, "-t$_t$-" should be replace with --t$_i$--

UNITED STATES PATENT AND TRADEMARK OFFICE
CERTIFICATE OF CORRECTION

PATENT NO.         : 7,353,157 B2
APPLICATION NO.   : 10/043981
DATED              : April 1, 2008
INVENTOR(S)        : Wasynczuk et al.

It is certified that error appears in the above-identified patent and that said Letters Patent is hereby corrected as shown below:

Column 68, line 14, the word "-forte-" should be replace with --for the--

Signed and Sealed this

Twenty-eighth Day of October, 2008

JON W. DUDAS
*Director of the United States Patent and Trademark Office*